United States Patent
Chen et al.

(10) Patent No.: US 12,261,218 B2
(45) Date of Patent: Mar. 25, 2025

(54) SEMICONDUCTOR STRUCTURE AND METHOD OF FORMING THE SAME

(71) Applicant: TAIWAN SEMICONDUCTOR MANUFACTURING COMPANY LTD., Hsinchu (TW)

(72) Inventors: Yi-Huan Chen, Hsinchu (TW); Chien-Chih Chou, New Taipei (TW); Szu-Hsien Liu, Hsinchu County (TW); Kong-Beng Thei, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/477,536

(22) Filed: Sep. 28, 2023

(65) Prior Publication Data

US 2024/0030340 A1    Jan. 25, 2024

Related U.S. Application Data

(63) Continuation of application No. 17/321,216, filed on May 14, 2021, now Pat. No. 11,810,973.

(51) Int. Cl.
*H01L 29/78* (2006.01)
*H01L 29/06* (2006.01)
*H01L 29/66* (2006.01)

(52) U.S. Cl.
CPC ...... *H01L 29/7813* (2013.01); *H01L 29/0646* (2013.01); *H01L 29/66734* (2013.01)

(58) Field of Classification Search
CPC ............ H01L 29/7813; H01L 29/0646; H01L 29/66734
USPC ........................................................ 257/330
See application file for complete search history.

(56) References Cited

U.S. PATENT DOCUMENTS

| | | | |
|---|---|---|---|
| 11,410,995 B1* | 8/2022 | Song | H01L 29/407 |
| 11,677,022 B2* | 6/2023 | Chen | H01L 21/823418 |
| | | | 257/330 |
| 2011/0284951 A1* | 11/2011 | Ueda | H01L 29/1037 |
| | | | 438/270 |
| 2011/0284952 A1* | 11/2011 | Oga | H01L 29/66787 |
| | | | 438/270 |
| 2013/0256791 A1* | 10/2013 | Iguchi | H01L 27/0922 |
| | | | 438/270 |
| 2013/0288445 A1* | 10/2013 | Ueda | H01L 29/4236 |
| | | | 438/296 |

* cited by examiner

*Primary Examiner* — Igwe U Anya
(74) *Attorney, Agent, or Firm* — WPAT LAW; Anthony King

(57) ABSTRACT

A semiconductor structure and a method for forming a semiconductor structure are provided. The semiconductor structure includes: a substrate; a doped region within the substrate; a pair of source/drain regions extending along a first direction on opposite sides of the doped region; a gate electrode disposed in the doped region, wherein the gate electrode has a plurality of first segments between the pair of source/drain regions; and a protection structure overlapping the gate electrode.

20 Claims, 57 Drawing Sheets

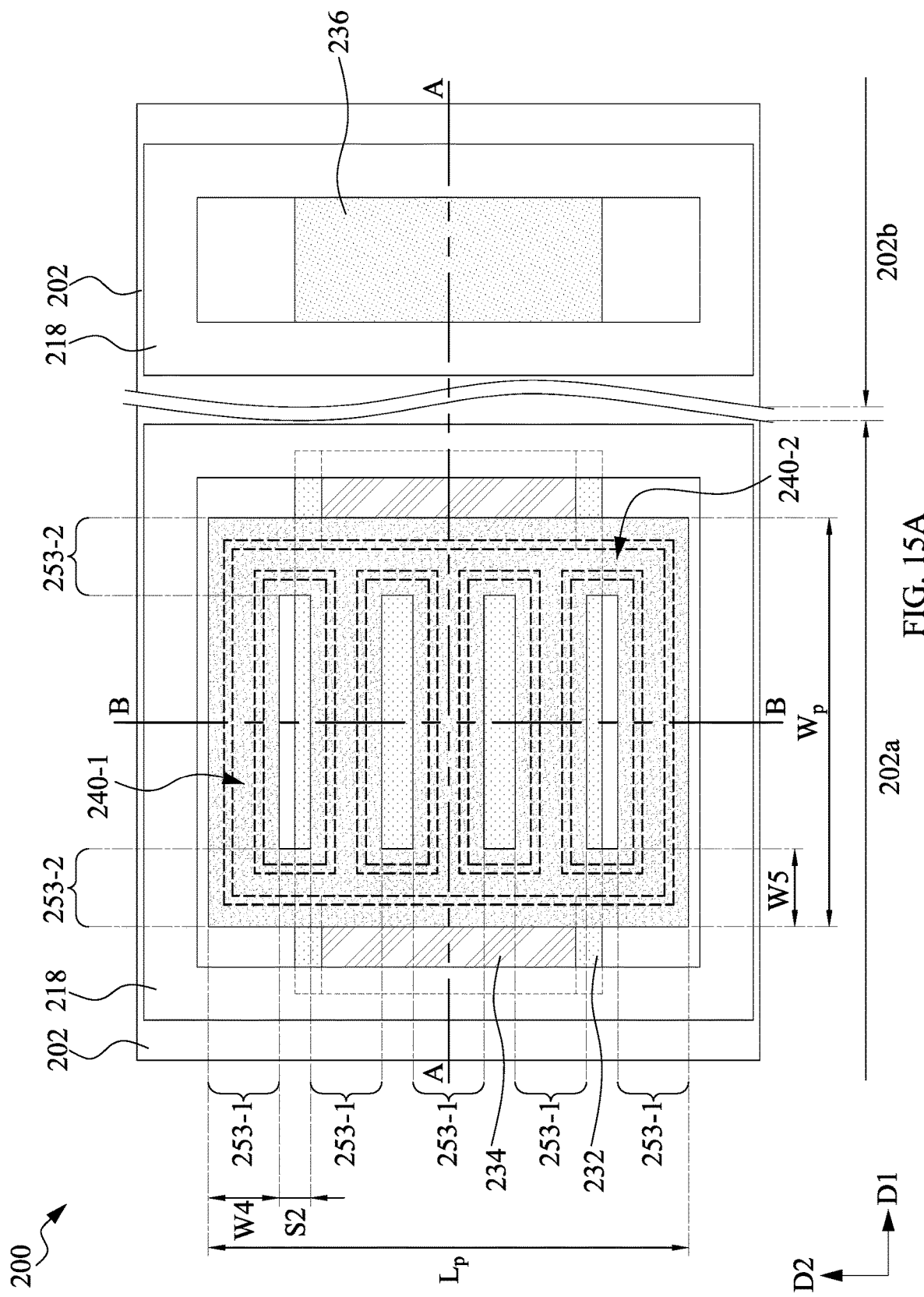

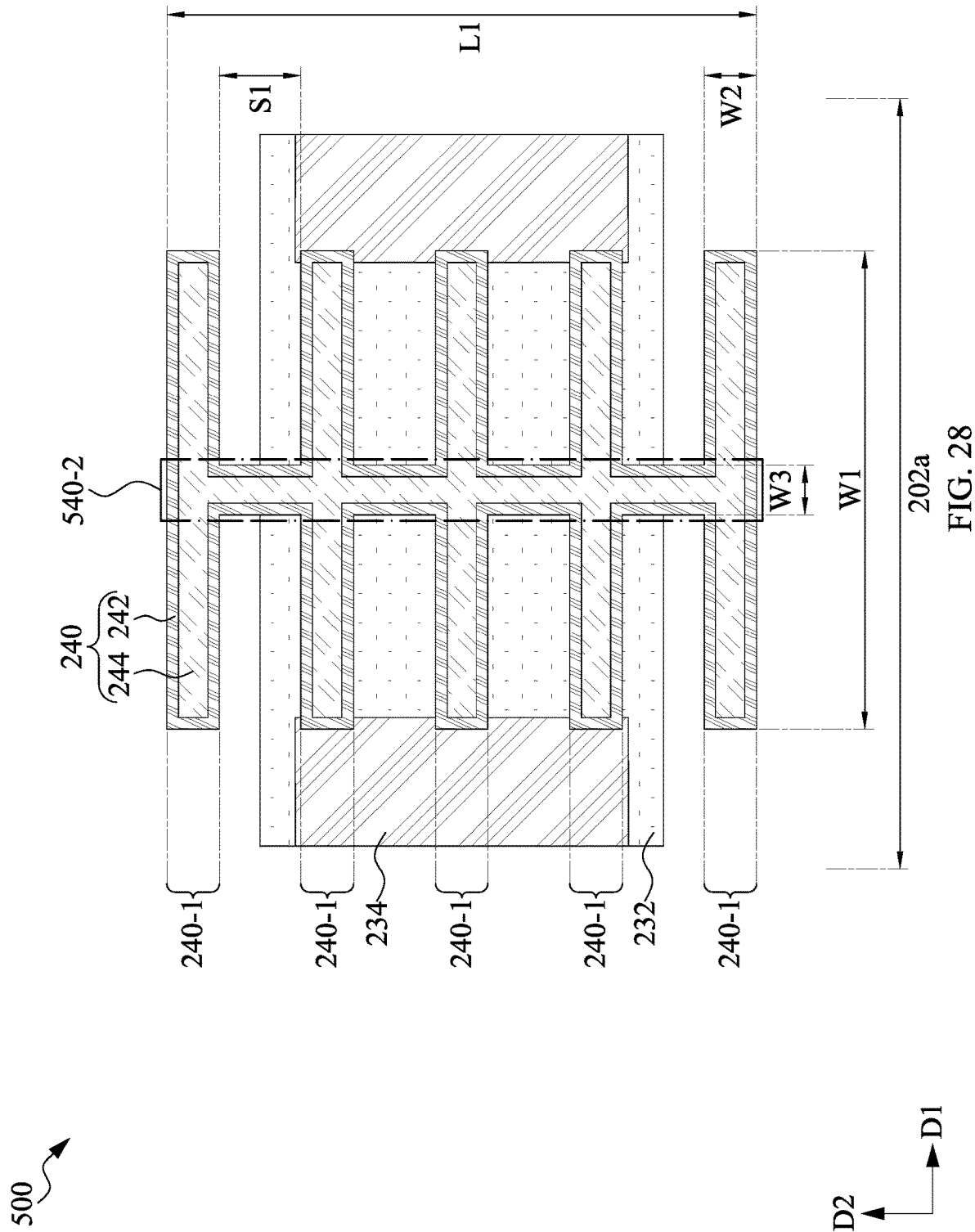

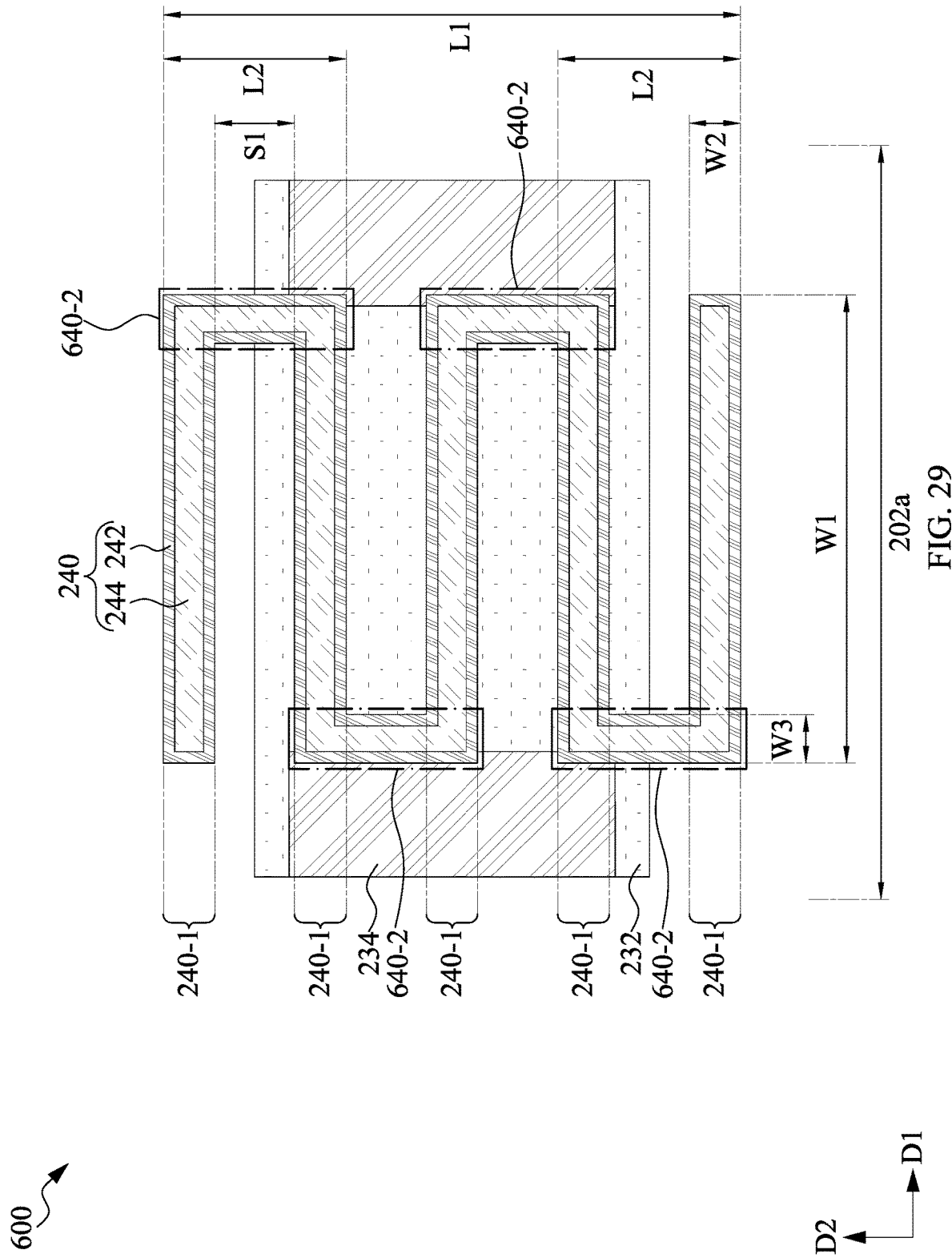

SEMICONDUCTOR STRUCTURE AND METHOD OF FORMING THE SAME

PRIORITY CLAIM AND CROSS-REFERENCE

This application is a continuation application of U.S. Non-Provisional application Ser. No. 17/321,216 filed May 14, 2021, disclosure of which is hereby incorporated by reference in its entirety.

BACKGROUND

Electronic equipment using semiconductor devices is essential for many modern applications. In the semiconductor devices, it is desirable to improve transistor performance even as devices become smaller due to ongoing reductions in device scale. Further, it is desirable to manufacture integrated circuit semiconductor devices that incorporate transistors operated at various ranges of operating voltages in a single integrated circuit. However, the manufacturing of the integrated circuit that incorporates transistors operated at different voltages involve extra steps and operations, thereby increasing manufacturing cost and time. As such, there are many challenges in efficiently integrating transistors of different operating voltages in a single semiconductor substrate.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIG. 15A illustrates a top view of a semiconductor structure at a fabrication stage according to aspects of one or more embodiments of the present disclosure.

FIG. 28 illustrates a top view of a semiconductor structure at a fabrication stage according to aspects of one or more embodiments of the present disclosure.

FIG. 29 illustrates a top view of a semiconductor structure at a fabrication stage according to aspects of one or more embodiments of the present disclosure.

DETAILED DESCRIPTION

Figure 1:
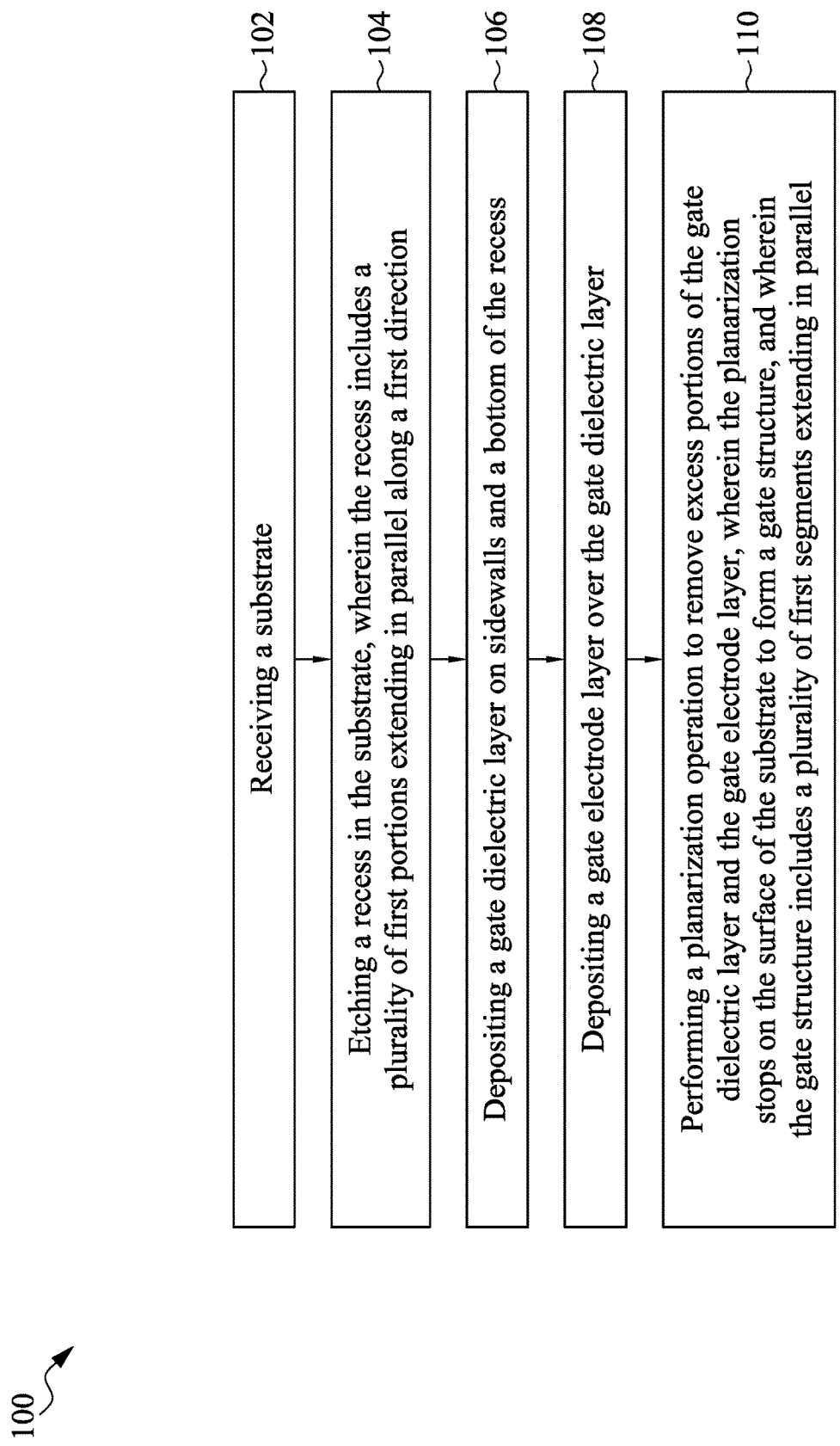
FIG. 1 is a flowchart representing a method for forming a semiconductor structure according to aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

Along the development of semiconductor industry, it has been a trend to fabricate as many semiconductor devices as possible on a single chip. For example, different semiconductor devices operated at ranges of low voltages, medium voltages, and high voltages are manufactured in a single chip. Generally, these semiconductor devices with different operating voltages are manufactured using different processes. For example, semiconductor devices manufactured by the replacement gate technology, also known as high-k metal gate (HKMG) technology, may be applied in the low-voltage devices. However, there are concerns in integrating the processes of manufacturing high-voltage devices or medium-voltage devices with those of manufacturing low-voltage devices, especially for the 28-nm technology node and beyond. To increase the yield of device integration, various factors should be considered, such as various device dimensions, e.g., different gate dielectric thicknesses, channel lengths, and/or channel widths of devices with different operating voltages. Also, since planarization processes are needed when fabricating the devices (used for planarizing metals or interlayer dielectrics for example), the dishing effect (applied to the high-voltage devices or medium-voltage devices with large device areas) may degrade the device performance.

Embodiments of a semiconductor structure and a forming method thereof are therefore provided. The semiconductor structure may have a first-voltage device disposed in a first device region and a second-voltage device disposed in a second device region. In some embodiments, the method for forming the semiconductor structure includes forming the recessed gate electrodes of the high/medium-voltage devices with segments. The method further includes forming a protection structure prior to the forming of the low-voltage devices to provide structural support during the planarization processes.

FIG. 1 is a flowchart representing a method 100 for forming a semiconductor structure 200 according to aspects of one or more embodiments of the present disclosure. The method 100 for forming the semiconductor structure 200 includes an operation 102 where a substrate is received. The method 100 further includes an operation 104 where a recess is etched in the substrate. In some embodiments, the recess includes a plurality of first portions extending in parallel along a first direction. The method 100 further includes an operation 106 where a gate dielectric layer is deposited on sidewalls and a bottom of the recess. The method 100 further includes an operation 108 where a gate electrode layer is formed over the gate dielectric layer. The method 100 further includes an operation 110 where a planarization operation is performed to remove excess portions of the gate dielectric layer and the gate electrode layer. In some embodiments, the planarization stops on the surface of the substrate to form a gate structure. In some embodiments, the gate structure includes a plurality of first segments extending in parallel.

FIGS. 2 through 26B are schematic drawings illustrating the semiconductor structure 200 at different fabrication stages constructed according to aspects of one or more embodiments of the present disclosure.

Figure 2:
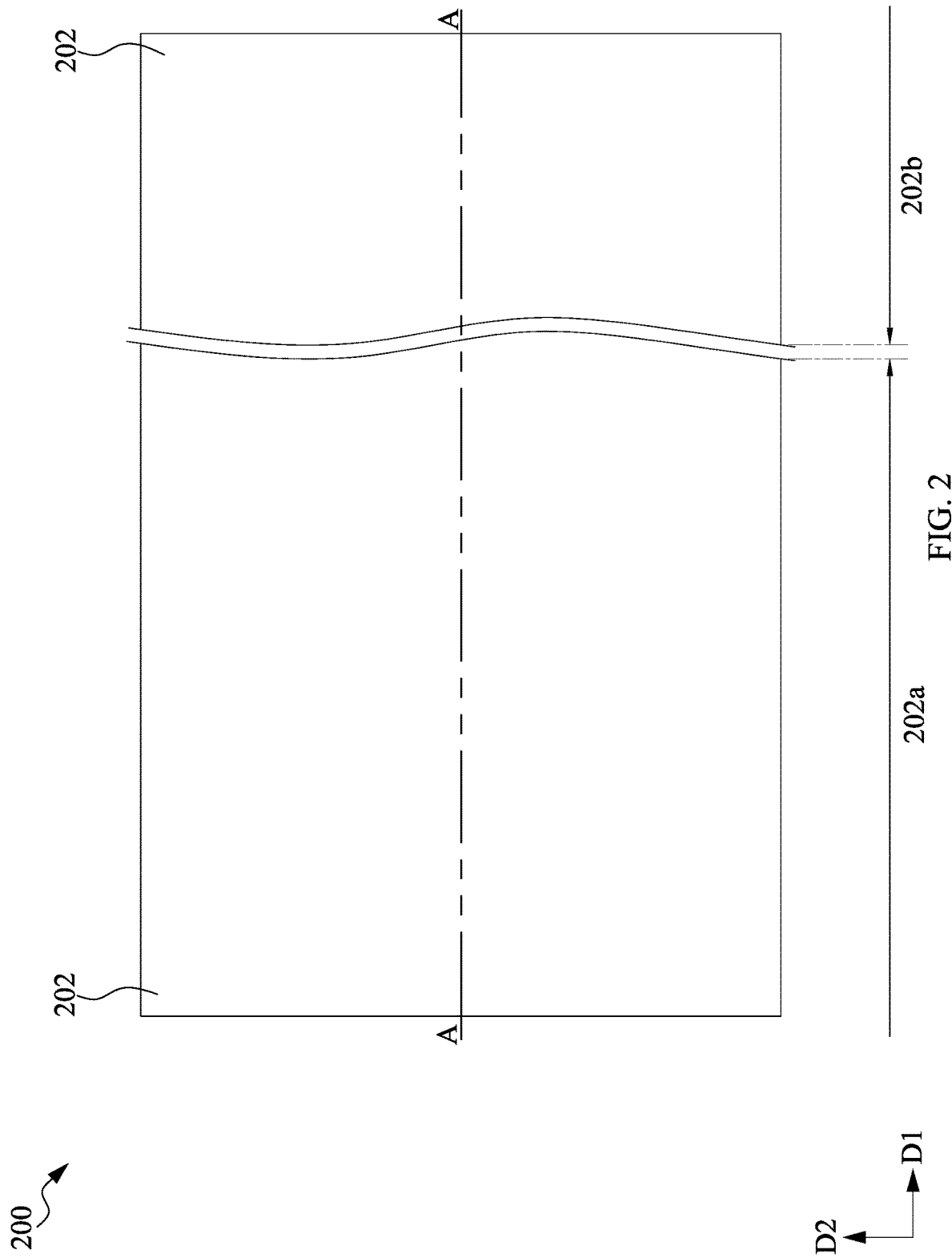
FIG. 2 illustrates a top view of a semiconductor structure at a fabrication stage according to aspects of one or more embodiments of the present disclosure.

FIG. 2 is a top view illustrating the semiconductor structure 200 at a fabrication stage constructed according to aspects of one or more embodiments of the present disclosure. Referring to FIG. 2, a substrate 202 is received or formed. The respective step is shown as operation 102 of the method 100 shown in FIG. 1. The substrate 202 may be a semiconductor wafer such as a silicon wafer. Alternatively or additionally, the substrate 202 may include elementary semiconductor materials, compound semiconductor materials, or alloy semiconductor materials. Examples of elementary semiconductor materials may be, for example but not limited thereto, single crystal silicon, polysilicon, amorphous silicon, germanium (Ge), and/or diamond. Examples of compound semiconductor materials may be, for example but not limited thereto, silicon carbide (SiC), gallium arsenic (GaAs), gallium phosphide (GaP), indium phosphide (InP), indium arsenide (InAs), and/or indium antimonide (InSb). Examples of alloy semiconductor material may be, for example but not limited thereto, SiGe, GaAsP, AlInAs, AlGaAs, GaInA s, GaInP, and/or GaInAsP. The substrate 202 may also be a bulk semiconductor substrate or a Semiconductor-On-Insulator (SOI) substrate. In accordance with some exemplary embodiments, the substrate 202 is doped with p-type impurities. In alternative embodiments, the substrate 202 is doped with n-type impurities.

The substrate 202 may include various device regions. In some embodiments, the substrate 202 includes a first device region 202a and a second device region 202b. The first device region 202a and the second device region 202b may include different devices with different operating voltage ranges. For example, the first device region 202a is a first-voltage device region in which a first-voltage device 210a (see FIG. 25B) is formed. The second device region 202b is a second-voltage device region in which a second-voltage device 210b (see FIG. 25B) is formed. The second-voltage device 210b is configured to operate at operating voltages (or supply voltages) lower than the respective operating voltages (or supply voltages) of the first-voltage device 210a. In accordance with some exemplary embodiments, the first device region 202a is a high-voltage (HV) MOS device region or a medium-voltage (MV) MOS device region, while the second device region 202b is a low-voltage (LV) MOS device region.

It is appreciated that the HV, MV, and LV MOS devices are related each other in their operating voltages. The HV MOS devices are configured to operate at a voltage range (or supply voltages) higher than that of the MV MOS devices, and the MV MOS devices are configured to operate at a voltage range (or supply voltages) higher than that of the LV MOS devices. Also, the maximum allowable voltages in the MV MOS devices are lower than the maximum allowable voltages in HV MOS devices, and the maximum allowable voltages in the LV MOS devices are lower than the maximum allowable voltages in the MV MOS devices. In accordance with some exemplary embodiments, the operating voltages (or the supply voltages) of the HV MOS devices are between about 25 V and about 30 V, the operating voltages (or the supply voltages) of the MV MOS devices are between about 3.0 V and about 20 V, and the operating voltages (or the supply voltages) of the LV MOS devices are between about 0.5 V and about 3.0 V.

Figure 3:
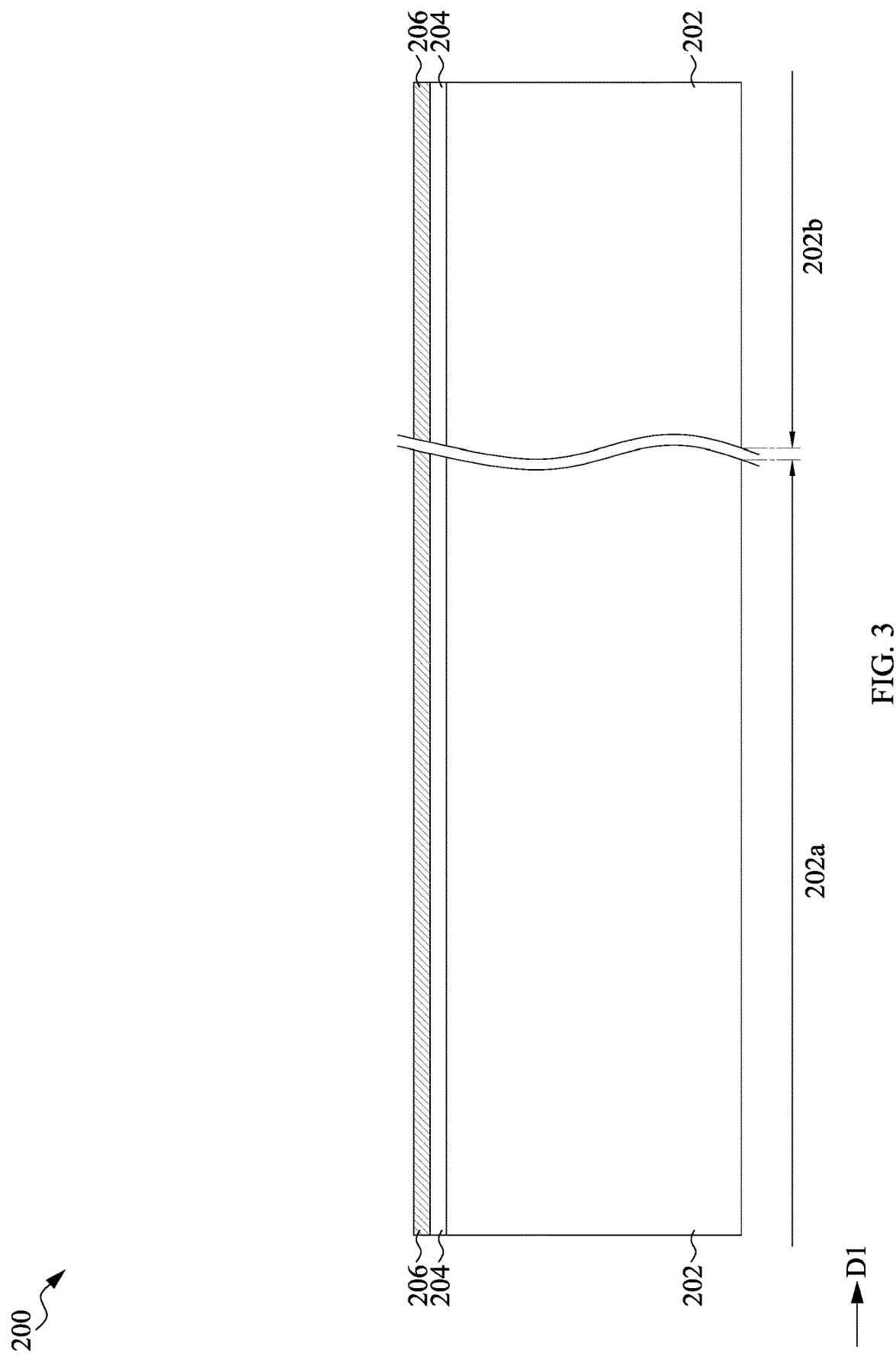
FIGS. 3-6 are cross-sectional views illustrated along a similar cross-section as reference cross-section A-A in FIG. 2.

FIGS. 3 through 6 and FIGS. 7A through 7C illustrate the formation of shallow trench isolation (STI) regions. Referring to FIG. 3, a pad layer 204 and a mask layer 206 are formed over the substrate 202. The pad layer 204 may include a thin film formed of silicon oxide, which may be formed, for example, using a thermal oxidation process. The pad layer 204 may serve as an adhesion layer between the substrate 202 and the mask layer 206. The pad layer 204 may also serve as an etch stop layer during etching the mask layer 206. In accordance with some embodiments of the present disclosure, the mask layer 206 is formed of silicon nitride, which may be formed, for example, using Low-Pressure Chemical Vapor Deposition (LPCVD), thermal nitridation of silicon, Plasma-Enhanced Chemical Vapor Deposition (PECVD), or plasma anodic nitridation. The mask layer 206 may be used as a hard mask during subsequent photolithography process.

Figure 4:
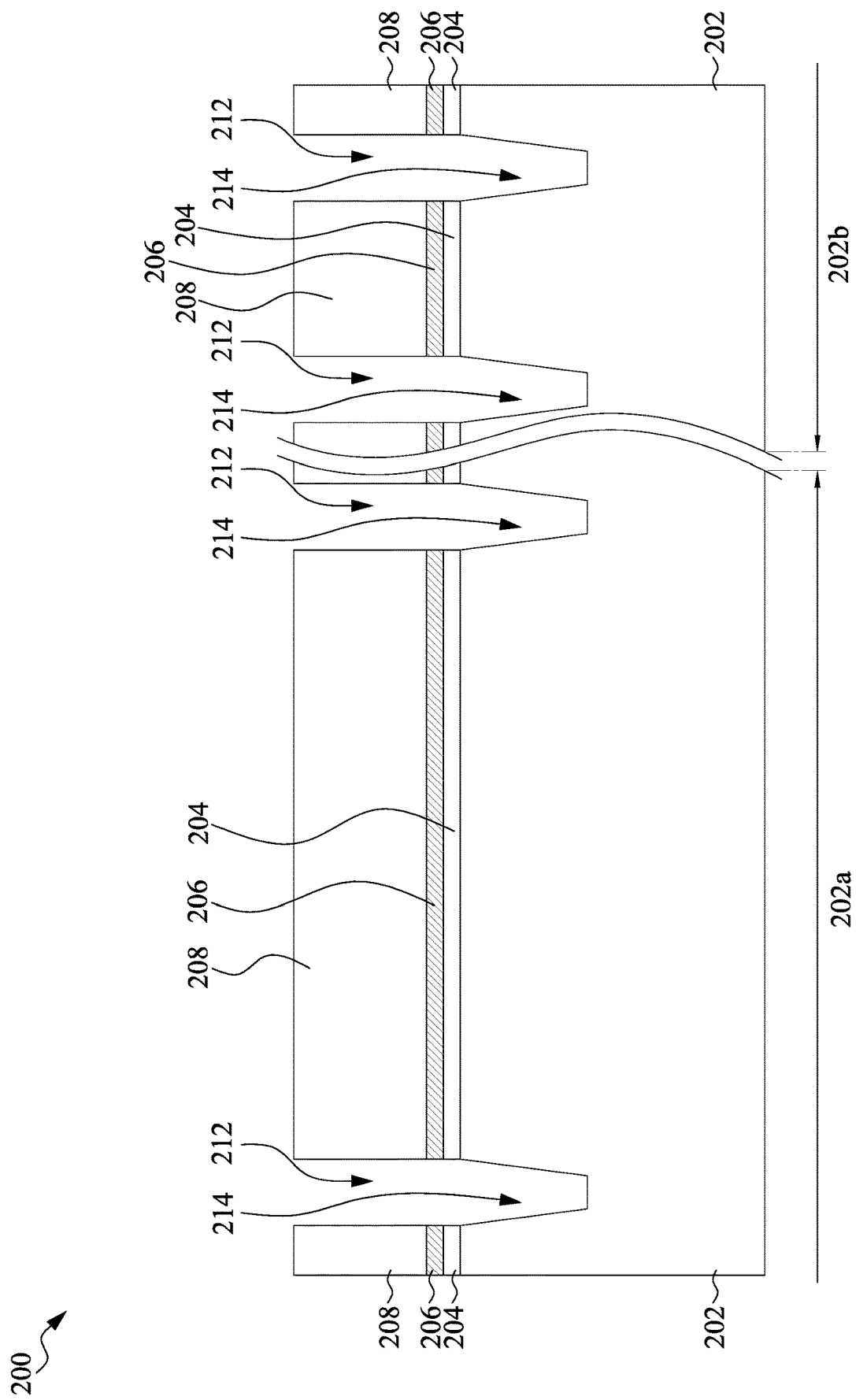

Referring to FIG. 4, a photo resist layer 208 is formed on the mask layer 206 and is then patterned to form openings 212. The mask layer 206 and the pad layer 204 are etched through the openings 212, exposing the underlying substrate 202. The exposed substrate 202 is then etched, forming trenches 214. The photo resist layer 208 is then removed.

Figure 5:
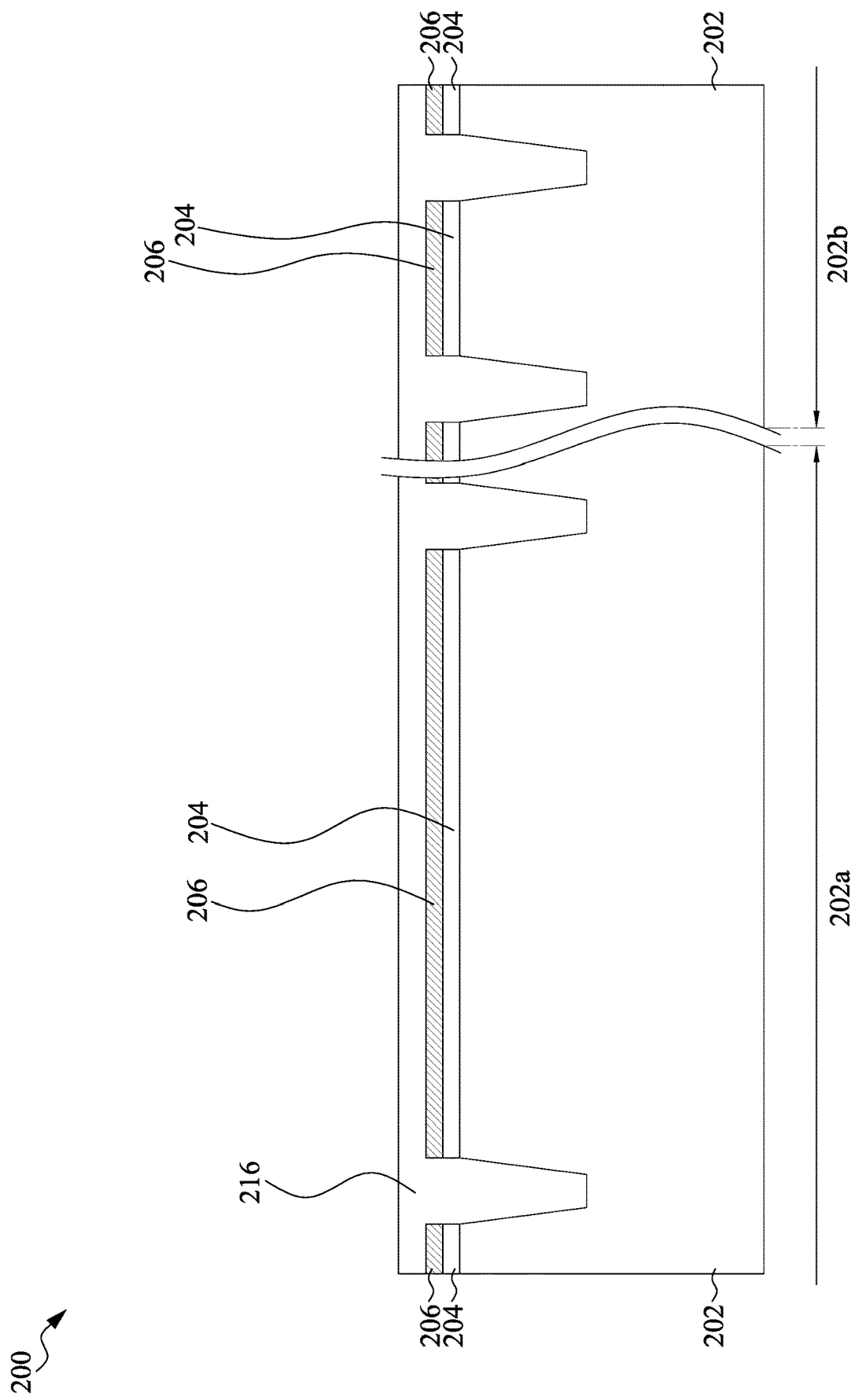

Referring to FIG. 5, dielectric material(s) 216 is filled into the trenches 214. In some embodiments, the dielectric material 216 includes a liner oxide lining the bottoms and the sidewalls of the opening 212. The liner oxide may be a thermal oxide layer forming by oxidizing a surface layer of the exposed substrate 202. In other embodiments, the liner oxide is formed using a deposition technique that can form conformal oxide layers. In some embodiments, after the formation of the liner oxide, the remaining portions of the trenches 214 are filled with another dielectric material. In some embodiments, the filling material includes silicon oxide, and other dielectric materials such as SiN, SiC, SiON, or the like, may also be used.

Figure 6:
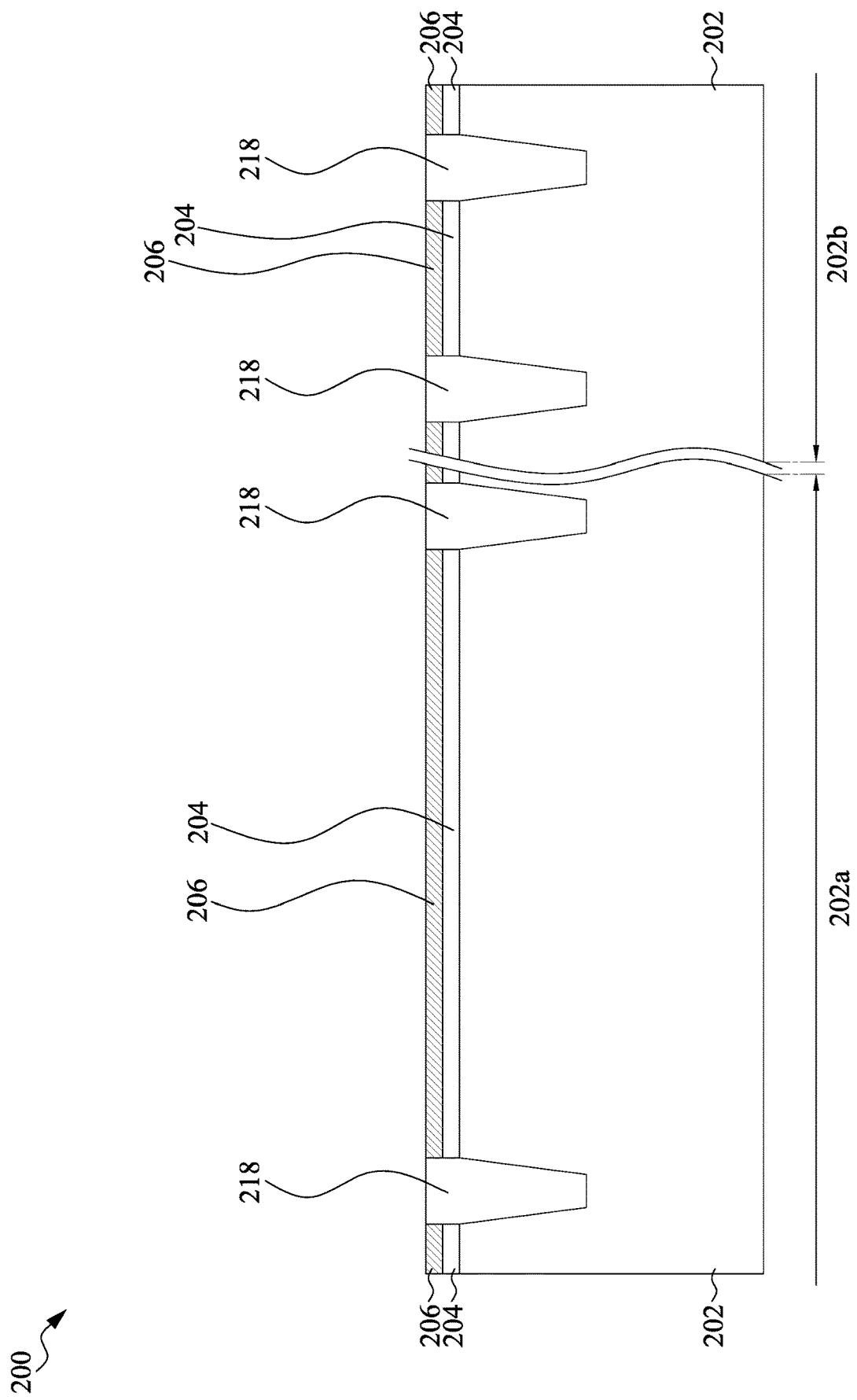

Referring to FIG. 6, a planarization such as Chemical Mechanical Polish (CMP) is then performed to remove excess portions of the dielectric material 216 over the top surface of the mask layer 206. The mask layer 206 may serve as a CMP stop layer. The remaining portion of the dielectric material 216 forms isolation structures 218. In some embodiments, the bottom surfaces of isolation structures 218 are substantially level with each other.

Figure 7A:
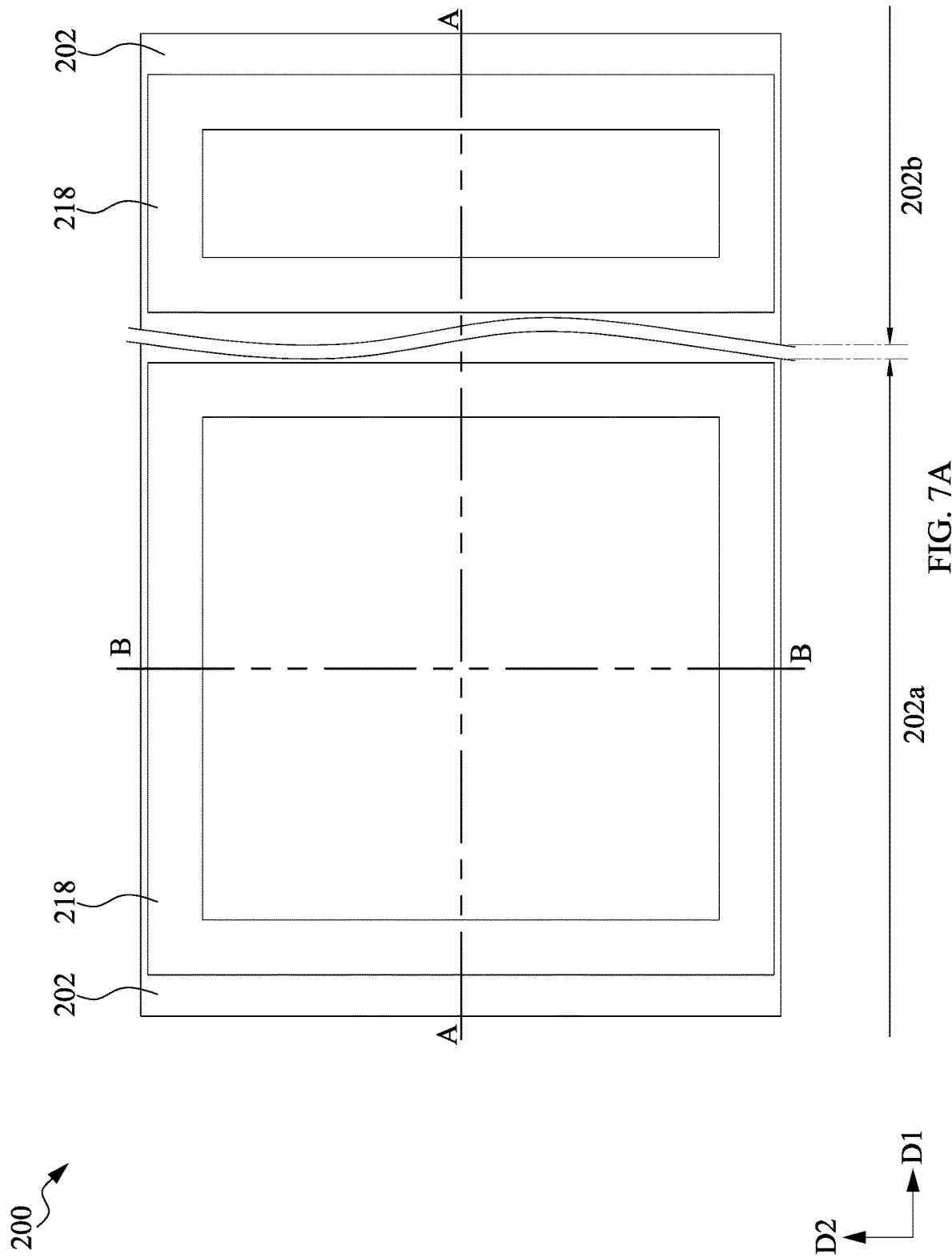
FIG. 7A illustrates a top view of a semiconductor structure at a fabrication stage according to aspects of one or more embodiments of the present disclosure.
Figure 7B:
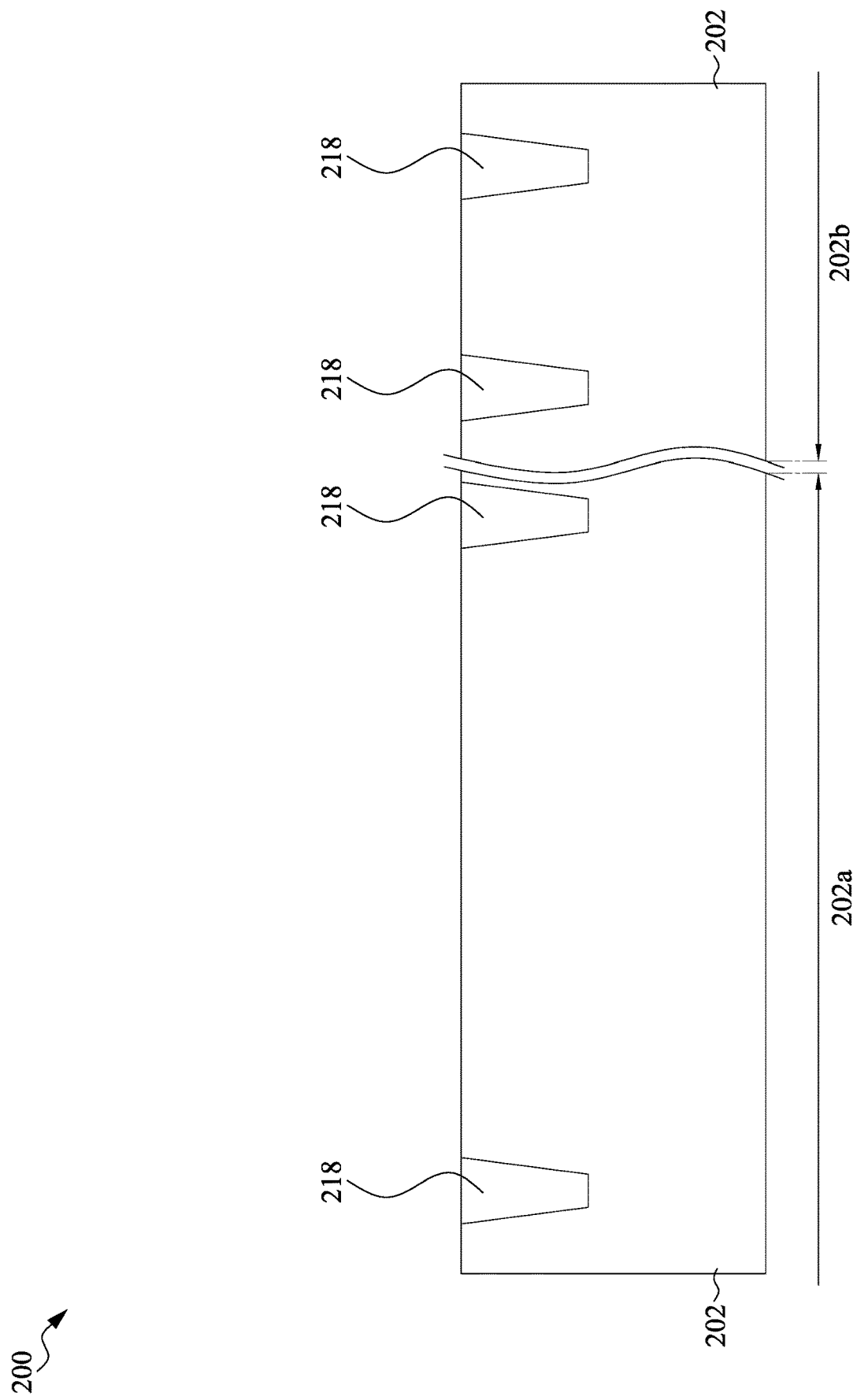
FIG. 7B is a cross-sectional view illustrated along a cross-section as reference cross-section A-A in FIG. 7A.
Figure 7C:
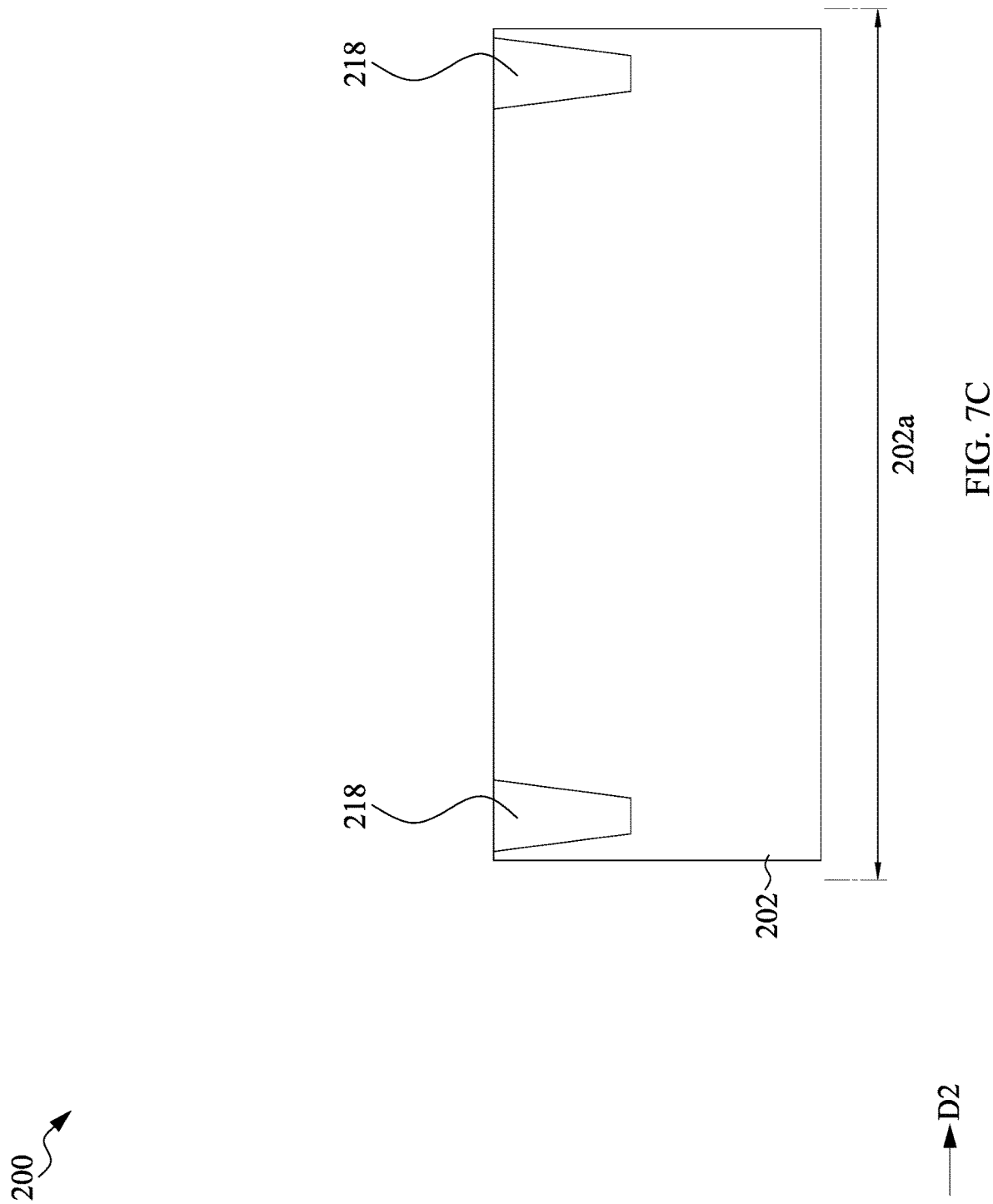
FIG. 7C is a cross-sectional view illustrated along a cross-section as reference cross-section B-B in FIG. 7A.

Referring to FIGS. 7A-7C, in subsequent steps, the mask layer 206 and the pad layer 204 are removed. In some embodiments, the mask layer 206 and the pad layer 204 are removed by etching processes. In some embodiments, the isolation structures 218 may have a ring-shaped. The isolation structures 218 may be interposed between the regions containing different device types. In some embodiments, the isolation structures 218 separates the first device region 202a from the second device region 202b.

Figure 8A:
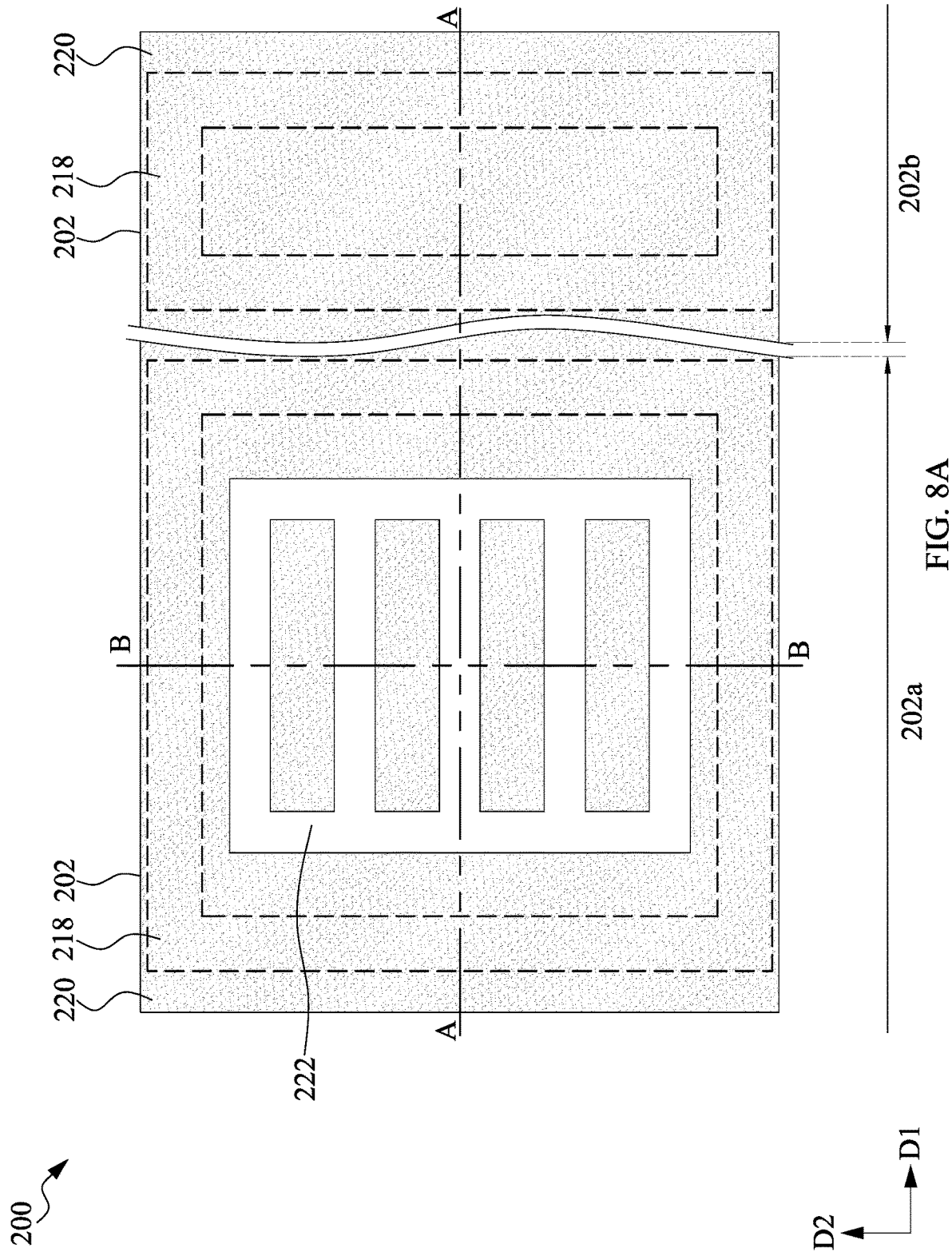
FIG. 8A illustrates a top view of a semiconductor structure at a fabrication stage according to aspects of one or more embodiments of the present disclosure.
Figure 8B:
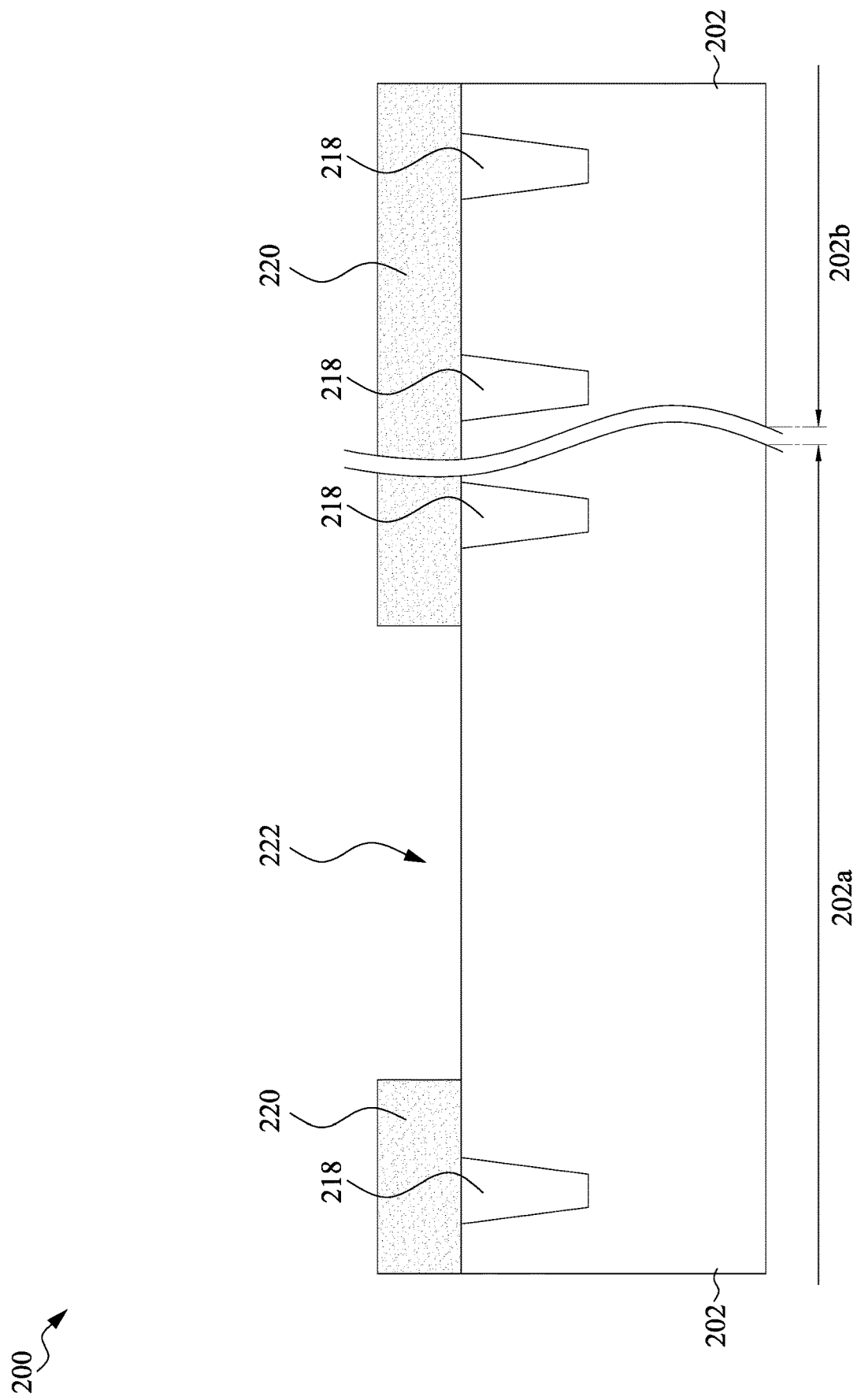
FIG. 8B is a cross-sectional view illustrated along a cross-section as reference cross-section A-A in FIG. 8A.
Figure 8C:
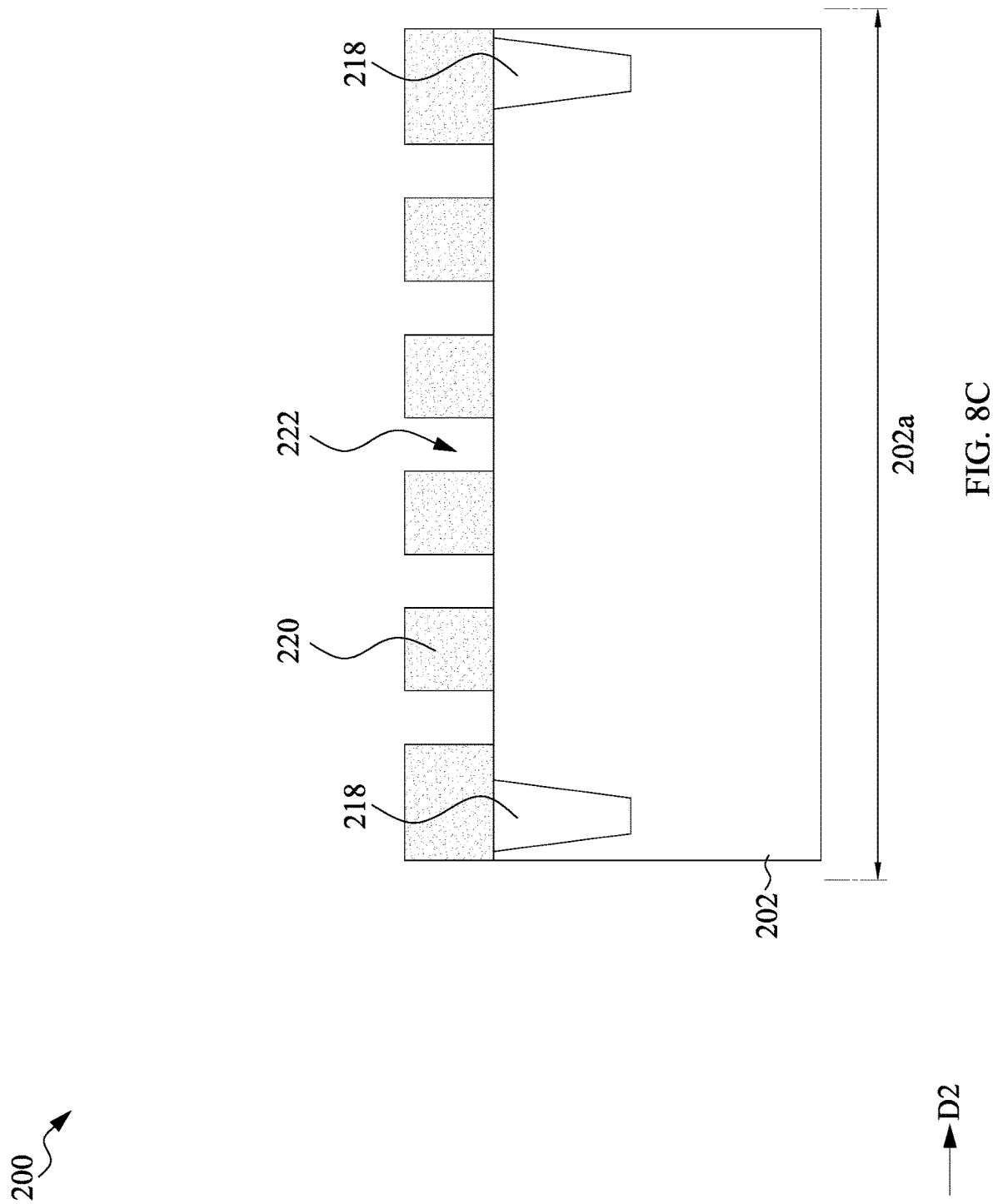
FIG. 8C is a cross-sectional view illustrated along a cross-section as reference cross-section B-B in FIG. 8A.

Referring to FIGS. 8A-8C, a photo resist layer 220 is formed over the substrate 202 and patterned to form one or more openings 222. Several portions of the substrate 202 may be exposed through the opening 222. In some embodiments, one or more portions in the first device region 202a of the substrate 202 are exposed through the opening 222, while the second device region 202b of the substrate 202 is covered by the photo resist layer 220. The photo resist layer 220 may further cover the isolation structures 218 in the first device region 202a and the second device region 202b.

Figure 9A:
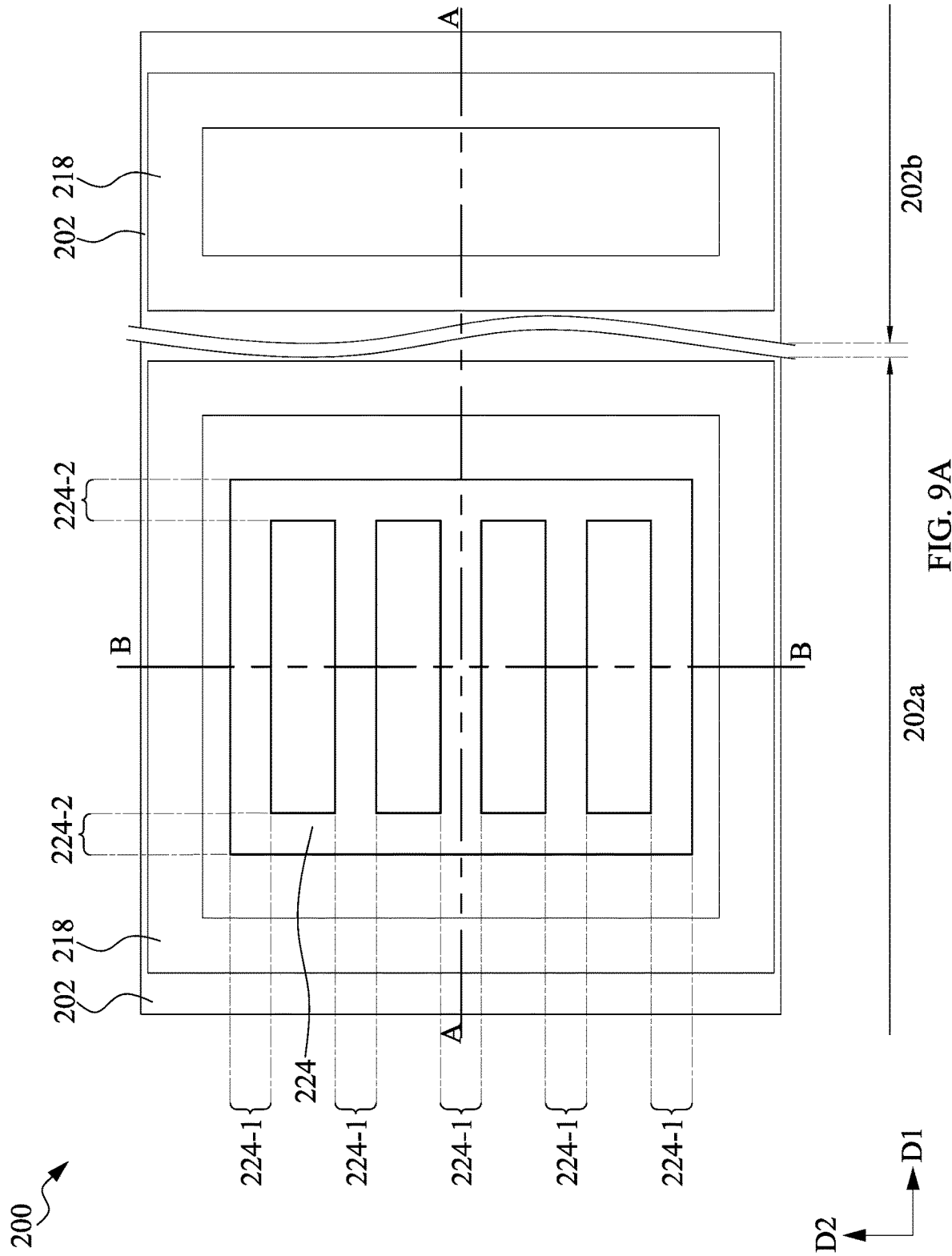
FIG. 9A illustrates a top view of a semiconductor structure at a fabrication stage according to aspects of one or more embodiments of the present disclosure.
Figure 9B:
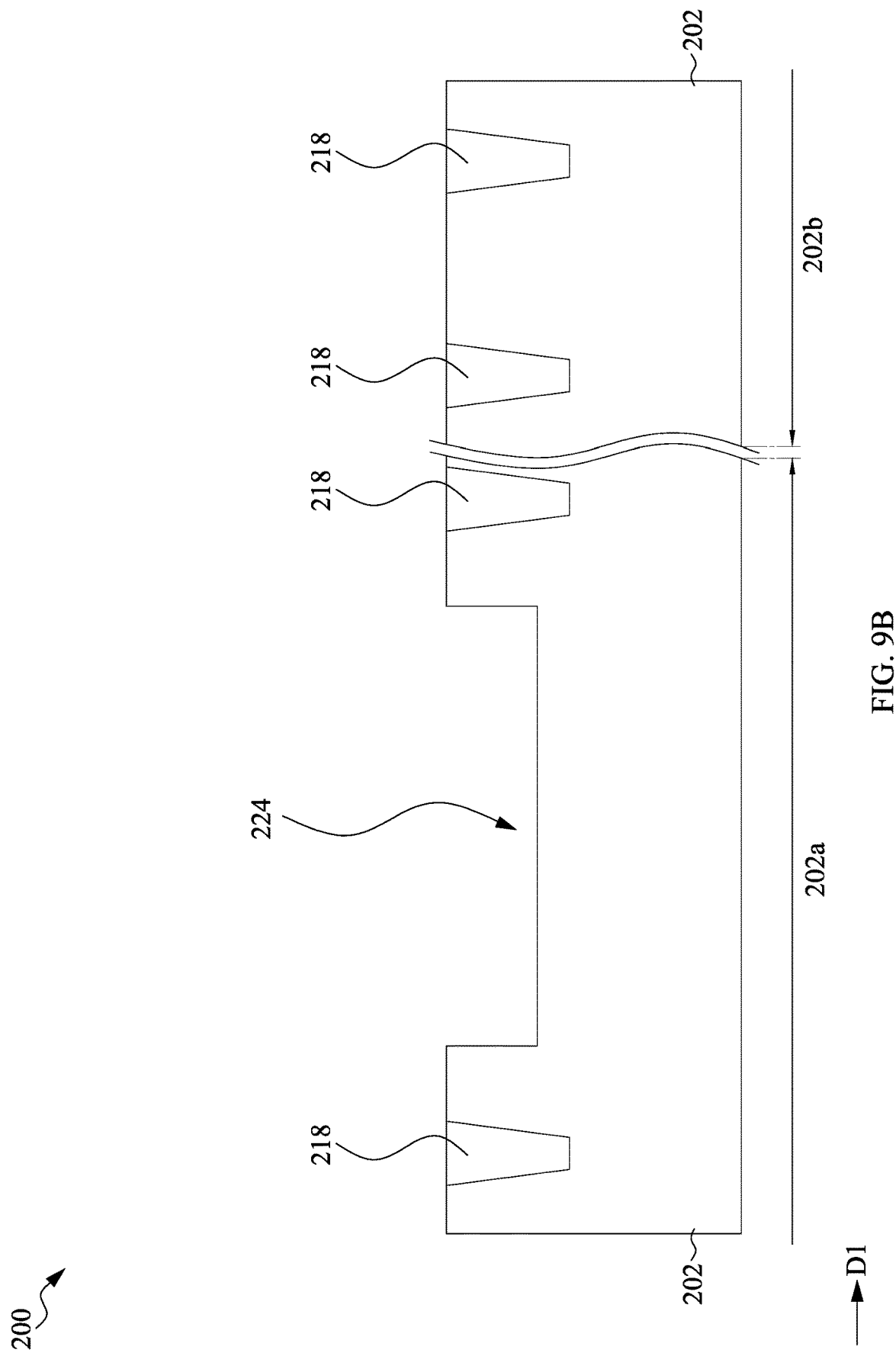
FIG. 9B is a cross-sectional view illustrated along a cross-section as reference cross-section A-A in FIG. 9A.
Figure 9C:
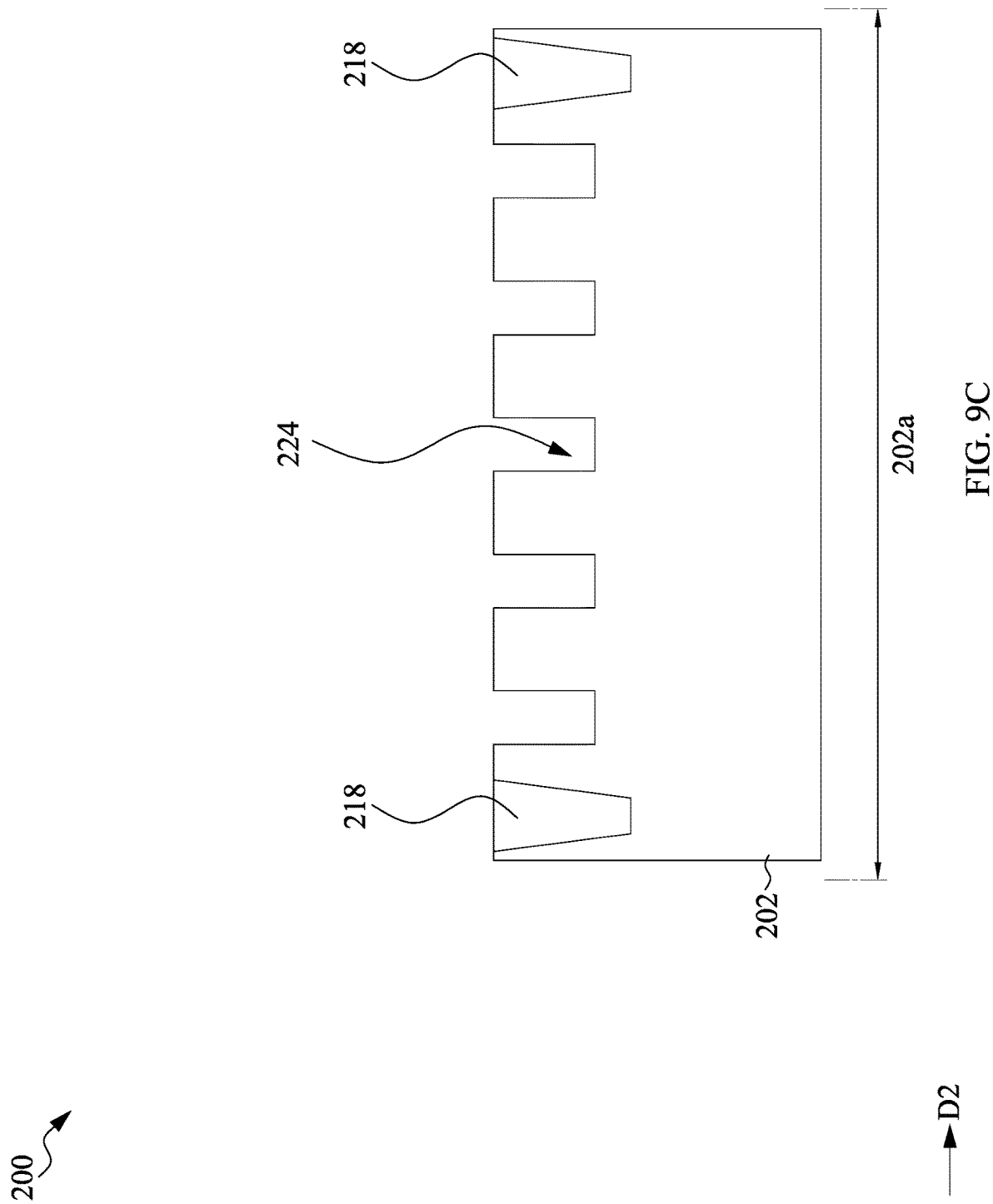
FIG. 9C is a cross-sectional view illustrated along a cross-section as reference cross-section B-B in FIG. 9A.

Referring to FIGS. 9A-9C, the portion of the exposed substrate 202 is patterned, forming one or more recesses 224 in the first device region 202a. The respective step is shown as operation 104 of the method 100 shown in FIG. 1. The recess 224 includes one or more first portions 224-1 extending in parallel along a first direction D1. The recess 224 may further include one or more second portions 224-4 extending in parallel along a second direction D2.

The patterning operation may involve an etching operation using the photo resist layer 220 as an etching mask. The etching may be performed through a dry etching process using an etching gas. The etching may also be performed through a wet etching process using one or more suitable etchants. As a result of the etching, upper portions of the substrate 202 in the first device region 202a are removed. In some embodiments, a depth of the recess 224 may be less than a depth of the isolation structure 218. In alternative embodiments, the depth of the recess 224 may be substantially same as the depth of the isolation structure 218. The depth of the recess 224 is determined by various factors, such as the thickness of the gate dielectric 242 and the thickness of the gate electrode 244 to be formed (see FIGS. 13B-13C). For example, the depth of the recess 224 is so selected that the thickness of the gate dielectric 242 may meet the voltage-sustaining requirement for HV MOS devices or MV MOS devices. The etching process may be adjusted to determine the maximum allowable voltage and the saturation current of the resulting HV MOS device or MV MOS device. After the etching, the photo resist layer 220 is removed.

Figure 10A:
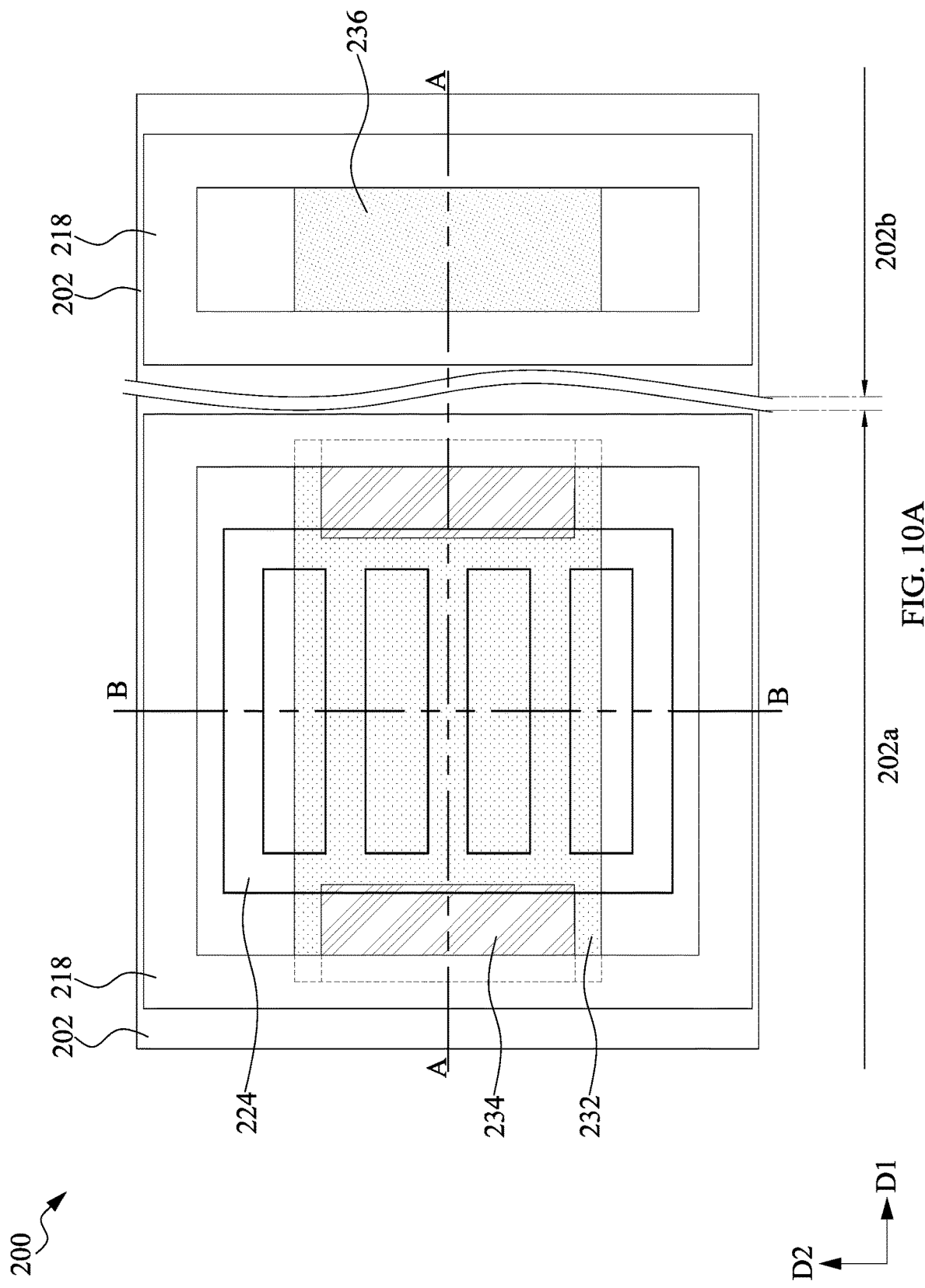
FIG. 10A illustrates a top view of a semiconductor structure at a fabrication stage according to aspects of one or more embodiments of the present disclosure.
Figure 10B:
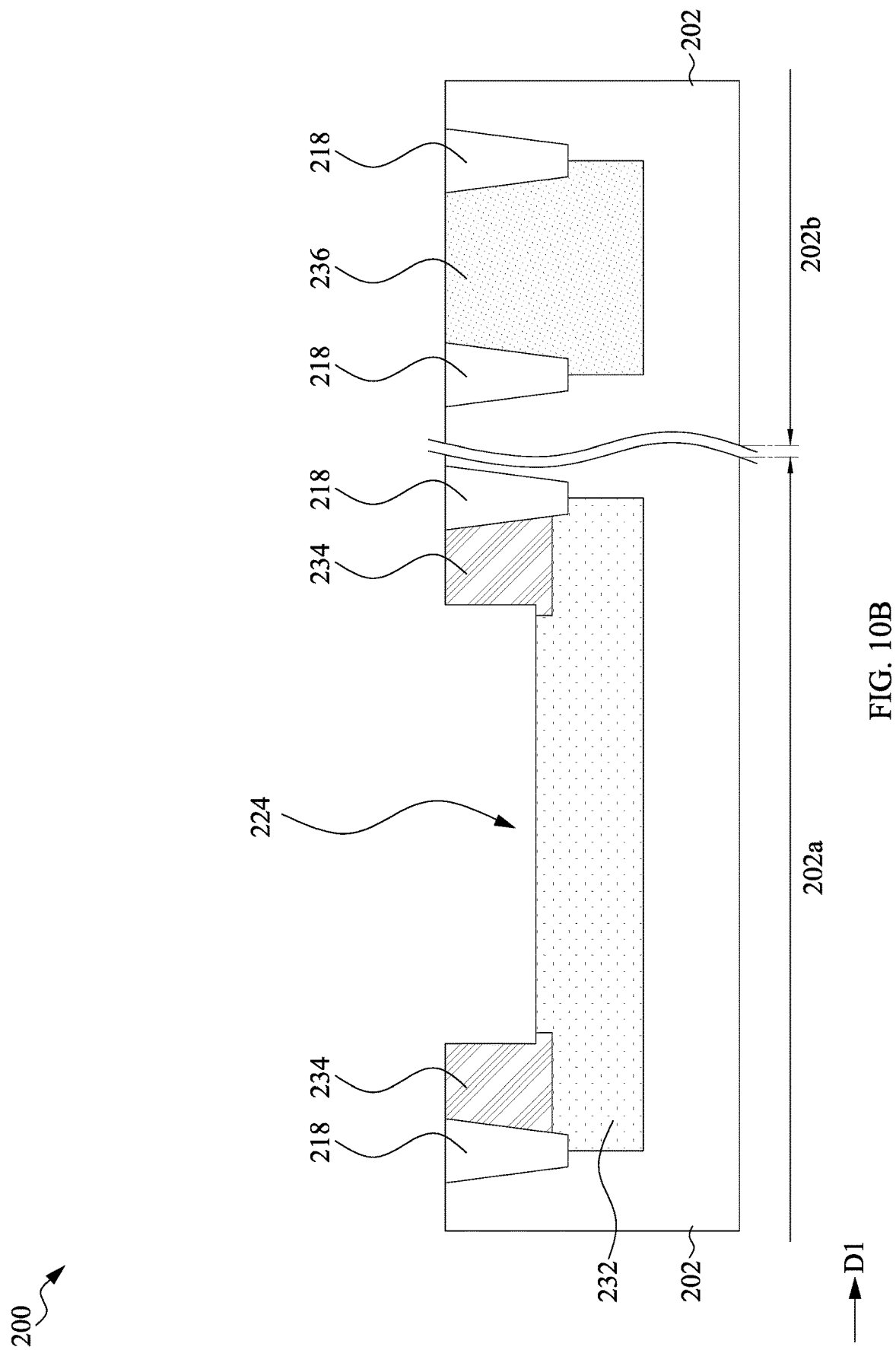
FIG. 10B is a cross-sectional view illustrated along a cross-section as reference cross-section A-A in FIG. 10A.
Figure 10C:
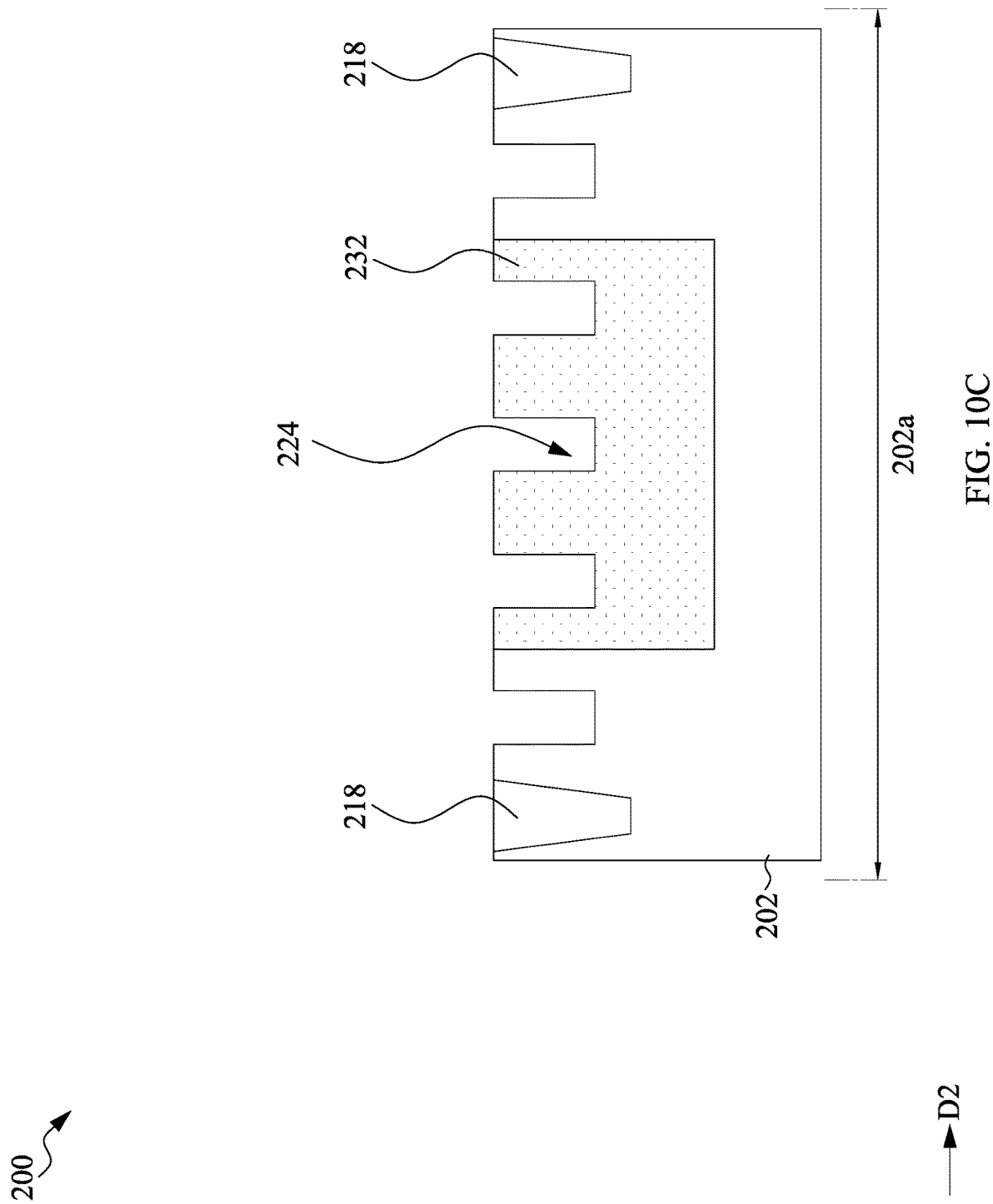
FIG. 10C is a cross-sectional view illustrated along a cross-section as reference cross-section B-B in FIG. 10A.

FIGS. 10A through 10C illustrate the formation of a plurality of doped regions through a plurality of implantation processes. The plurality of doped regions may include a deep well region 232, at least two shallow doped regions 234 in the first device region 202a and a deep well region 236 in the second device region 202b. In some embodiments, the deep well regions 232 and 236 are p-type regions, and the shallow doped regions 234 are n-type regions. In alternative embodiments, the deep well regions 232 and 236 are n-type regions, and the shallow doped regions 234 are p-type regions. The implantation processes for forming the deep well regions 232, 236, and the shallow doped regions 234 may be arranged in any order.

In some embodiments, a photo resist layer (not shown) may be formed to cover the substrate 202. The region in which the deep well region 232 and the shallow doped regions 234 are to be formed is exposed to the opening of the photo resist layer. In some embodiments, p-type dopants, such as boron and/or indium, are implanted into substrate 202 to form the deep well region 232. In some embodiments, n-type dopants, such as phosphorous, arsenic, and/or antimony, are implanted to form the shallow doped regions 234. The photo resist layer is then removed after the implantation operation is completed.

In some embodiments, another photo resist layer (not shown) is formed to cover the substrate 202, with the region in which the deep well region 236 is to be formed exposed to the opening of the photo resist layer. An implantation may be then performed in order to form deep well region 236. The deep well region 236 may be implanted with p-type dopants. In some embodiments, the deep well region 236 has an impurity concentration greater than that of the deep well region 232. The photo resist layer is then removed after the implantation operation is completed.

Figure 11A:
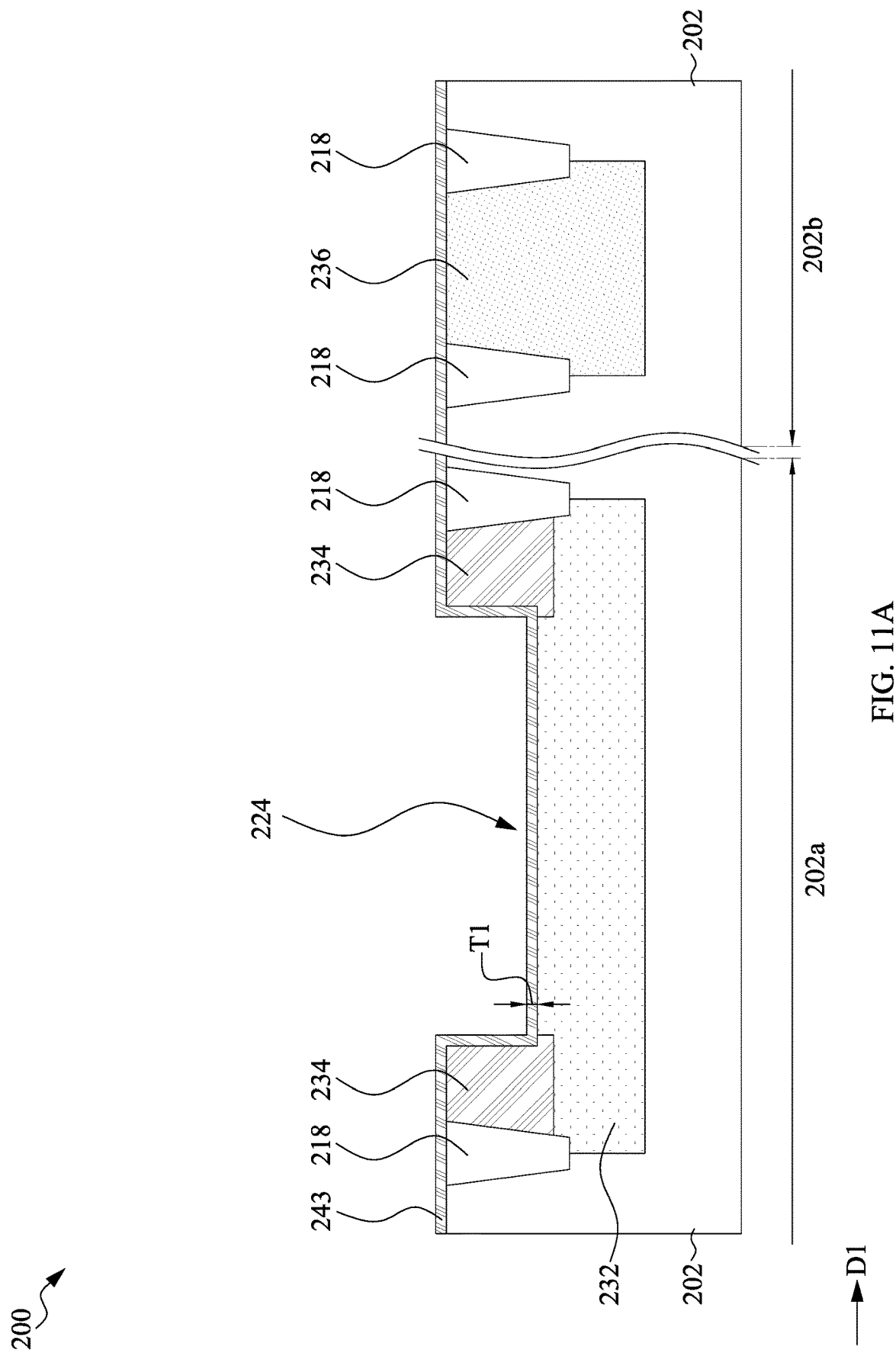
FIGS. 11A and 12A are cross-sectional views illustrated along a similar cross-section as reference cross-section A-A in FIG. 10A.
Figure 11B:
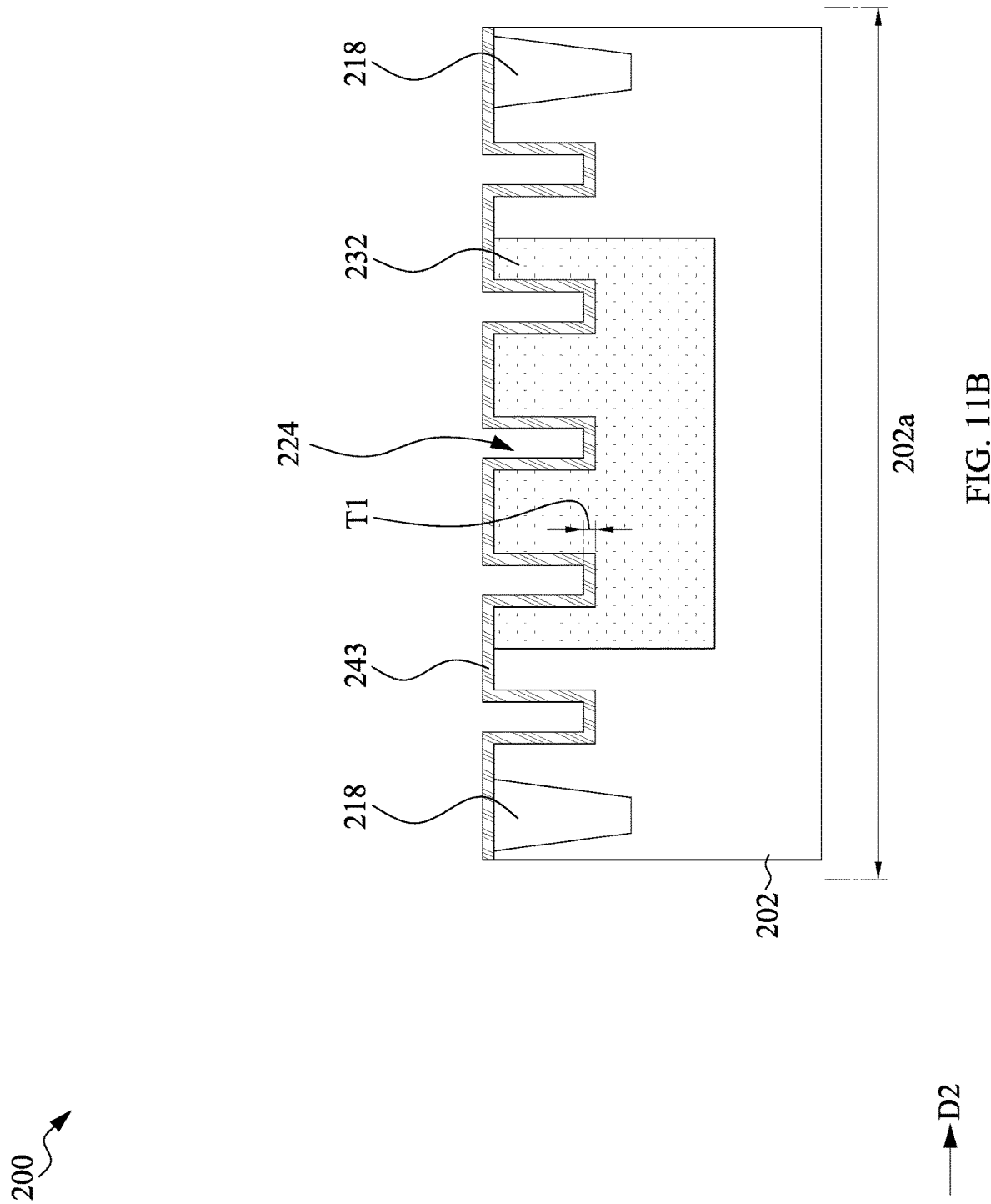
FIGS. 11B and 12B are cross-sectional views illustrated along a similar cross-section as reference cross-section B-B in FIG. 10A.

FIGS. 11A-11B, 12A-12B and 13A-13C illustrate the formation of a gate structure 240. The gate structure 240 may include a gate dielectric 242 and a gate electrode 244 in the first device region 202a. Referring to FIGS. 11A and 11B, a gate dielectric layer 243 is formed over the substrate 202. The respective step is shown as operation 106 of the method 100 shown in FIG. 1. In some embodiments, the gate dielectric layer 243 is formed over the substrate 202 in a conformal manner. The gate dielectric layer 243 may be deposited within the recess 224. In some embodiments, the gate dielectric layer 243 is formed to cover the sidewalls and the bottoms of the recess 224. The thickness T1 of the gate dielectric layer 243 may be configured based on different requirements for different semiconductor devices. For example, when the gate dielectric 242 to be formed is used as an HV MOS device or an MV MOS device, the thickness T1 of the gate dielectric 242 is substantially in a range from about 100 angstroms (Å) to about 200 angstroms.

Figure 12A:
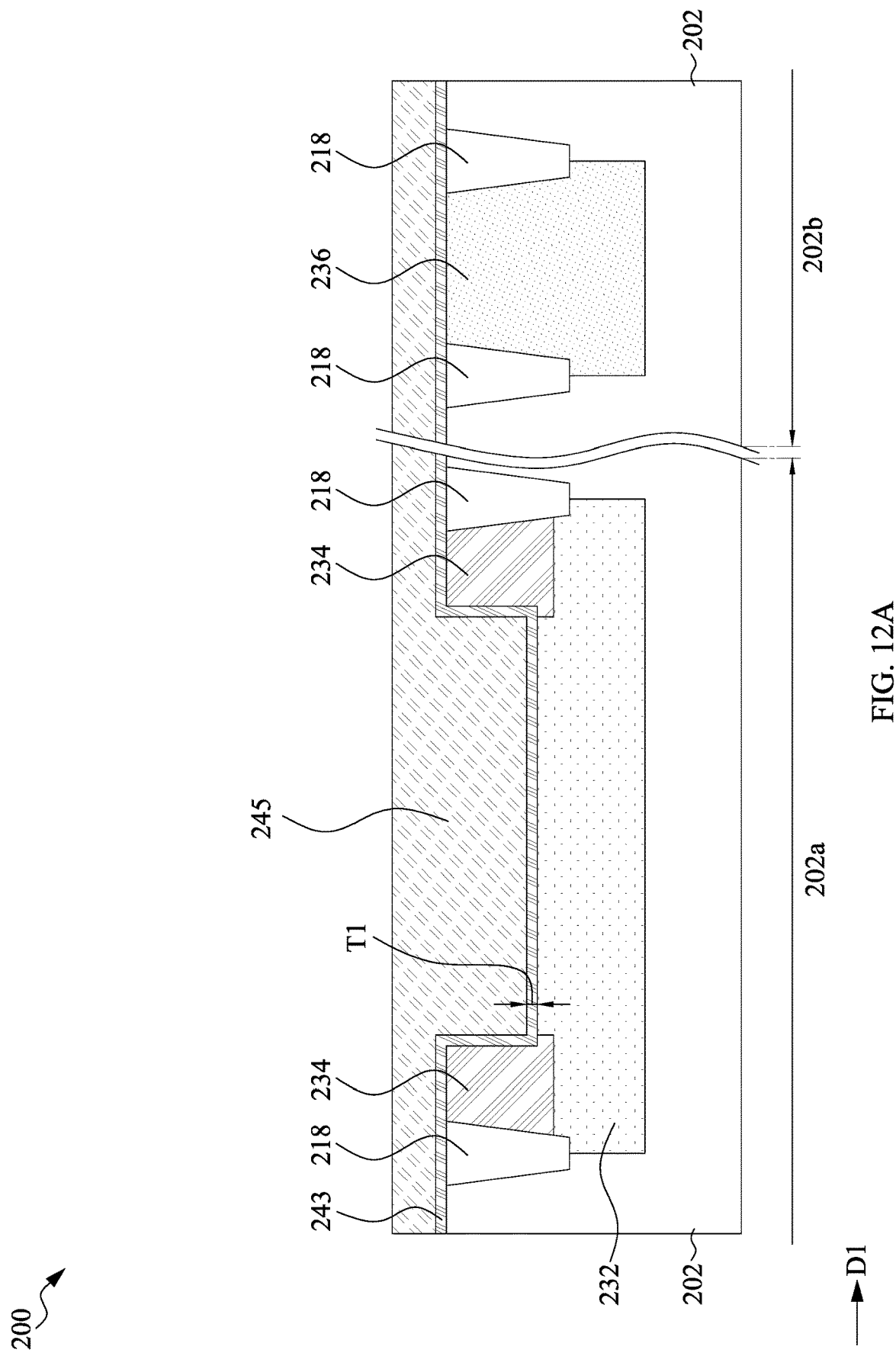
Figure 12B:
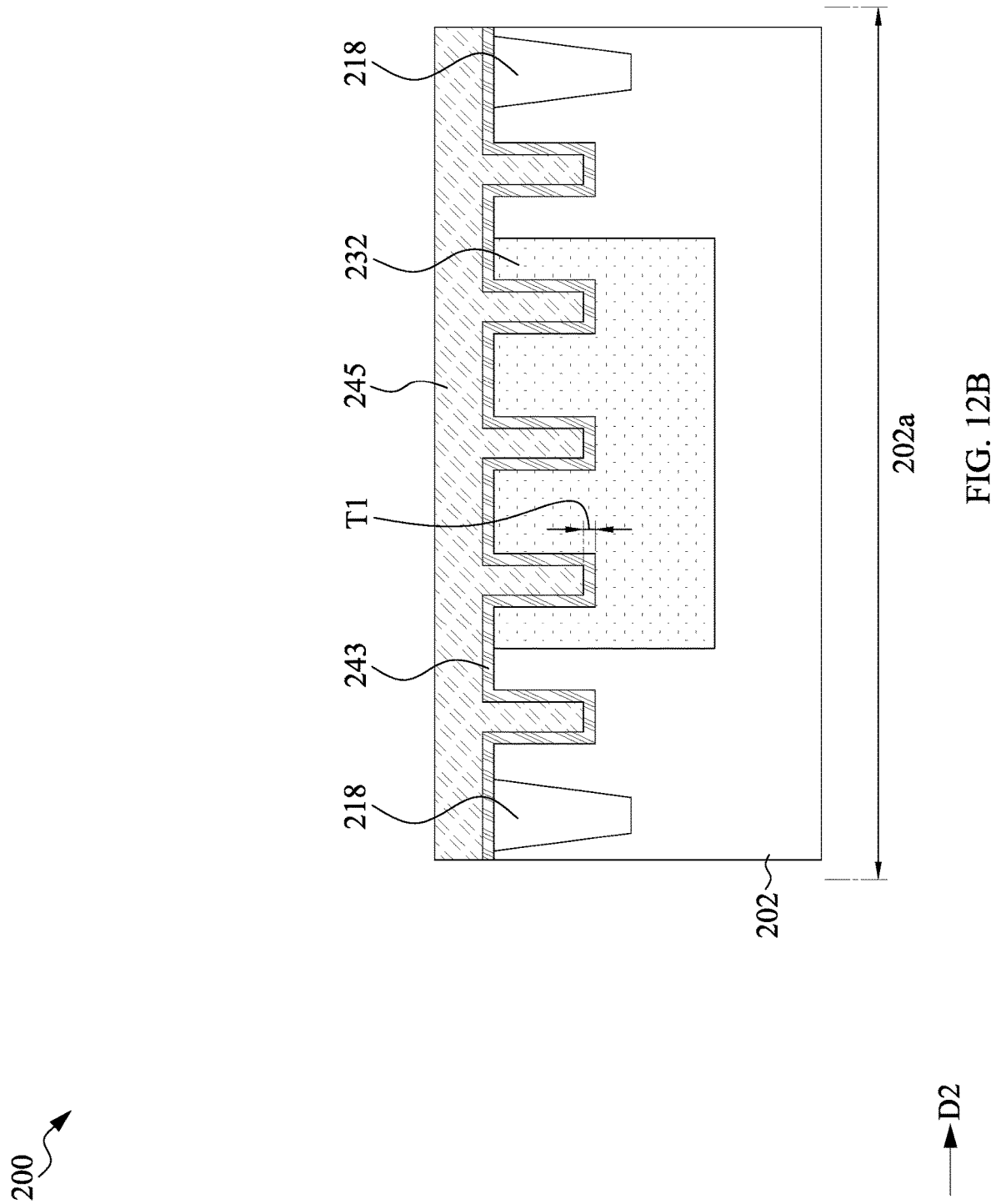

Referring to FIGS. 12A and 12B, a gate electrode layer 245 is formed over the substrate 202. The respective step is shown as operation 108 of the method 100 shown in FIG. 1. In some embodiments, the gate electrode layer 245 is formed over the substrate 202 in a gap-filling manner. The gate electrode layer 245 fills the recess 224. The remaining portions of the recess 224 left by the gate dielectric layer 243 may be filled with the gate electrode layer 245. The gate electrode layer 245 is formed from conductive material(s). The gate electrode layer 245 may include undoped polycrystalline silicon. In alternative embodiments, the gate electrode layer 245 is formed with doped semiconductive material e.g., doped polycrystalline silicon, or other suitable conductive materials e.g., metal.

Figure 13A:
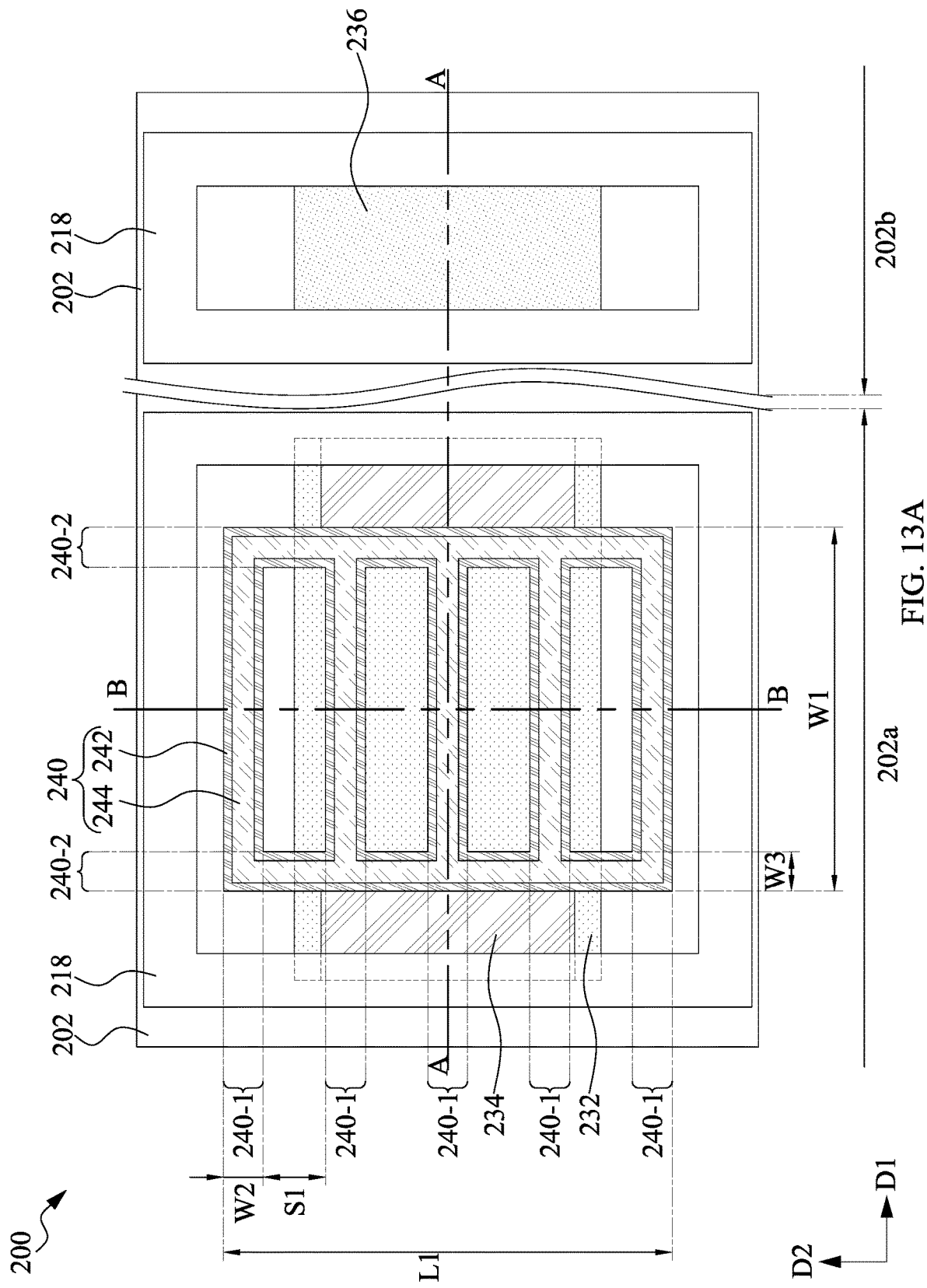
FIG. 13A illustrates a top view of a semiconductor structure at a fabrication stage according to aspects of one or more embodiments of the present disclosure.
Figure 13B:
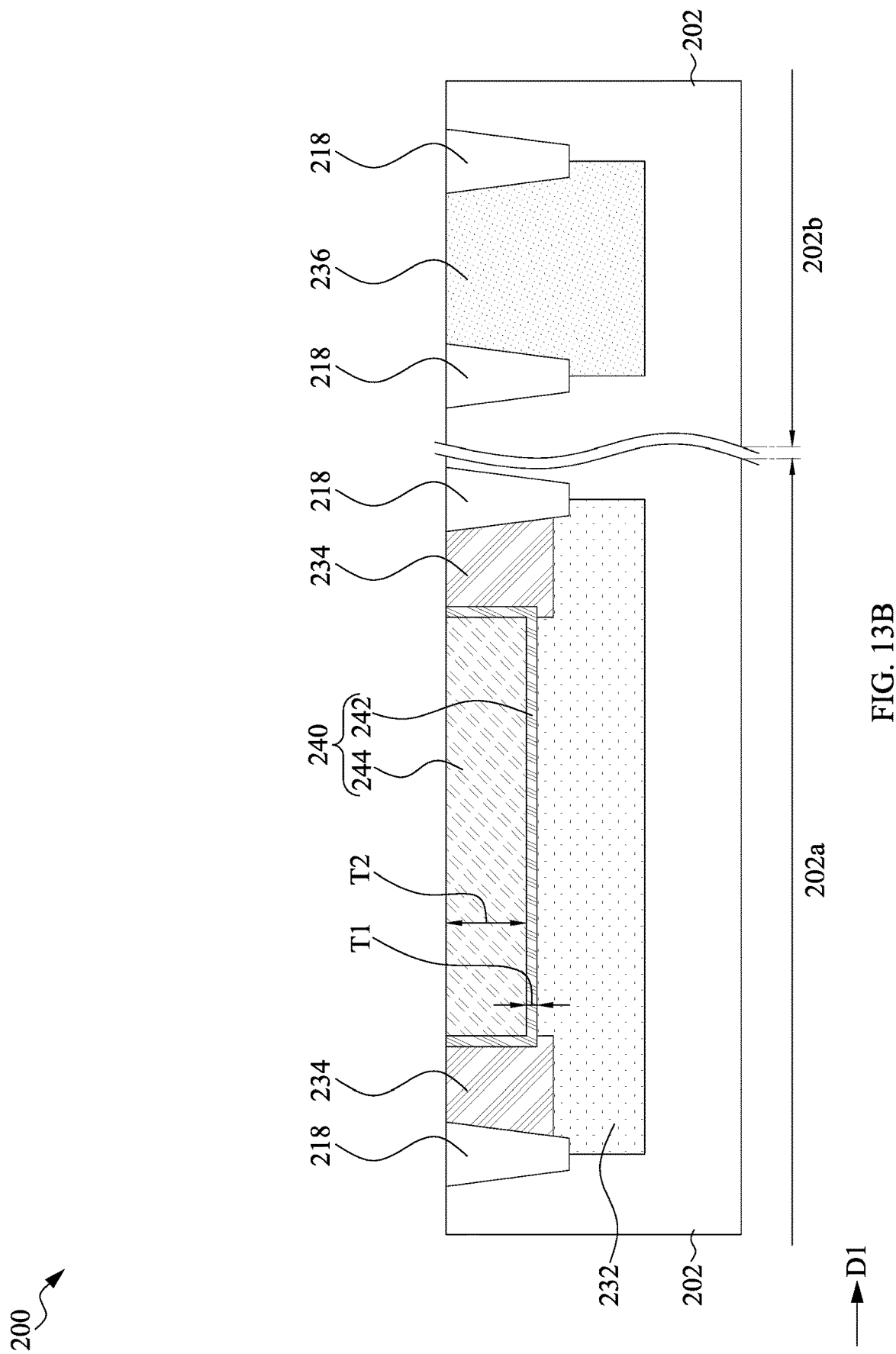
FIG. 13B is a cross-sectional view illustrated along a cross-section as reference cross-section A-A in FIG. 13A.
Figure 13C:
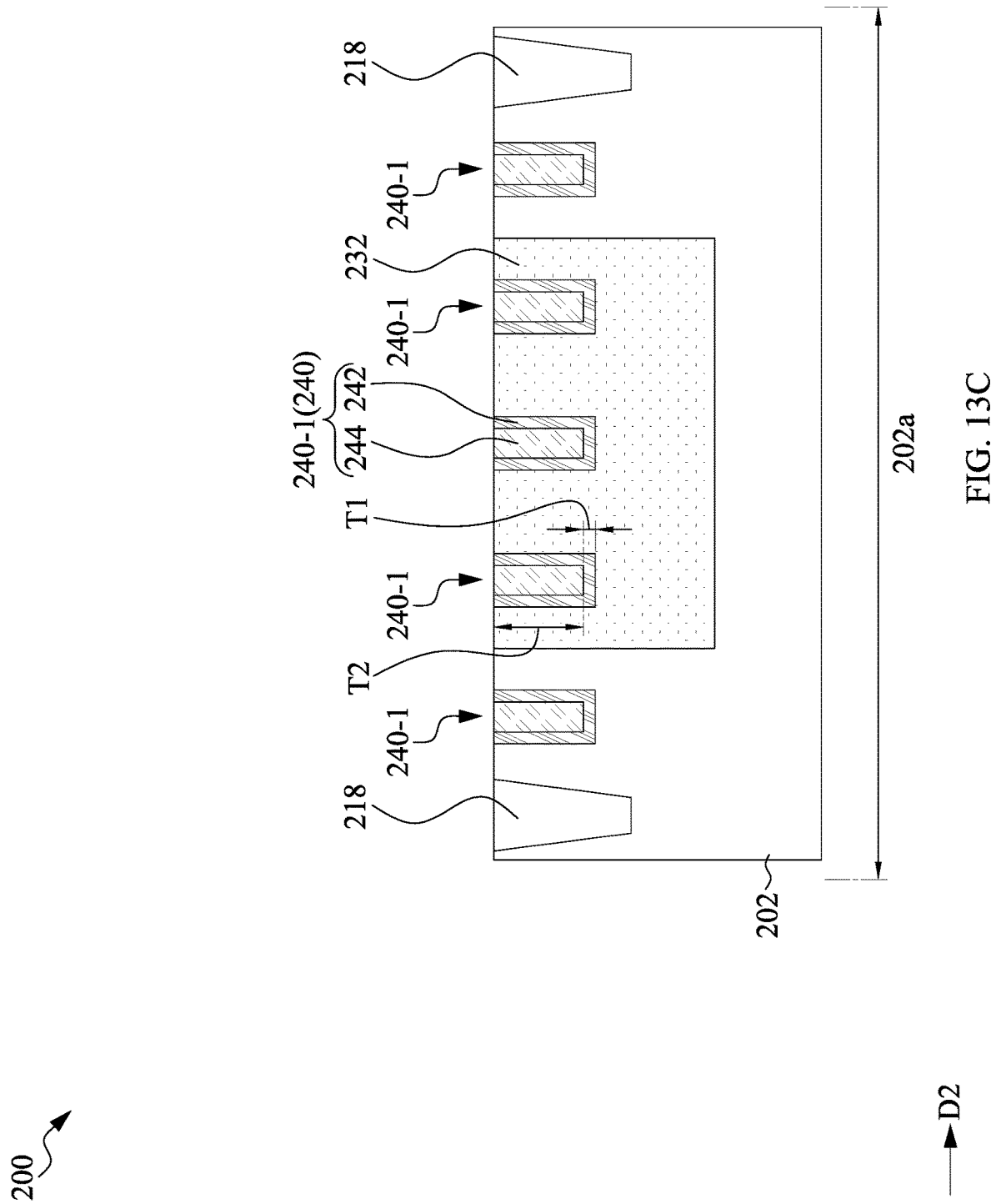
FIG. 13C is a cross-sectional view illustrated along a cross-section as reference cross-section B-B in FIG. 13A.

Referring to FIGS. 13A through 13C, a planarization such as CMP is then performed to remove excess portions of the gate dielectric layer 243 and the gate electrode layer 245, until the top surface of the isolation structure 218 or the top surface of the substrate 202 is exposed. The respective step is shown as operation 110 of the method 100 shown in FIG. 1. The remaining portions of the gate dielectric layer 243 and the gate electrode layer 245 form a gate structure 240. The gate structure 240 includes a gate dielectric 242 and a gate electrode 244. The gate electrode 244 is disposed within the substrate 202. The gate dielectric 242 is disposed within the substrate 202 and laterally surrounds the gate electrode 244. In some embodiments, the top surface of the gate structure 240 is substantially level with the top surface of the isolation structure 218, after the planarization. In some embodiments, the top surface of the gate structure 240 is substantially level with the top surface of the substrate 202, after the planarization.

As shown in FIG. 13A, the gate structure 240 has one or more first segments 240-1 extending along a first direction D1. The first segments 240-1 may extend parallel to each other. The gate structure 240 further has one or more second segments 240-2 extending along a second direction D2. The second segments 240-2 may extend in parallel. The first segments 240-1 may be physically or electrically connected to the second segments 240-2. For example, a first segment 240-1 in a first row is physically or electrically connected to a first segment 240-1 in a second row through the second segment 240-2. Also, the first segment 240-1 in the second row is physically or electrically connected to a first segment 240-1 in the third row through the second segment 240-2. One or more portions (e.g., the deep well region 232) of the substrate 202 may be exposed from the gate structure 240. The layout of the gate structure 240 may be configured based on different requirements for different semiconductor devices. In some other embodiments, the first segments 240-1 may not be parallel to each other. For example, each of the first segments 240-1 has multiple sections forming a piece-linear segment 240-1, in which each section may or may not be parallel to each other. In another embodiments, the first segments 240-1 may be in a serpent or meandered shape extending between the opposite shallow doped regions 234.

The gate structure 240 may a width W1 and a length L1. The width W1 may be greater than or substantially equal to the length L1. In some embodiments, the length L1 is greater than the width W1. The width W1 may be in the range between about 0.2 μm and about 200 μm in accordance with some embodiments. The length L1 may be in the range between about 0.2 μm and about 200 μm in accordance with some embodiments. The width W1 and the length L1 may be configured based on different requirements for different semiconductor devices.

The first segment 240-1 may have a width W2. In some embodiments, each of the first segments 240-1 has a substantially equal width W2. In alternative embodiments, the widths of the first segments 240-1 are different. The width W2 may be in the range between about 0.2 μm and about 200 μm in accordance with some embodiments.

The second segment 240-2 may have a width W3. In some embodiments, each of the second segments 240-2 has a substantially equal width W3. In alternative embodiments, the widths of the second segments 240-2 are different. The width W3 may be in the range between about 0.2 μm and about 200 μm in accordance with some embodiments.

A spacing S1 is arranged between two adjacent first segments 240-1. The spacing S1 may be in the range between about 0.2 μm and about 200 μm in accordance with some embodiments. The width W2 may be greater than the spacing S1. In some embodiments, a ratio W2/S1 is greater than or equal to 4. The width W2, the width W3 and the spacing S1 may be configured based on different requirements for different semiconductor devices.

In some comparative embodiments, a gate structure 240 is formed without segments (e.g., a plate-shaped gate structure). A total area of the gate structure 240 of the present embodiment is defined as X. A total area of the gate structure 240 of the comparative embodiment is defined as Y. A ratio X/Y may be in the range between about 70% and about 90% in accordance with some embodiments. The ratio X/Y may be also referred to as a pattern density of the gate structure 240. In other words, the pattern density of the gate structure 240 may be in the range between about 70% and about 90%. The pattern density of the gate structure 240 may be configured based on different requirements for different semiconductor devices.

As shown in FIG. 13B, the bottom surface of the gate structure 240 may be higher than the bottom surfaces of the isolation structures 218. In alternative embodiments, the bottom surface of the gate structure 240 is level with the bottom surfaces of the isolation structures 218. The thickness T2 of the gate electrode 244 may be configured based on different requirements for different semiconductor devices. For example, when the gate electrode 244 is used as an HV MOS device or an MV MOS device, the thickness T2 of the gate electrode 244 is substantially in a range from about 700 angstroms (Å) to about 1,000 angstroms.

As shown in FIG. 13C, at least a portion of the top surface of the substrate 202 may be exposed after the planarization process. For example, at least a portion of the top surface of the deep well region 232 is exposed after the planarization process. In some embodiments, at least a portion of the substrate 202 is interposed between the segments 240-1 or 240-2 of the gate structure 240. For example, at least a portion of the deep well region 232 of the substrate 202 is interposed between two adjacent first segments 240-1.

The proposed layout of the gate structure 240 provides advantages. In cases where the gate structure 240 is formed of a plate without connected segments (e.g., a plate-shaped gate structure 240), the plate-shaped gate structure 240 may undergo severe dishing effect during the planarization. For example, when a planarization process is performed to remove excess portions of the gate dielectric layer 243 and the gate electrode layer 245, the planarization process will remove portions of the gate dielectric layer 243 and the gate electrode layer 245 to expose underlying features (e.g., the top surface of the substrate 202 and the top surface of isolation structures 218) for subsequent processing (e.g., forming the second-voltage device 210b). However, due to the different etching rates of the various types of materials disposed within the plate-shaped gate structure 240 and the substrate 202 (e.g., dielectric, metal, polysilicon, etc.), the planarization process may cause dishing in the gate dielectric 242 or the gate electrode 244. In some instances, the dishing may cause undesired removal of the gate electrode 244 or the gate dielectric 242. Also, the dishing effects may affect the dimensions of the channel 273 of the first-voltage device 210a to be formed subsequently. For example, in cases where the gate structure 240 is formed as a plate-shaped gate structure 240, the channel dimension of the first-voltage device 210a may be less than 20 μm times 20 μm.

The proposed layout of the gate structure 240 may help alleviating the dishing effect. The gate structure 240 of the present embodiment includes a plurality of segments 240-1 or 240-2. At least a portion of the substrate 202 (or a least a portion of the deep well region 232) is interposed between the segments 240-1 or 240-2. The presence of the portion of the substrate 202 (or the deep well region 232) between the segments 240-1 or 240-2 may provide structural support and serve as an etch stop layer during the planarization process. The presence of the portion of the substrate 202 (or the deep well region 232) may mitigate the dishing effect in the gate structure 240. Moreover, due to the structural support of the substrate 202 (or the deep well region 232), the dimensions of the channel 273 of the first-voltage device 210a may be increased. In some embodiments, the channel dimension of the first-voltage device 210a may be increased to about 200 μm times 200 μm, but the present disclosure is not limited thereto.

Figure 14A:
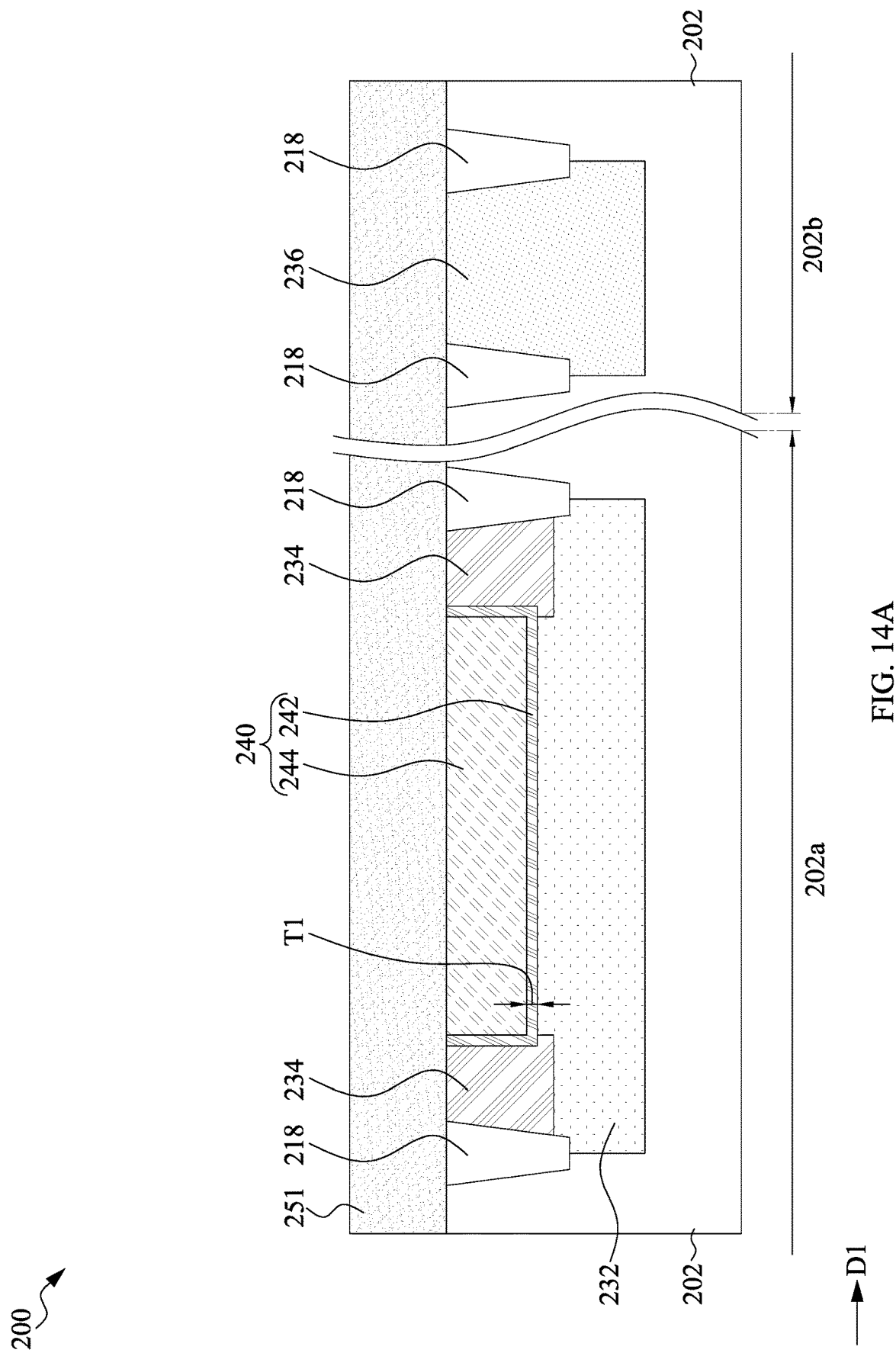
FIG. 14A is a cross-sectional view illustrated along a similar cross-section as reference cross-section A-A in FIG. 13A.
Figure 14B:
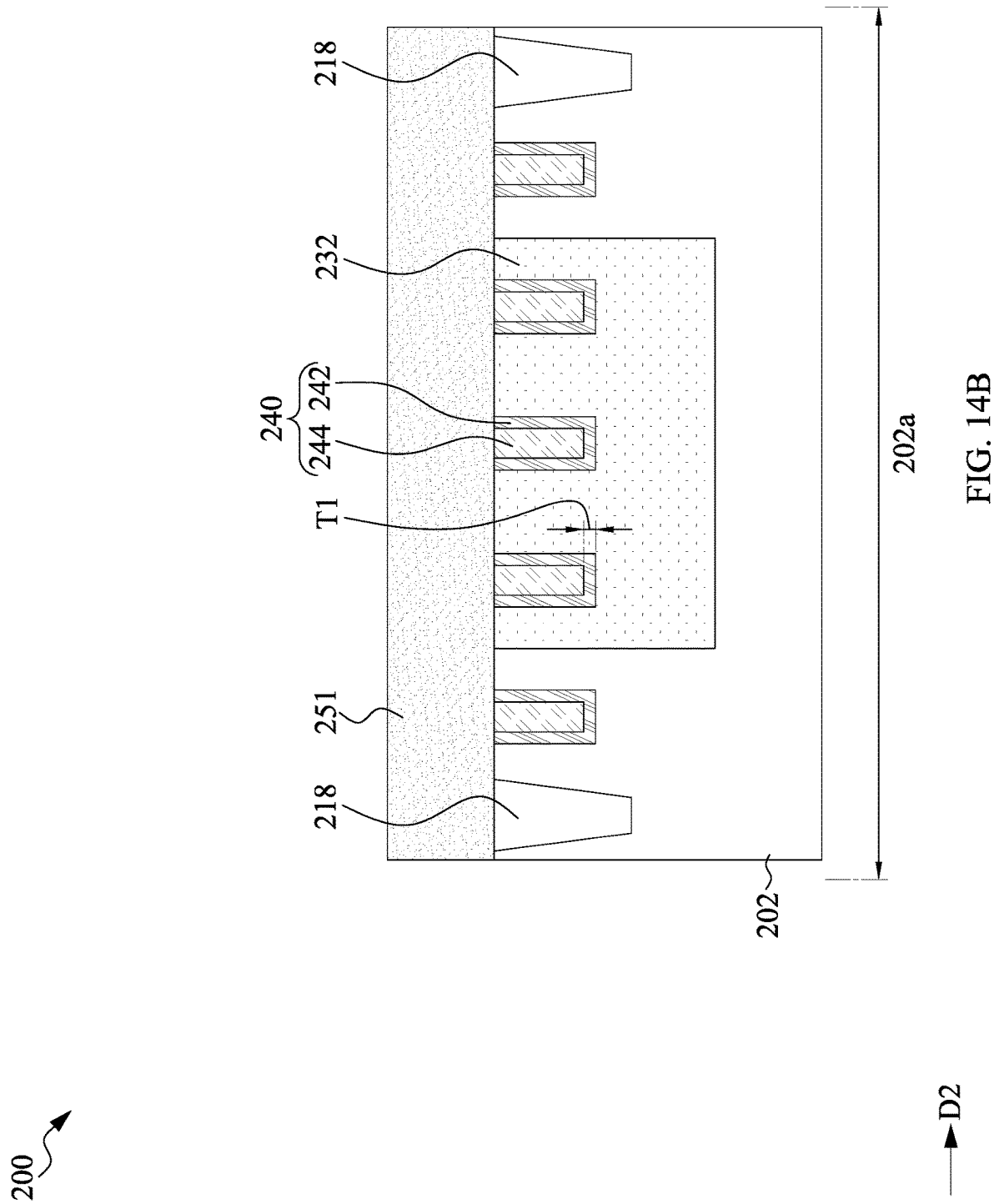
FIG. 14B is a cross-sectional view illustrated along a similar cross-section as reference cross-section B-B in FIG. 13A.

FIGS. 14A-14B and 15A-15C illustrate the formation of a protection structure 253. Referring to FIGS. 14A-14B, a protecting layer 251 is formed over the substrate 202. The protecting layer 251 may cover the top surface of the gate structure 240, e.g., the top surface of the gate electrode 244 and/or the top surface of the gate dielectric 242. In some embodiments, the protecting layer 251 further covers the top surface of the shallow doped regions 234, the top surfaces of the isolation structures 218, and the top surface of the deep well region 236.

The protecting layer 251 may include a monolayer structure or a multilayer structure. The formation of the protecting layer 251 may include depositing blanket dielectric layers. In some embodiments, the protecting layer 251 include silicon nitride, and other dielectric materials such as SiOx, SiC, SiON, or the like, may also be used.

Figure 15B:
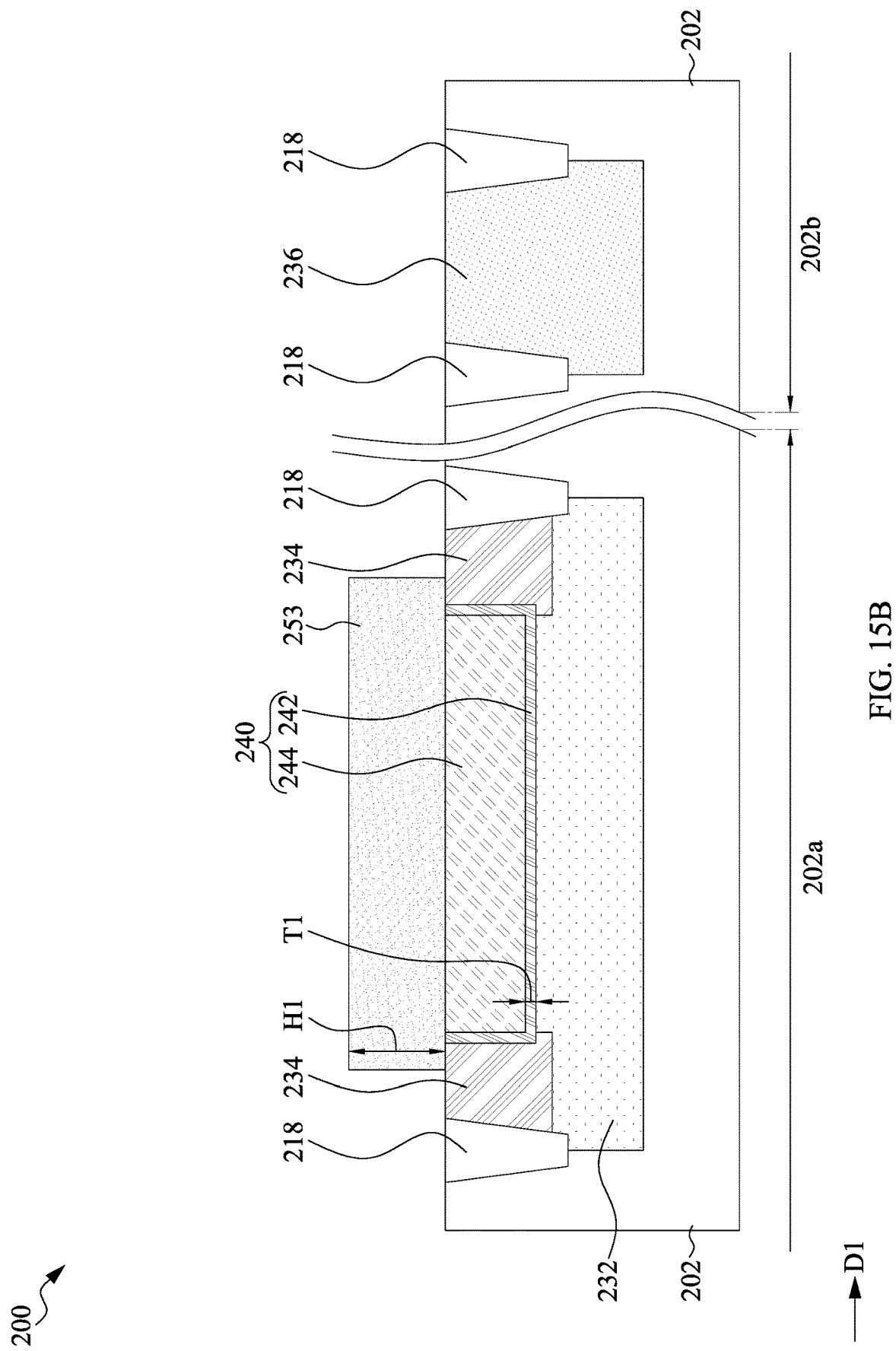
FIG. 15B is a cross-sectional view illustrated along a cross-section as reference cross-section A-A in FIG. 15A.
Figure 15C:
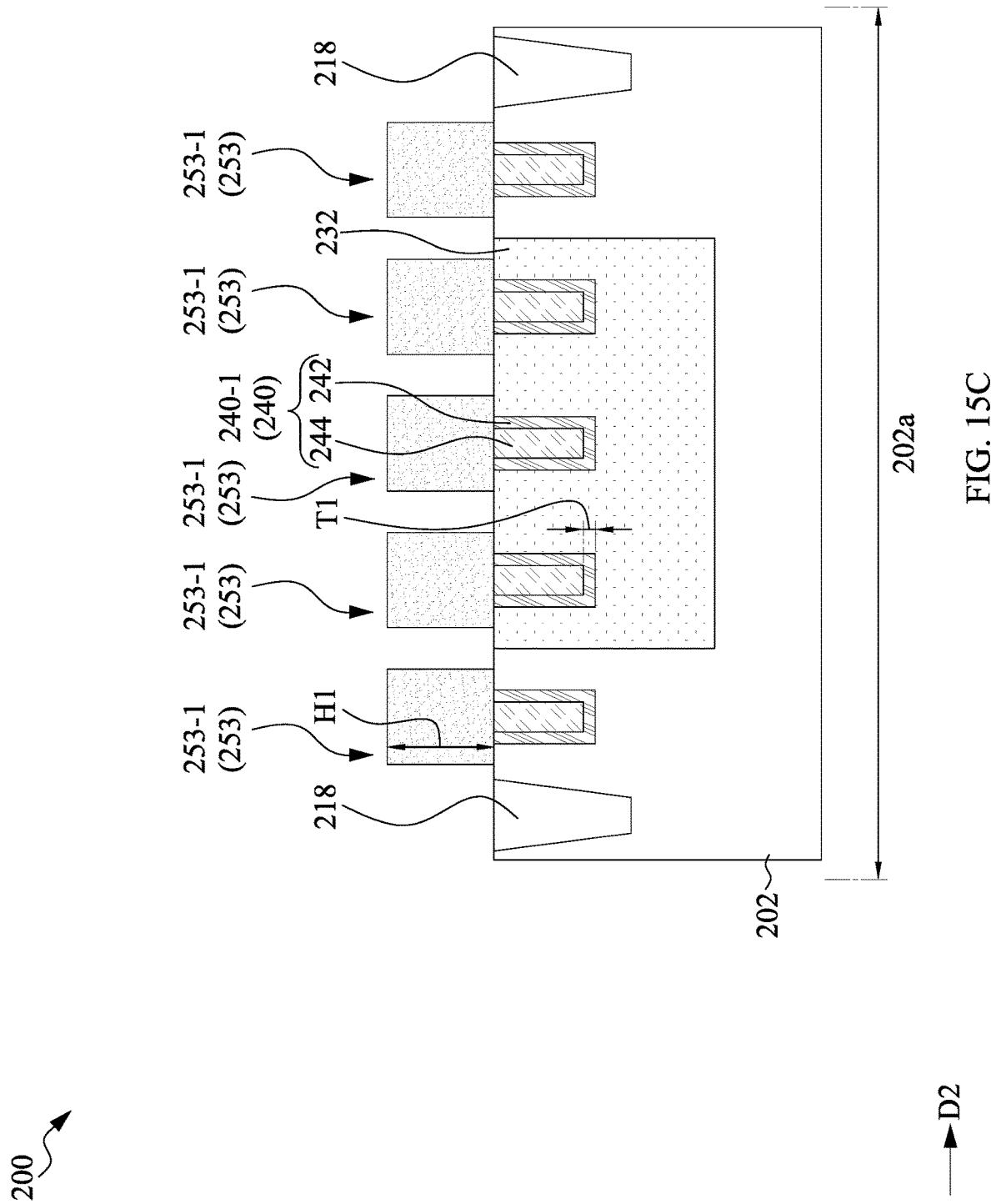
FIG. 15C is a cross-sectional view illustrated along a cross-section as reference cross-section B-B in FIG. 15A.

Referring to FIGS. 15A-15C, a photo resist layer (not shown) is formed over the protecting layer 251 and is then patterned to form openings exposing portions of the protecting layer 251. The exposed portions of the protecting layer 251 are etched through the openings of the photo resist layer. The photo resist layer is then removed, the remaining portions of the protecting layer 251 form a protection structure 253.

As shown in FIG. 15A, the deep well region 232 extends in a first direction D1 within the substrate 202. In some embodiments, the gate structure 240 overlaps at least a portion of the deep well region 232 and extends in a second direction D2 different from the first direction D1. The second direction D2 may be perpendicular to the first direction D1. The protection structure 253 may cover the top surface of the gate dielectric 242 and the top surface of the gate electrode 244. As illustrated in FIGS. 15B and 15C, the protection structure 253 may further cover a portion of the top surface of the shallow doped region 234 or a portion of the top surface of the deep well region 232. In some embodiments, at least a portion of the substrate 202 is exposed from the protection structure 253. For example, at least a portion of the deep well region 232 is exposed from the protection structure 253.

The protection structure 253 overlaps the top surface of the gate dielectric 242 in a top-view perspective. The protection structure 253 may be electrically isolated from the gate structure 240. In some embodiments, the protection structure 253 overlaps the entire top surface of the gate dielectric 242. The protection structure 253 may resemble the configuration of the gate structure 240. The protection structure 253 may have one or more first portions 253-1 extending in the first direction D1 and one or more second portions 253-2 extending in the second direction D2. In some embodiments, the first portions 253-1 overlap the corresponding first segments 240-1 of the gate structure 240 from a top-view perspective. In some embodiments, the second portions 253-2 overlap the corresponding second segments 240-2 of the gate structure 240 from a top-view perspective. In alternative embodiments, the protection structure 253 has configurations different from the gate structure 240. For example, the protection structure 253 is a plate-shaped protection structure 253 that cover the exposed portions of the substrate 202 (or the deep well region 232) between the first segments 240-1.

The gate structure 240 may a width $W_p$ and a length $L_p$. The width $W_p$ may be greater than or substantially equal to the width W1. The length $L_p$ may be greater than or substantially equal to the length L1. The width $W_p$ and the length $L_p$ may be configured based on different requirements for different semiconductor devices.

The first portion 253-1 may have a width W4. The width W4 may be greater than or substantially equal to the width W2. In some embodiments, each of the first portions 253-1 has a substantially equal width W4. In alternative embodiments, the widths of the first portions 253-1 are different. The second portions 253-2 may have a width W4. The width W5 may be greater than or substantially equal to the width W3. In some embodiments, each of the second portions 253-2 has a substantially equal width W4. In alternative embodiments, the widths of the second portions 253-2 are different. A spacing S2 is arranged between two adjacent first portions 253-1. The spacing S2 may be less than the spacing S1. The width W4, the width W5 and the spacing S2 may be configured based on different requirements for different semiconductor devices.

As shown in FIG. 15B, the protection structure 253 has a height H1. The height H1 of the protection structure 253 may be configured based on different requirements for different semiconductor devices. For example, the height H1 of the protection structure 253 may be configured based on the height of the second-voltage device 210b to be formed in the second device region 202b. In some embodiments, the height H1 of the protection structure 253 is substantially in a range from about 300 angstroms (Å) to about 500 angstroms.

Figure 16A:
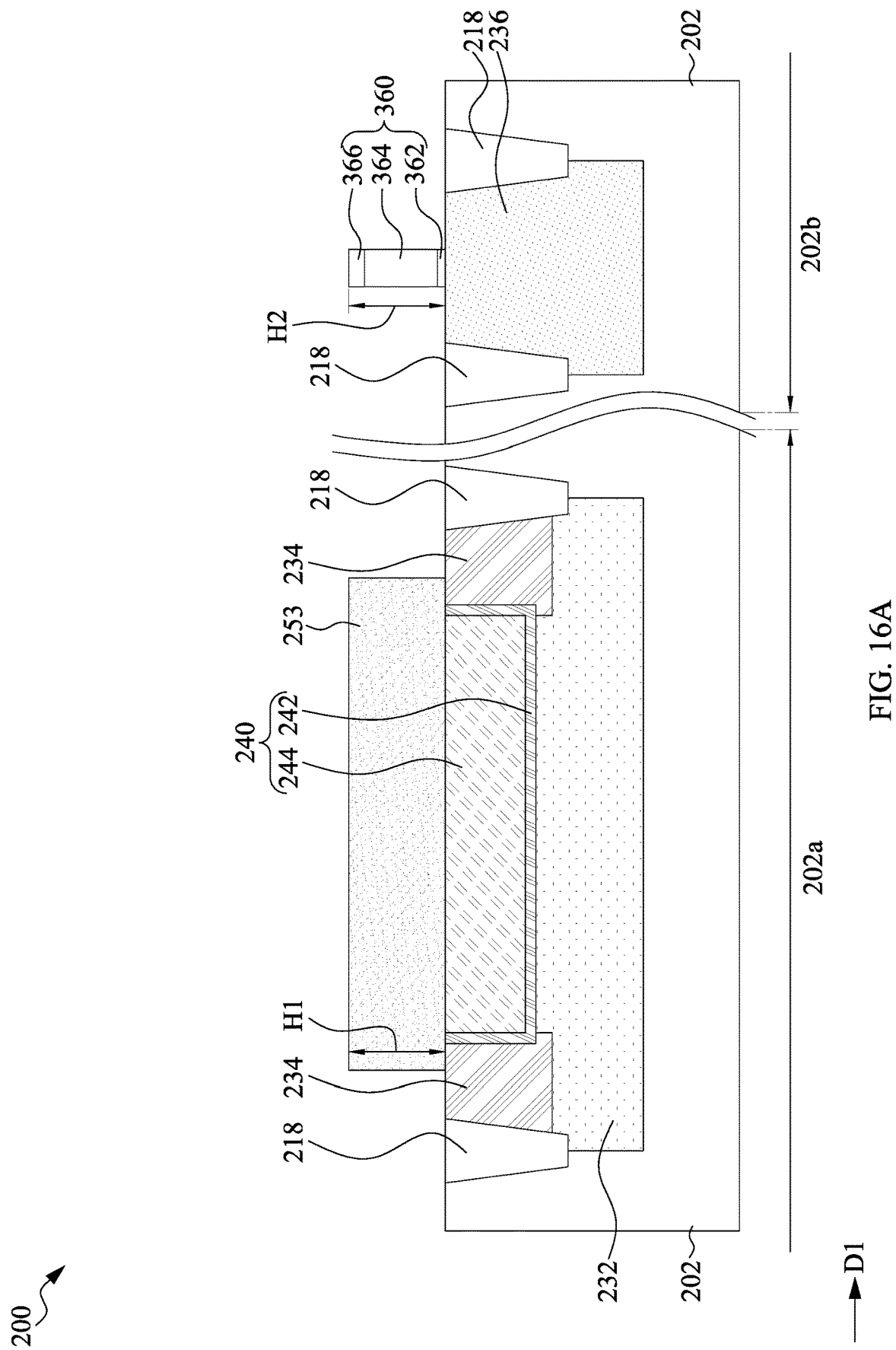
FIGS. 16A, 17A and 18A are cross-sectional views illustrated along a similar cross-section as reference cross-section A-A in FIG. 15A.
Figure 16B:
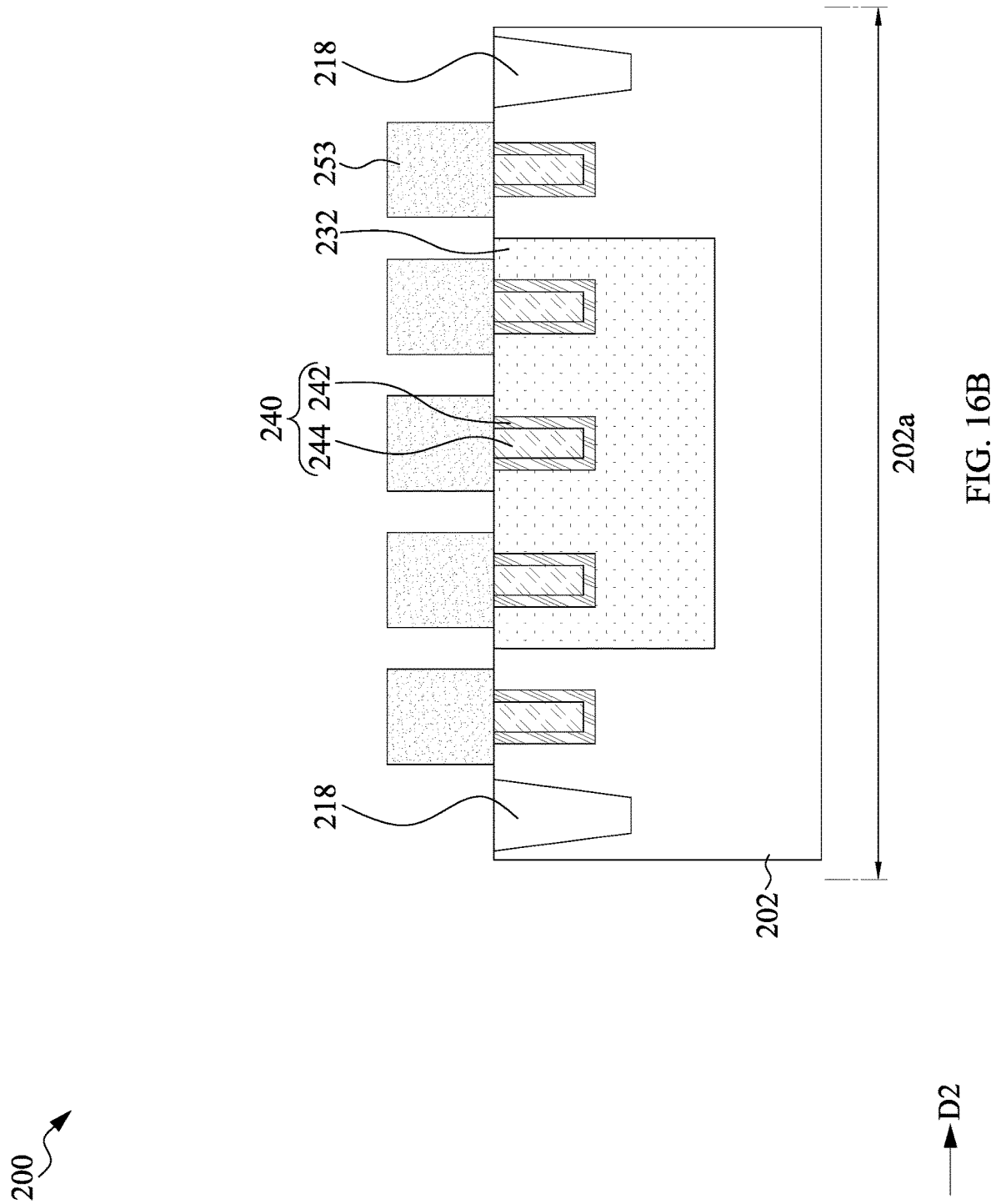
FIGS. 16B, 17B and 18B are cross-sectional views illustrated along a similar cross-section as reference cross-section B-B in FIG. 15A.

Next, referring to FIGS. 16A-16B, one or more gate stacks 360 are formed in the second device region 202b. The gate stacks 360 may be removed in subsequent steps and replaced by their respective replacement gates. Accordingly, the gate stacks 360 are dummy gates in accordance with some embodiments. The gate stack 360 includes a gate dielectric 362 and a gate electrode 364. The gate dielectric 362 may be formed of silicon oxide, silicon nitride, silicon carbide, or the like. The gate electrode 364 may include conductive layers. The gate electrode 364 may include polysilicon in accordance with some embodiments. The gate electrode 364 may also be formed of other conductive materials such as metals, metal alloys, metal silicides, metal nitrides, and/or the like. In some embodiments, the gate stack 360 further includes hard mask 366, respectively. The hard mask 366 may be formed of silicon nitride, for example, while other materials such as silicon carbide, silicon oxynitride, and the like may also be used. In accordance with alternative embodiments, the hard mask 366 is not formed.

In some embodiments, the top surface of the gate stack 360 formed in the second device region 202b are substantially level with the top surface of the protection structure 253. The gate stack 360 may have a height H2 substantially equal to the height H1 of the protection structure 253. In some embodiments, the height H2 of the gate stack 360 is substantially in a range from about 300 angstroms (Å) to about 500 angstroms. In some embodiments, the protection structure 253 may serve as a blocking layer for the gate structure 240 during the formation of the gate stacks 360. Thus, the gate stacks 360 may only be formed in the second device region 202b in some embodiments.

Figure 17A:
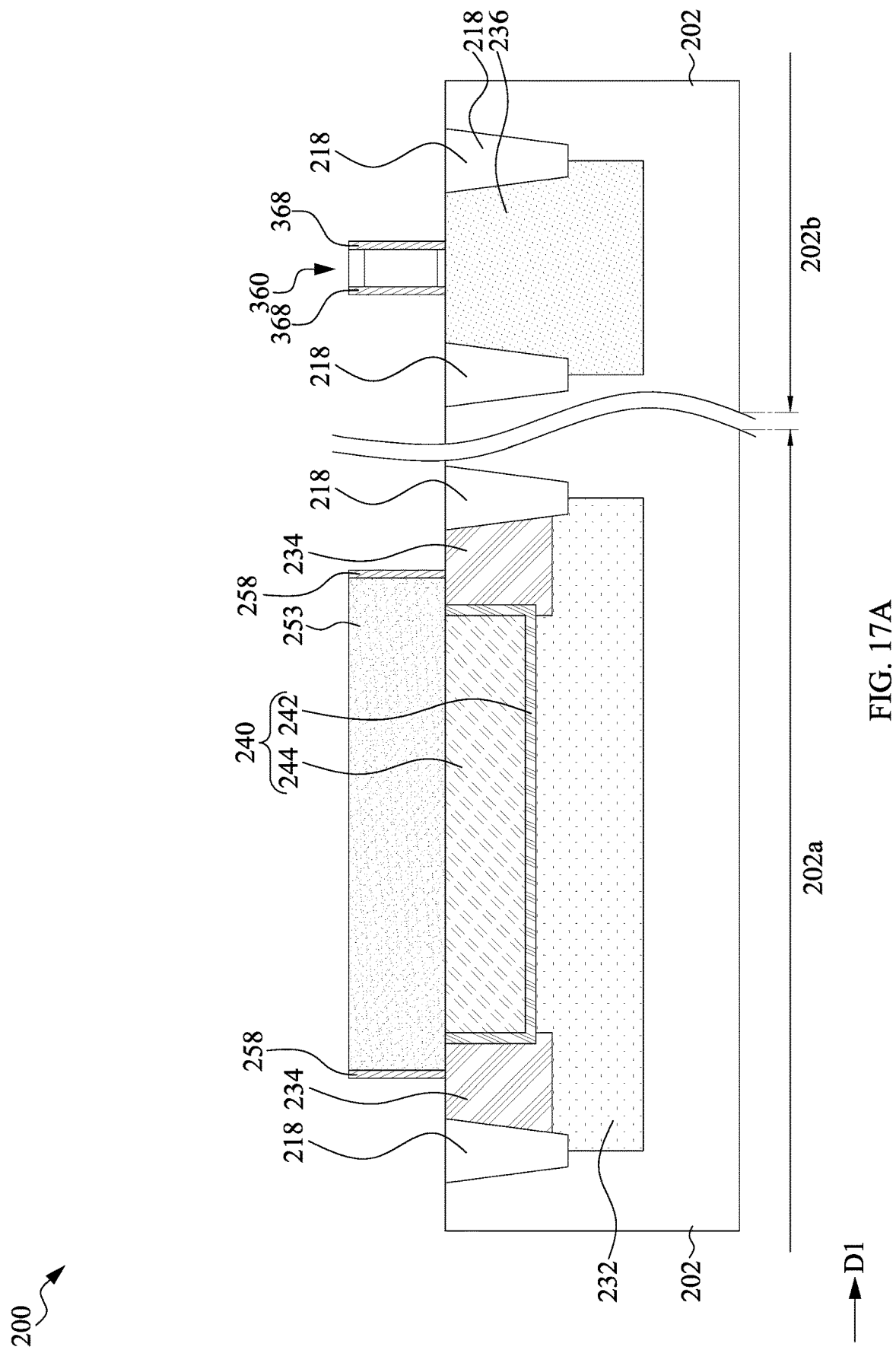
Figure 17B:
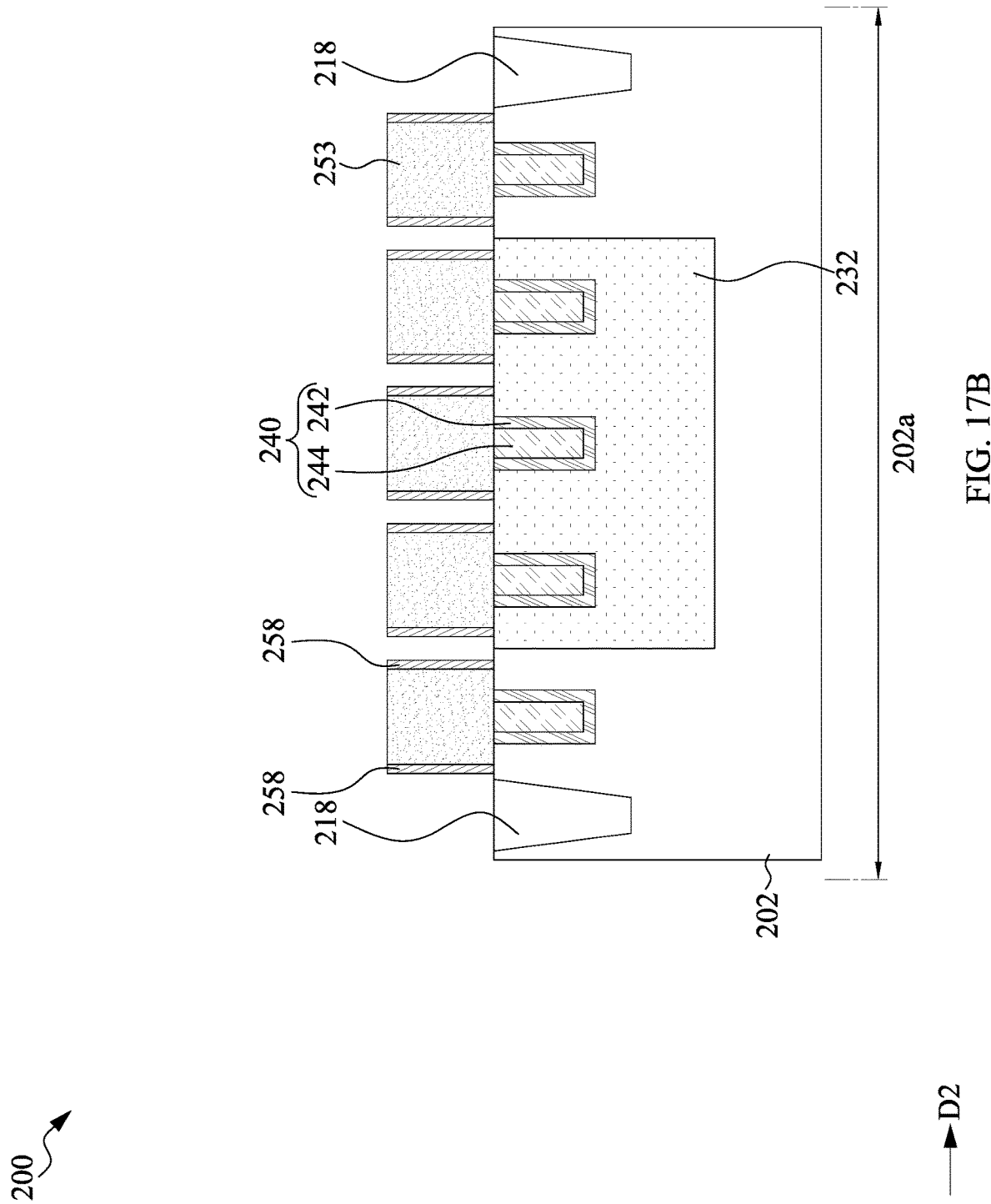

Referring to FIGS. 17A-17B, gate spacers 258 and 368 are formed on the sidewalls of the protection structure 253 and the gate stack 360, respectively. In accordance with some embodiments, each of the gate spacers 258 and 368 includes a multilayer structure, e.g., the gate spacers 258 or 368 may include a silicon oxide layer and a silicon nitride layer on the silicon oxide layer. The formation may include depositing blanket dielectric layers, and then performing an anisotropic etching to remove the horizontal portions of the blanket dielectric layers. The available deposition methods include PECVD, LPCVD, sub-atmospheric chemical vapor deposition (SACVD), and other deposition methods. In some embodiments, the gate spacers 258 and 368 may be formed during a same formation process, and thus are formed of the same materials.

Figure 18A:
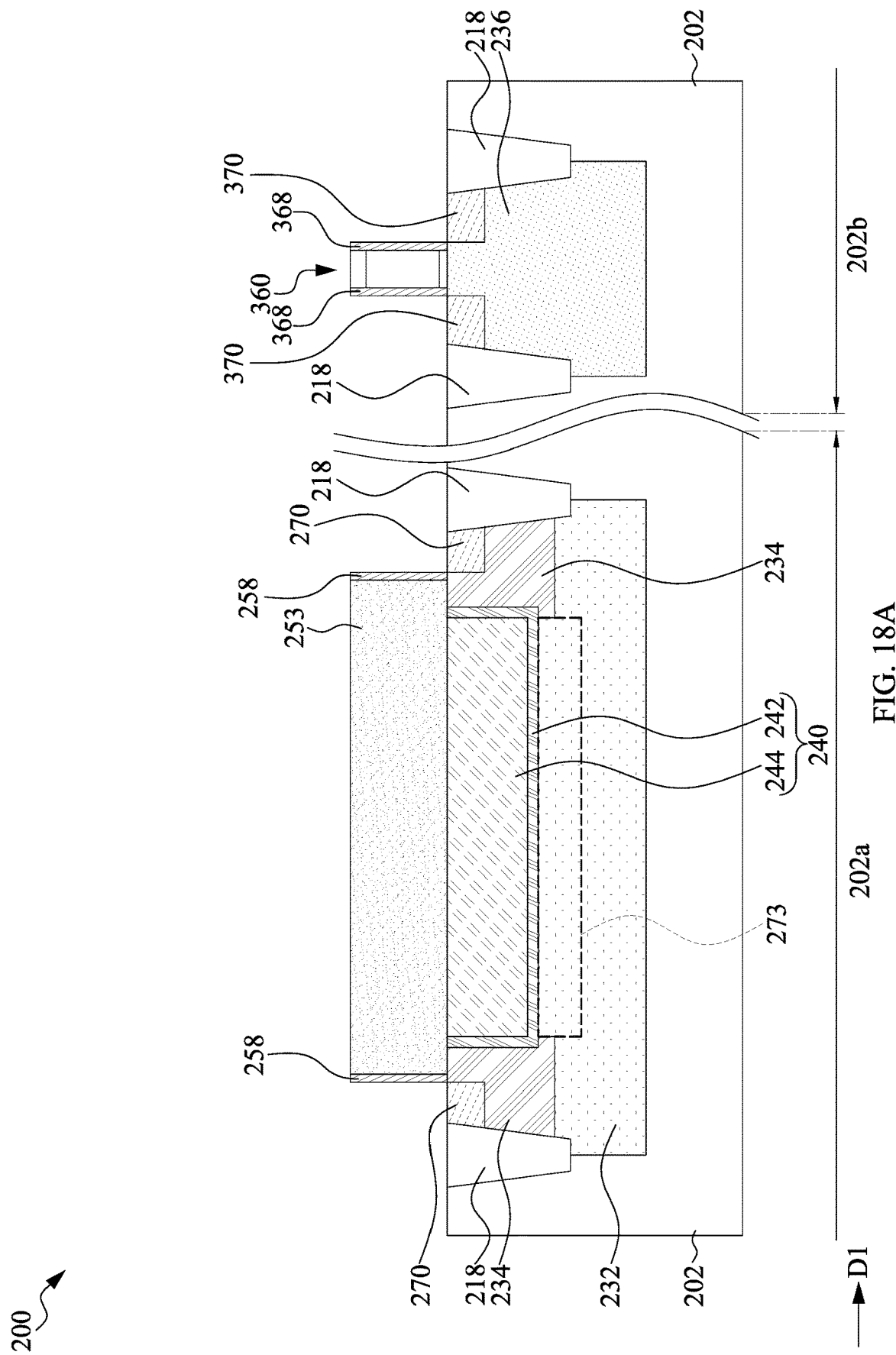
Figure 18B:
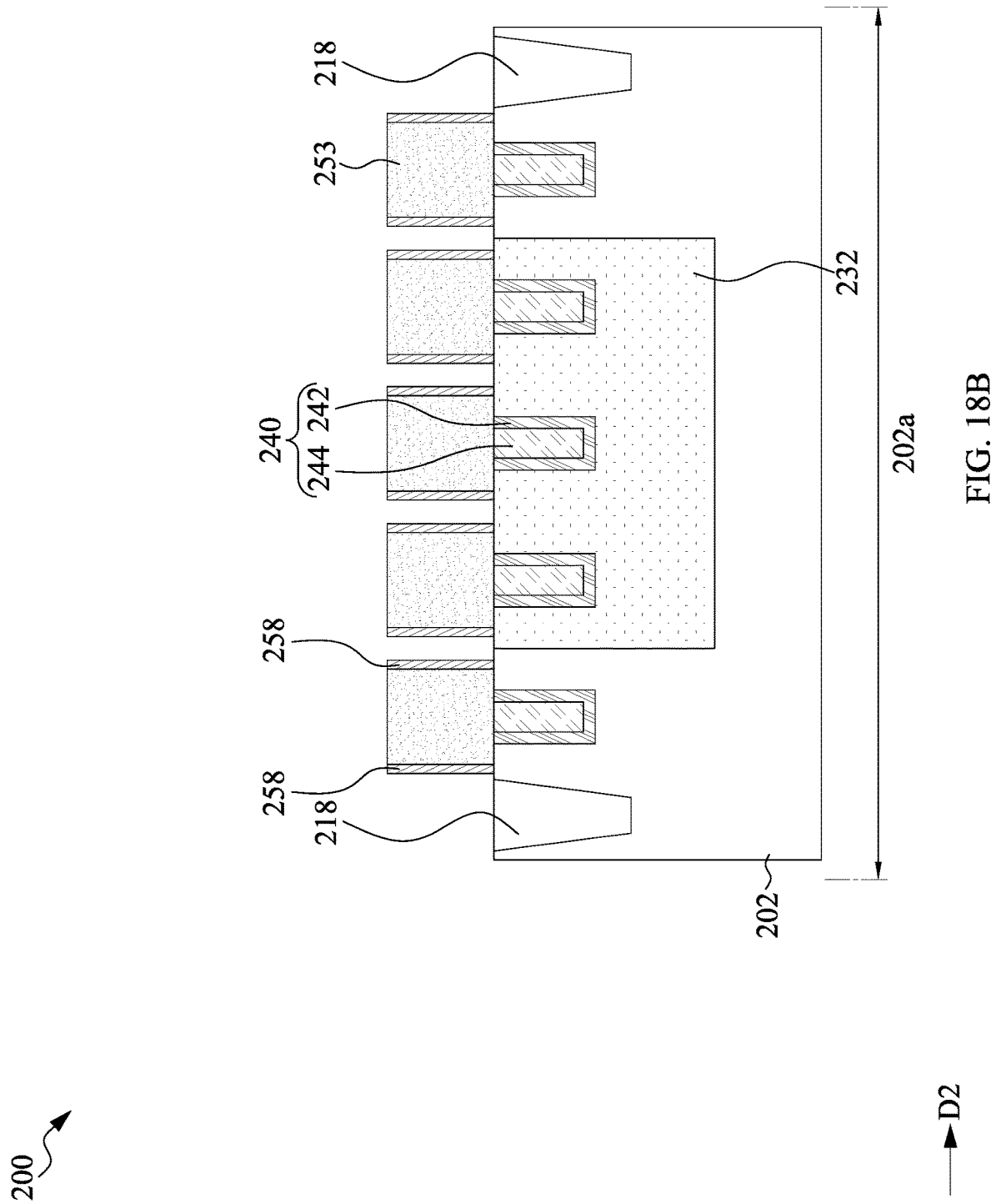

Referring to FIGS. 18A-18B, source regions and drain regions (collectively referred to as source/drain regions hereinafter) 270 and 370 are formed in the first device region 202a and the second device region 202b. In some embodiments, doped regions (not shown) may be formed in the first device region 202a. For example, the doped region may be formed in the deep well region 232. In some embodiments, a photo resist (not shown) is formed over the substrate 202 to define the location of the source/drain regions 270 and 370, and the doped regions. In addition, the source/drain regions 270 and 370, and the doped regions may be formed in a single formation process, and thus have the same depth, and are formed of the same materials. In some embodiments, the photo resist is formed to cover the entire protection structure 253. Thus, doped regions are not formed in the deep well region 232 or the substrate 202.

Referring to the first device region 202a, the source/drain regions 270 may be formed in the shallow doped regions 234. One of the source/drain regions 270 formed in the shallow doped regions 234 serves as the source region, and the other one of the source/drain regions 270 formed in the shallow doped regions 234 serves as the drain region. A channel 273 is formed directly underlying the gate dielectric 242 for conducting an electric current between the source/drain regions 270. The source/drain regions 270 are arranged on opposite sides of the deep well region 232. The channel 273 may be formed in the upper portion of the deep well region 232. Referring to the second device region 202b, the source/drain regions 370 are formed in the deep well region 236.

In some embodiments, the source/drain regions 270 and 370 may be formed simultaneously in a same implantation process. In some embodiments, the source/drain regions 270 and 370 are of n-type, and are heavily doped, and thus are referred to as N+ regions. As shown in FIG. 18A, the source/drain regions 270 may be spaced apart from the gate dielectric 242 by the protection structure 253 and the gate spacer 258. Further, the source/drain regions 270 and 370 may have edges aligned with the edges of the gate spacers 258 and 368, respectively. In alternative embodiments, the doped regions formed in the deep well region 232 have edges aligned with the edges of the gate spacers 258.

Figure 19A:
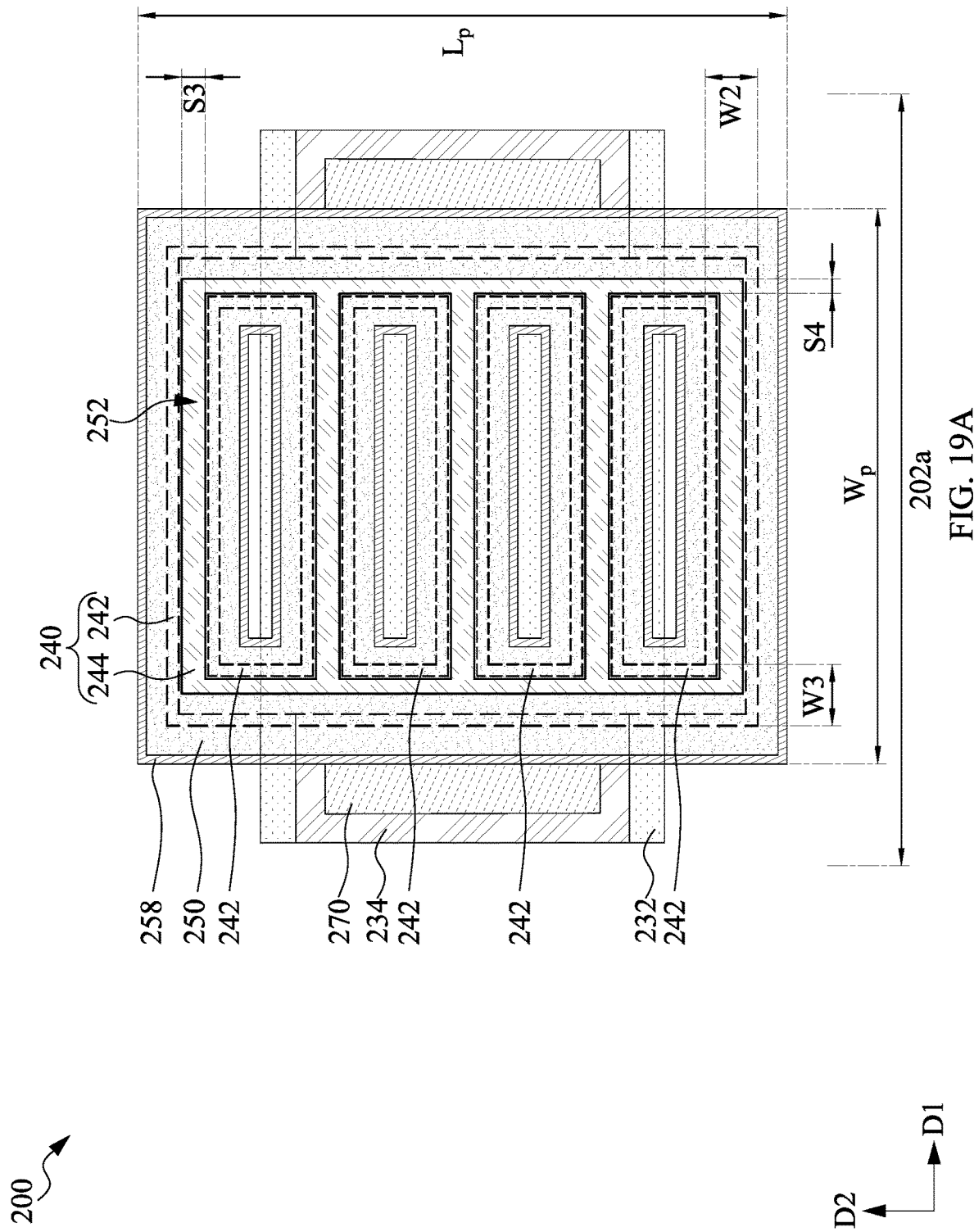
FIG. 19A illustrates a top view of a semiconductor structure at a fabrication stage according to aspects of one or more embodiments of the present disclosure.
Figure 19B:
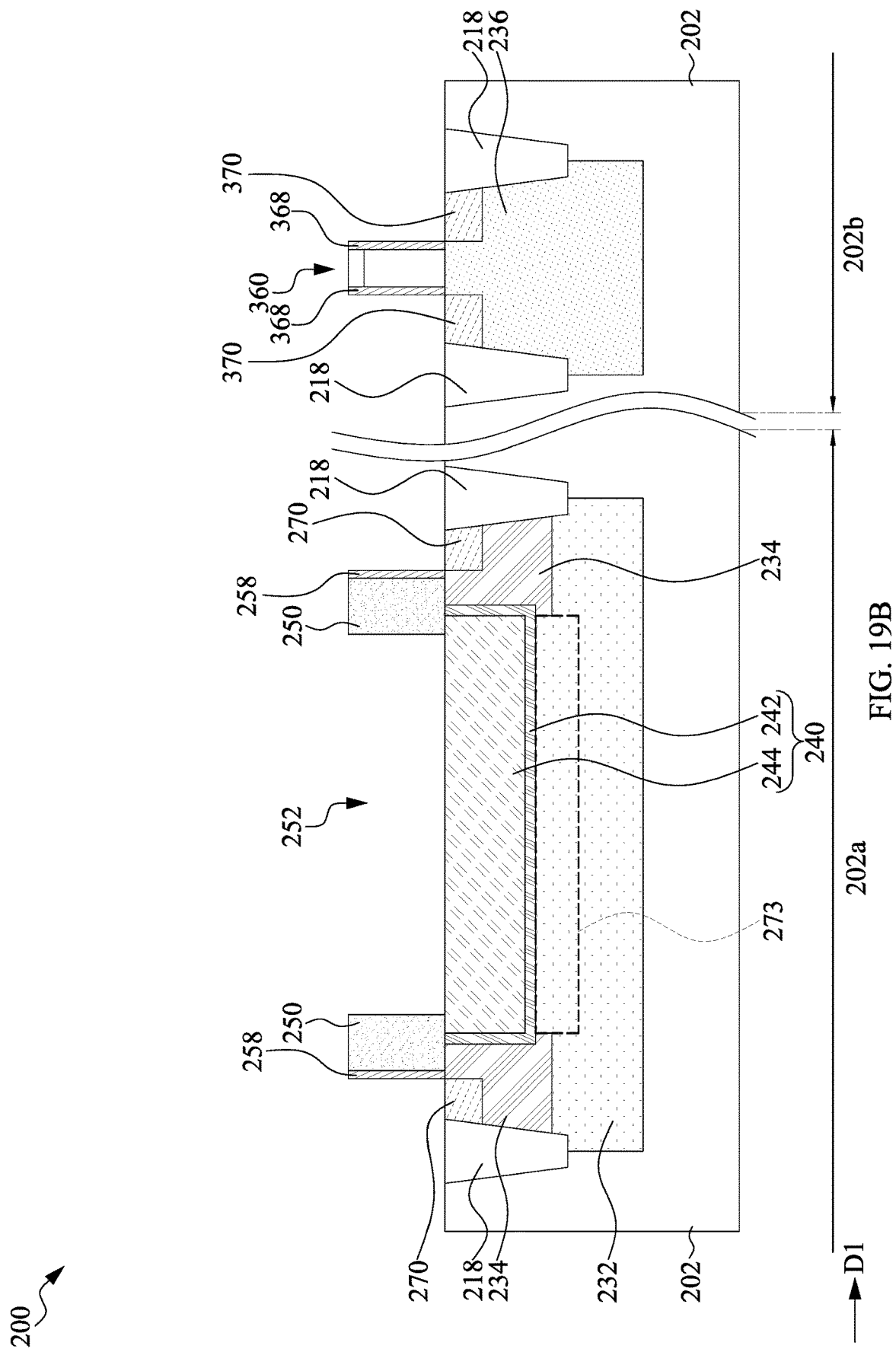
FIG. 19B is a cross-sectional view illustrated along a similar cross-section as reference cross-section A-A in FIG. 15A.
Figure 19C:
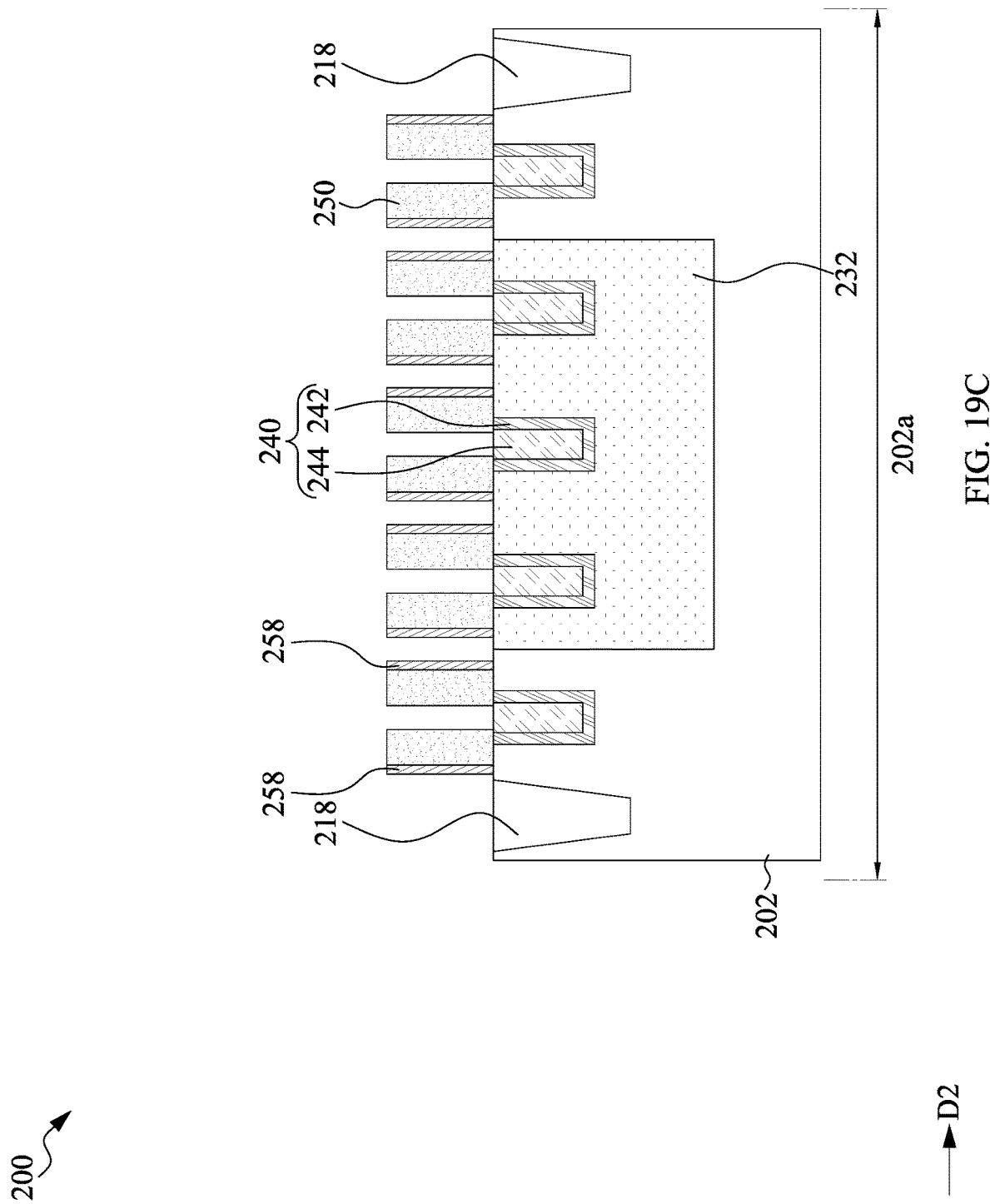
FIG. 19C is a cross-sectional view illustrated along a similar cross-section as reference cross-section B-B in FIG. 15A.

Referring to FIGS. 19A-19C, a pattering operation is performed on the protection structure 253 to form the protection structure 250. In some embodiments, a photo resist layer (not shown) is formed over the protection structure 253. The photo resist layer is then patterned to form openings exposing portions of the protection structure 253. The exposed portions of the protection structure 253 are etched using the patterned photo resist layer as an etching mask. The photo resist layer is then removed. The un-etched portions of the protection structure 253 forms the protection structure 250. The protection structure 250 includes openings 252 exposing the at least a portion of the gate electrode 244. In some embodiments, at least a portion of the gate electrode 244 is covered by the protection structure 250. In addition, the top surface of the gate dielectric 242 is covered by the protection structure 250. In some embodiments, the protection structure 250 covers an entirety of the gate dielectric 242. The protection structure 250 may contact and overlap the gate dielectric 242. The protection structure 250 may further contact and overlap a portion of the gate electrode 244 and a portion of the shallow doped regions 234.

As shown in FIG. 19A, a top view of the protection structure 250, the gate spacer 258, the gate structure 240, the deep well region 232, the shallow doped regions 234 and the source/drain regions 270 are illustrated. The width $W_p$ and the length $L_p$ of the protection structure 253 may be kept unchanged during the patterning process. The protection structure 250 may have the width $W_p$ and the length $L_p$ same as those of the protection structure 253. In some embodiments, the protection structure 250 includes the opening 252 after the patterning process. The opening 252 may include a first dimension S3 and a second dimension S4. The first dimension S3 may be less than the width W2 of the first segment 240-1 of the gate structure 240. The second dimension S4 may be less than the width W3 of the second segment 240-2 of the gate structure 240.

Figure 20A:
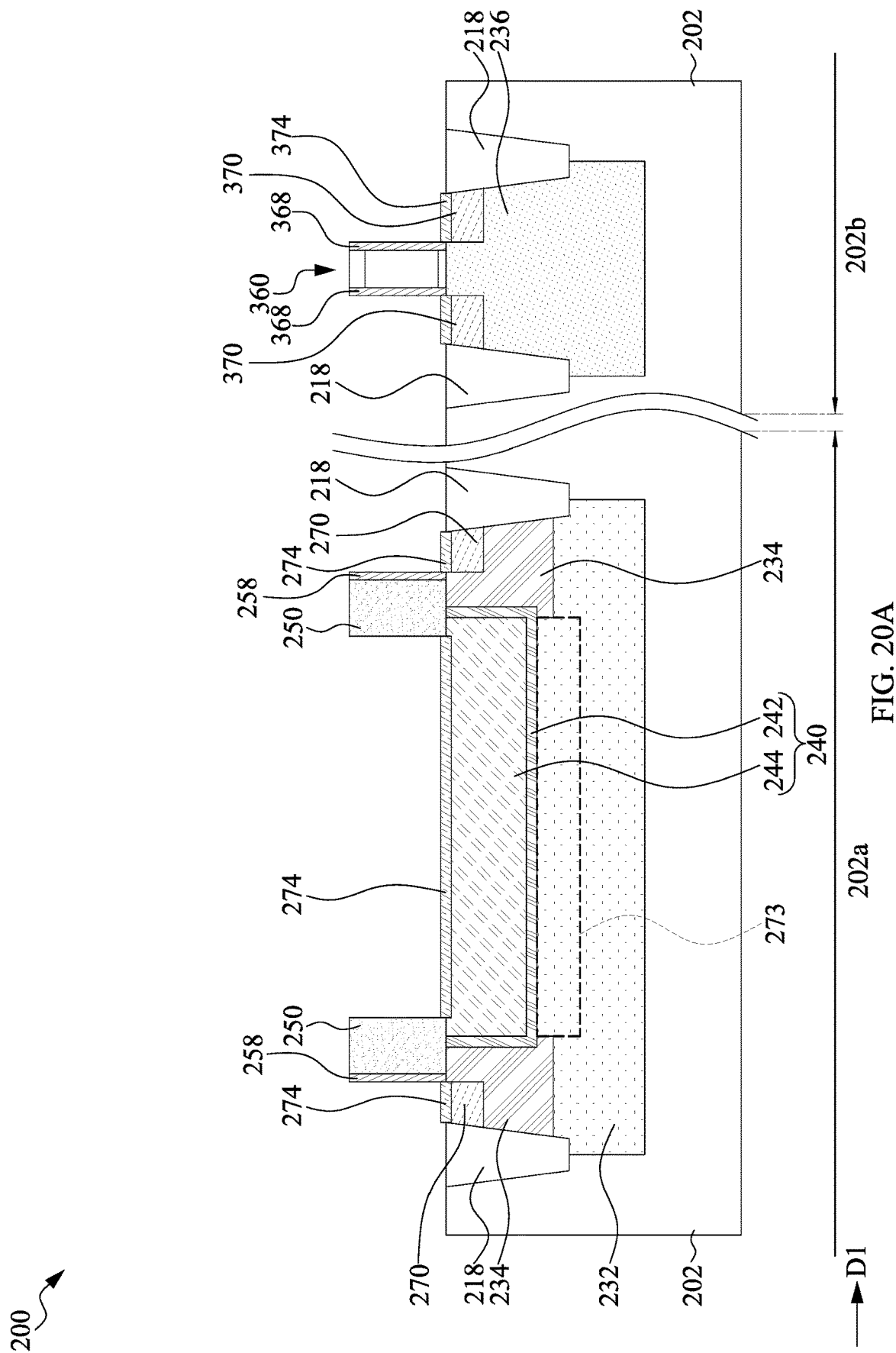
FIGS. 20A, 21A, 22A, 23A and 24A are cross-sectional views illustrated along a similar cross-section as reference cross-section A-A in FIG. 15A.
Figure 20B:
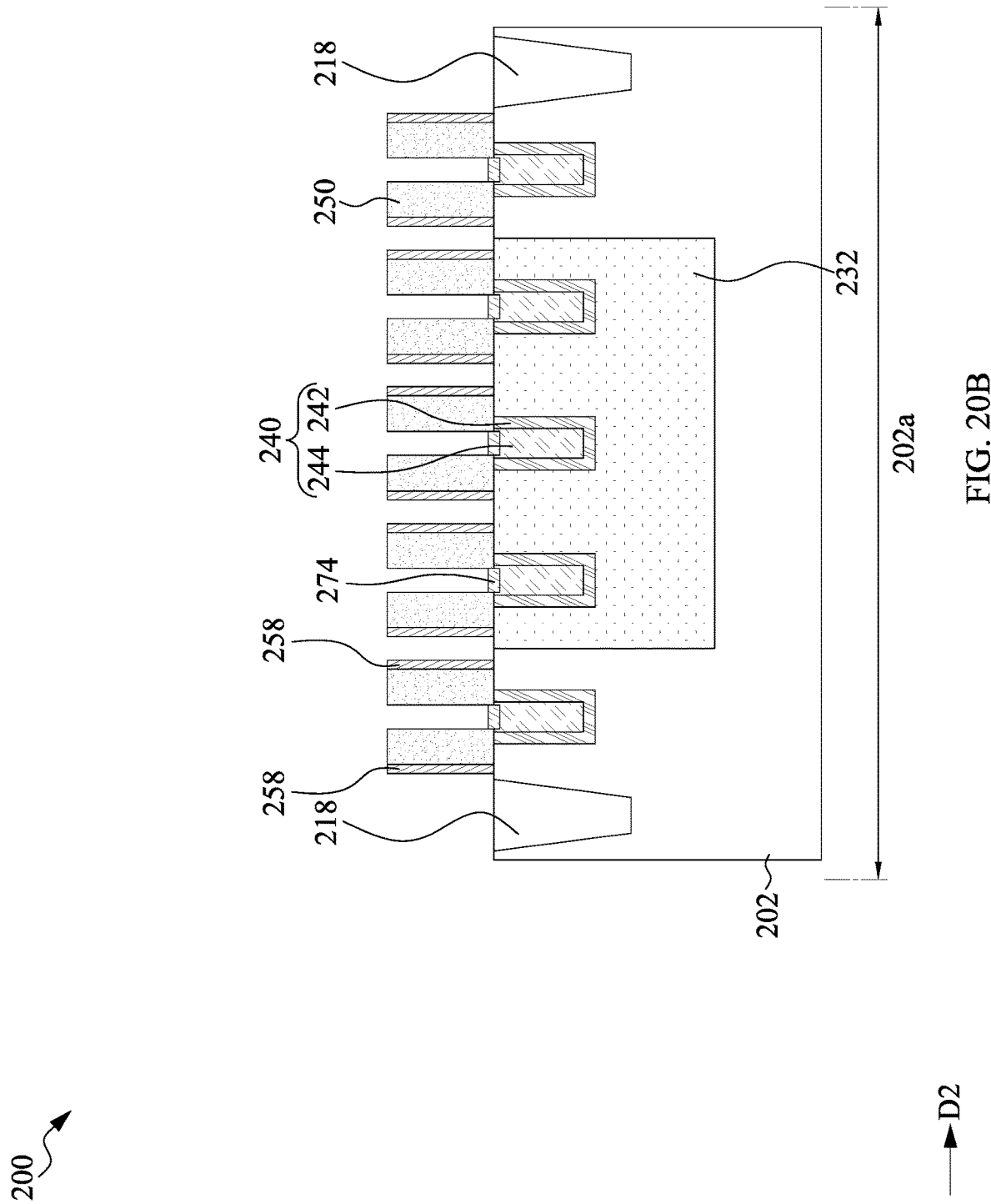
FIGS. 20B, 21B, 22B, 23B and 24B are cross-sectional views illustrated along a similar cross-section as reference cross-section B-B in FIG. 15A.

Referring to FIGS. 20A-20B, silicide regions 274 and 374 are formed in the first device region 202a and the second device region 202b, respectively. The formation process may include forming a resist protective oxide (RPO) over portions of the substrate 202 that are not protected by the gate spacers 258 and 368, and the protection structure 250. The RPO may function as a silicide blocking layer during the formation of the silicide regions 274 and 374. The silicide regions 274 and 374 may be formed using silicidation such as self-aligned silicide (salicide), in which a metallic material is formed over the substrate 202, the temperature is raised to anneal the substrate 202 and cause reaction between underlying silicon of the substrate 202 and the metal to form silicide, and un-reacted metal is etched away. The silicide regions 274 and 374 may be formed in a self-aligned manner on various features, such as the source/drain regions 270 and 370 and/or the gate electrode 244, to reduce contact resistance at the interface between these features and the conductive components subsequently formed on the silicide regions 274 or 374.

Figure 21A:
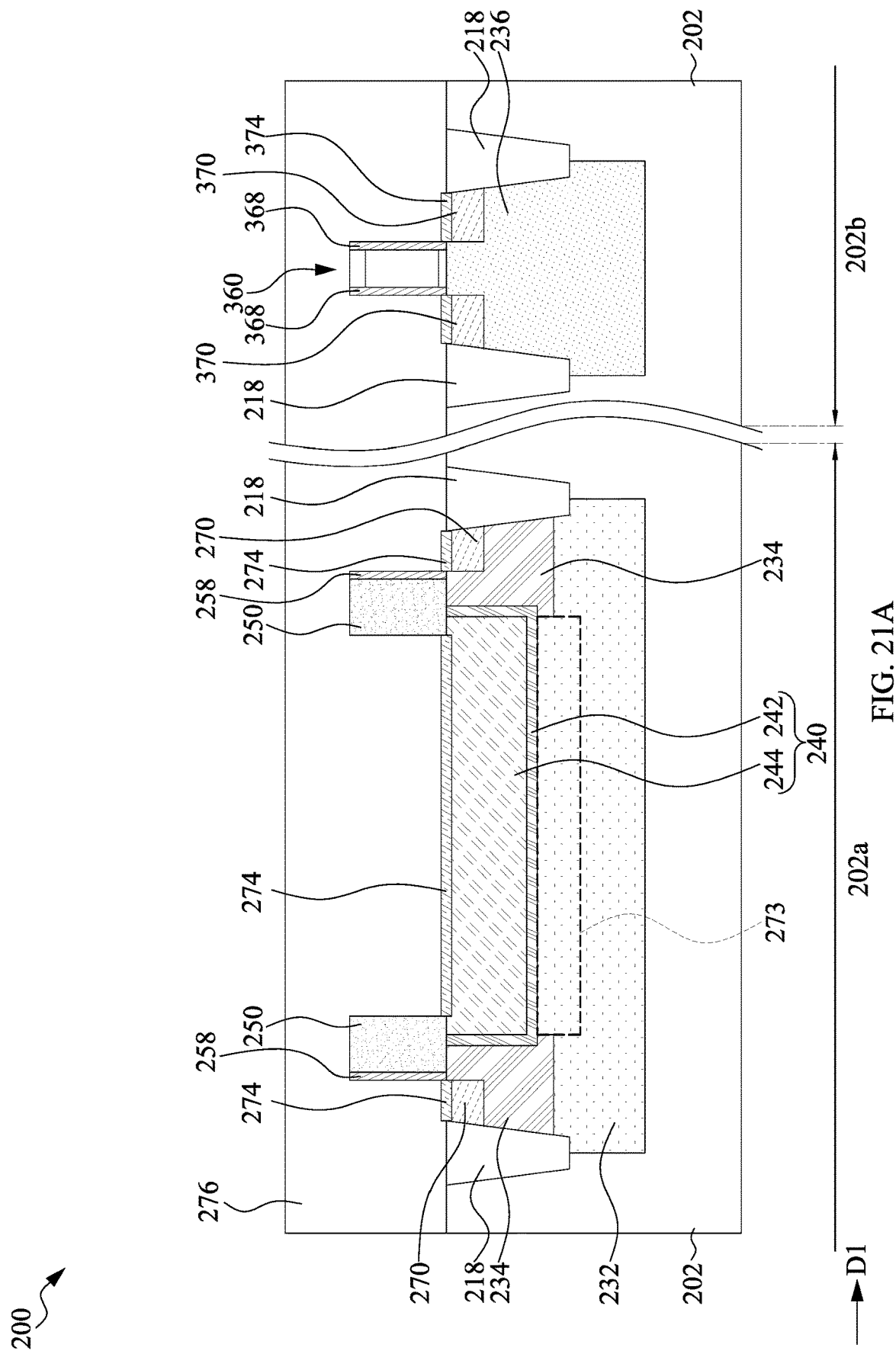
Figure 21B:
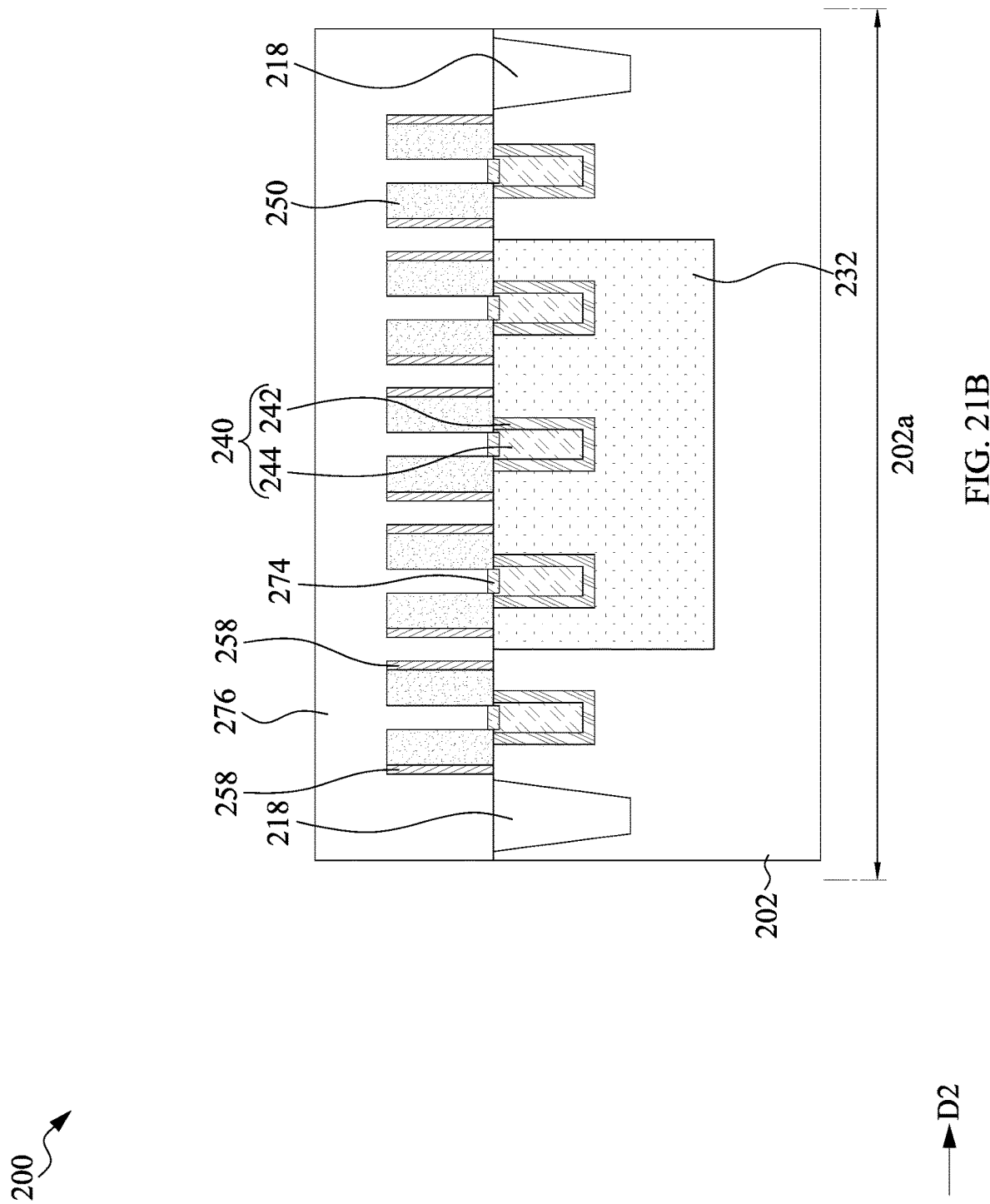

Referring to FIGS. 21A-21B, an inter-layer dielectric (ILD) layer 276 is formed over the substrate 202. The ILD layer 276 is blanket formed to a height higher than the top surfaces of the gate stack 360. In some embodiments, the ILD layer 276 is blanket formed to a height higher than the top surfaces of the protection structure 250. The ILD layer 276 may be formed of an oxide using, for example, flowable chemical vapor deposition (FCVD). The ILD layer 276 may also be a spin-on glass formed using spin-on coating. For example, the ILD layer 276 may be formed of phospho-silicate glass (PSG), boro-silicate glass (BSG), boron-doped phospho-silicate glass (BPSG), tetraethyl orthosilicate (TEOS) oxide, TiN, SiOC, or other low-k dielectric materials.

Figure 22A:
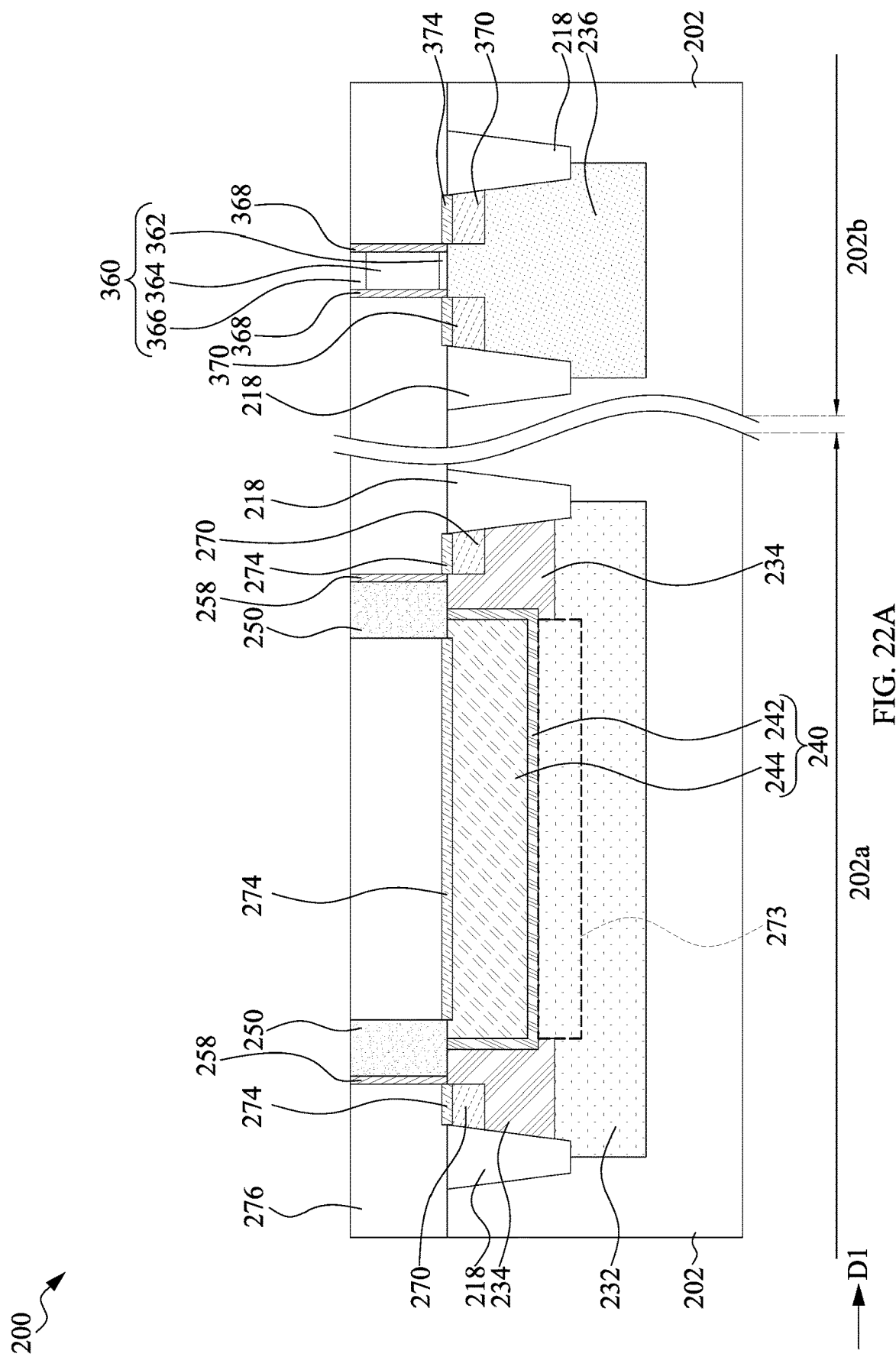
Figure 22B:
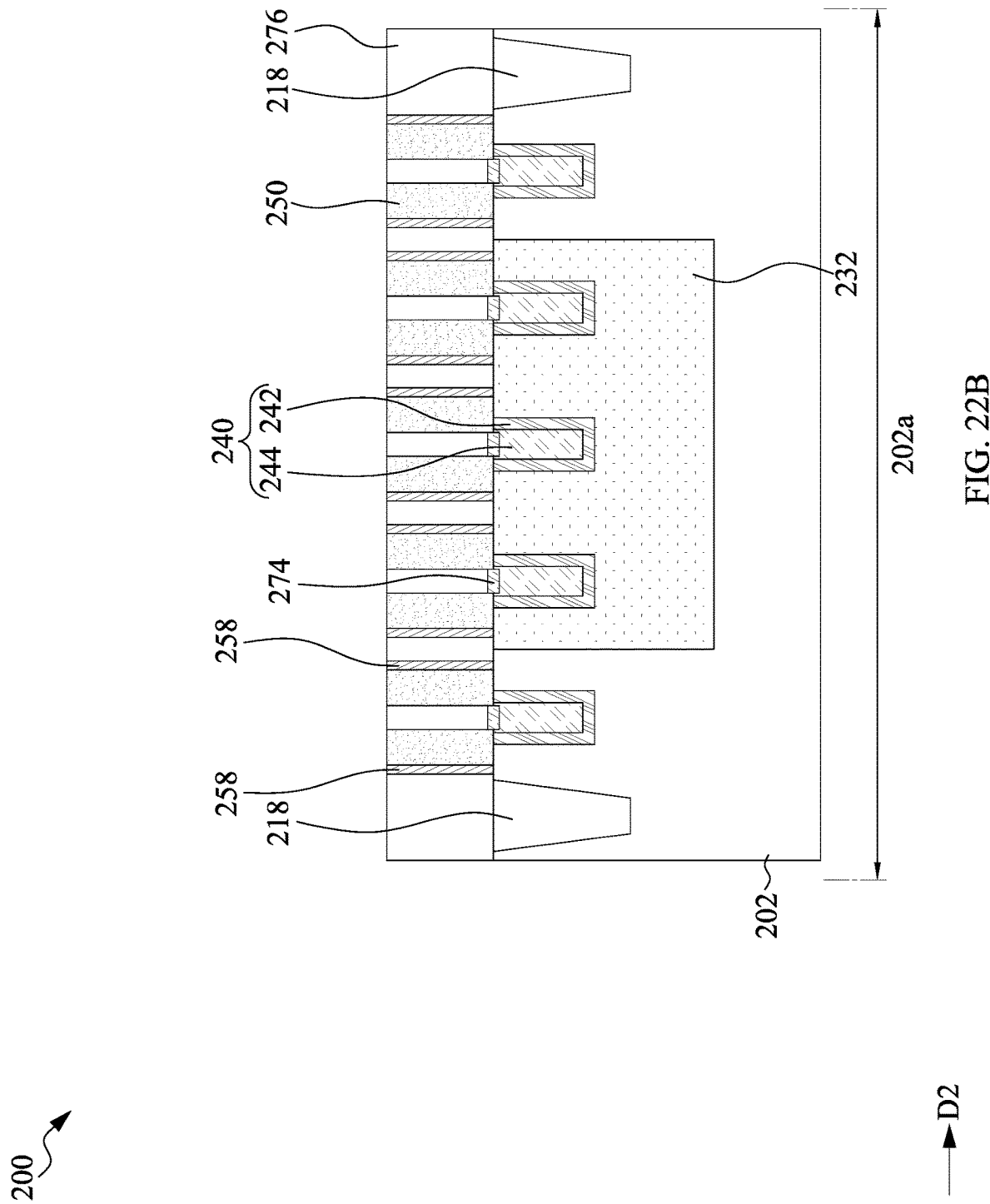

Referring to FIGS. 22A-22B, FIGS. 22A-22B illustrate a planarization step, which is performed using, for example, CMP. The CMP is performed to remove excess portions of the ILD layer 276, until the gate stack 360 is exposed. Since the top surface of the protection structure 250 is level with the top surface of the gate stack 360, the protection structure 250 is also exposed from the ILD layer 276, after the planarization step. The planarization may be stopped on the hard mask 366, if it is present. Alternatively, the hard mask 366 is removed in the planarization, and the gate electrode 364 is exposed. The protection structure 250 may serve as a support element for the surrounding ILD layer 276. The protection structure 250 may prevent unwanted dishing from occurring over the first device region 202a. Accordingly, by reducing the dishing effect, the performance of the first-voltage devices 210a may be improved and the cost of manufacturing may be reduced.

Figure 23A:
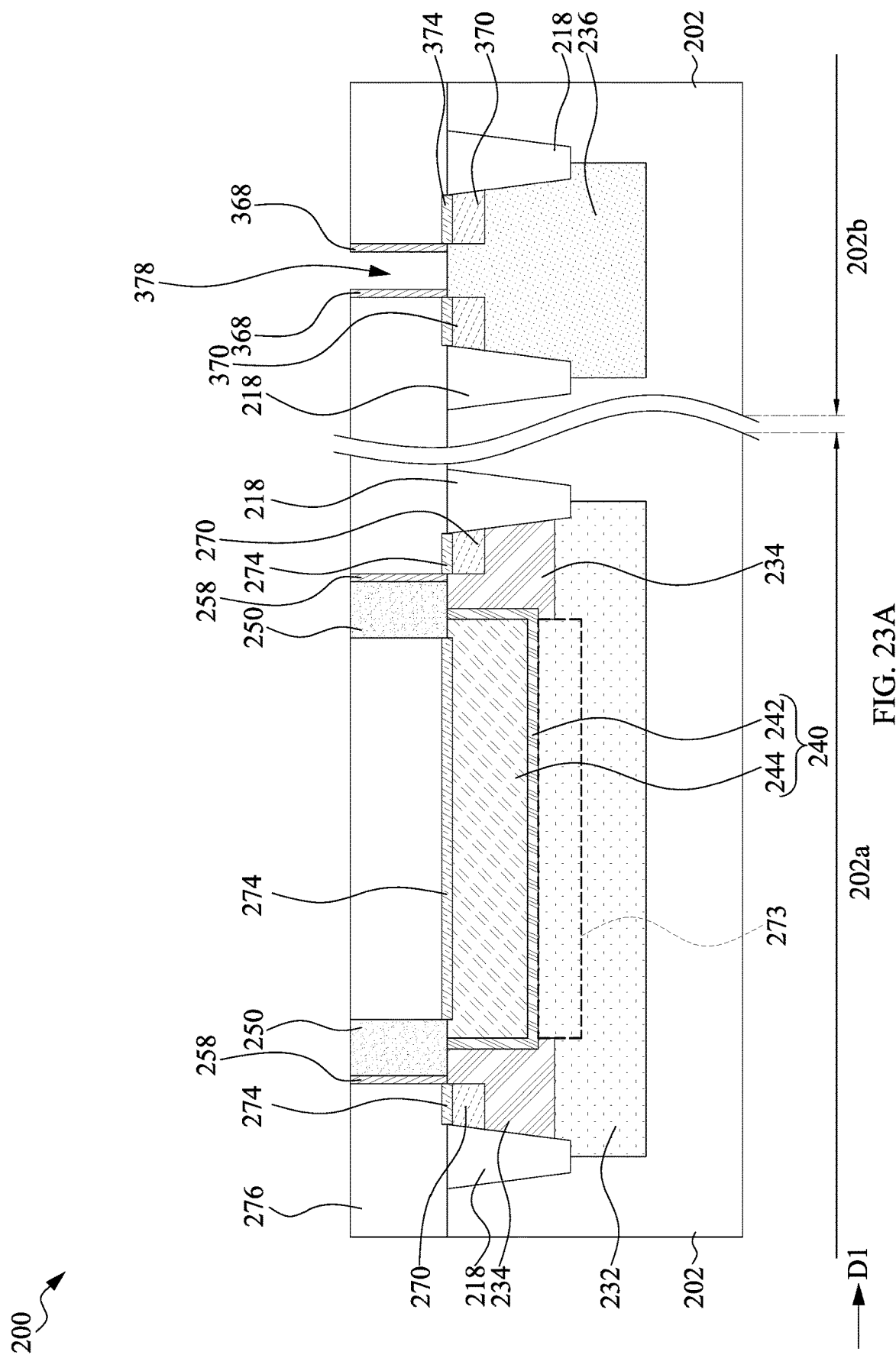
Figure 23B:
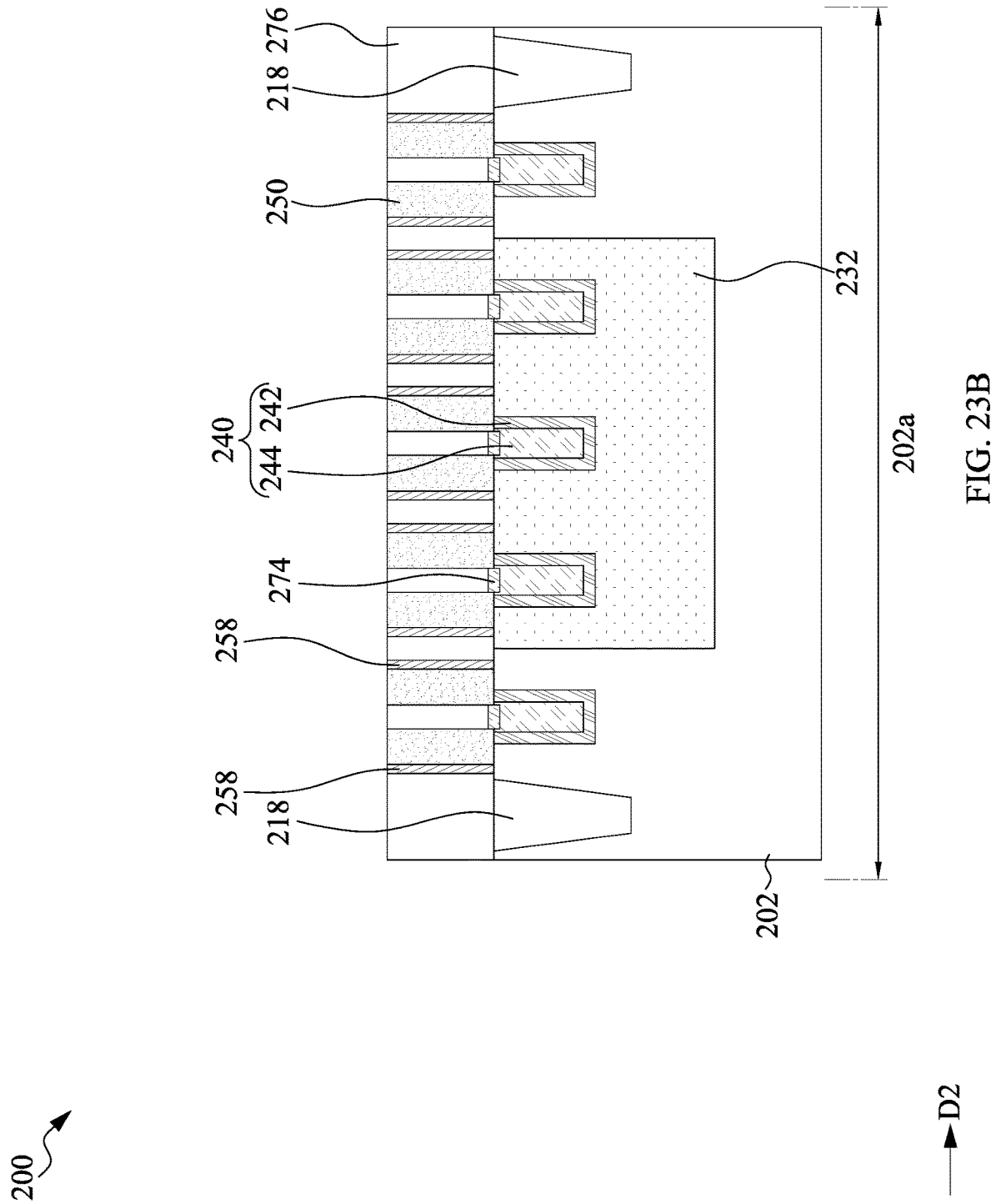

FIGS. 23A-23B and 24A-24B illustrate the formation of replacement gate stack(s) 380 in accordance with some embodiments. Referring to FIG. 23A, the gate stack 360 (FIG. 22A) is removed. In some embodiments, the gate stack 360 is removed to form a gate trench 378 in the ILD layer 276. In some embodiments, a dry etching operation is performed to remove the gate stack 360. In some embodiments, the dry etching operation uses F-containing plasma, Cl-containing plasma and/or Br-containing plasma to remove the gate stack 360. In some embodiments, the protection structure 250 remains in place during the removal of the gate stack 360.

In some embodiments, the substrate 202 may include various device regions, and the various device regions may include various n-type or p-type MOS devices and/or one or more passive devices such as a resistor. These different devices may include different types of elements. In some embodiments, when an I/O MOS device is used, the gate dielectric 362 (FIG. 22A) can serve as an interfacial layer (IL). Thus, the gate dielectric 362 may not be removed. In alternative embodiments, when a core MOS device is used, the gate dielectric 362 is removed to thereby expose the substrate 202 to the gate trench 378.

Figure 24A:
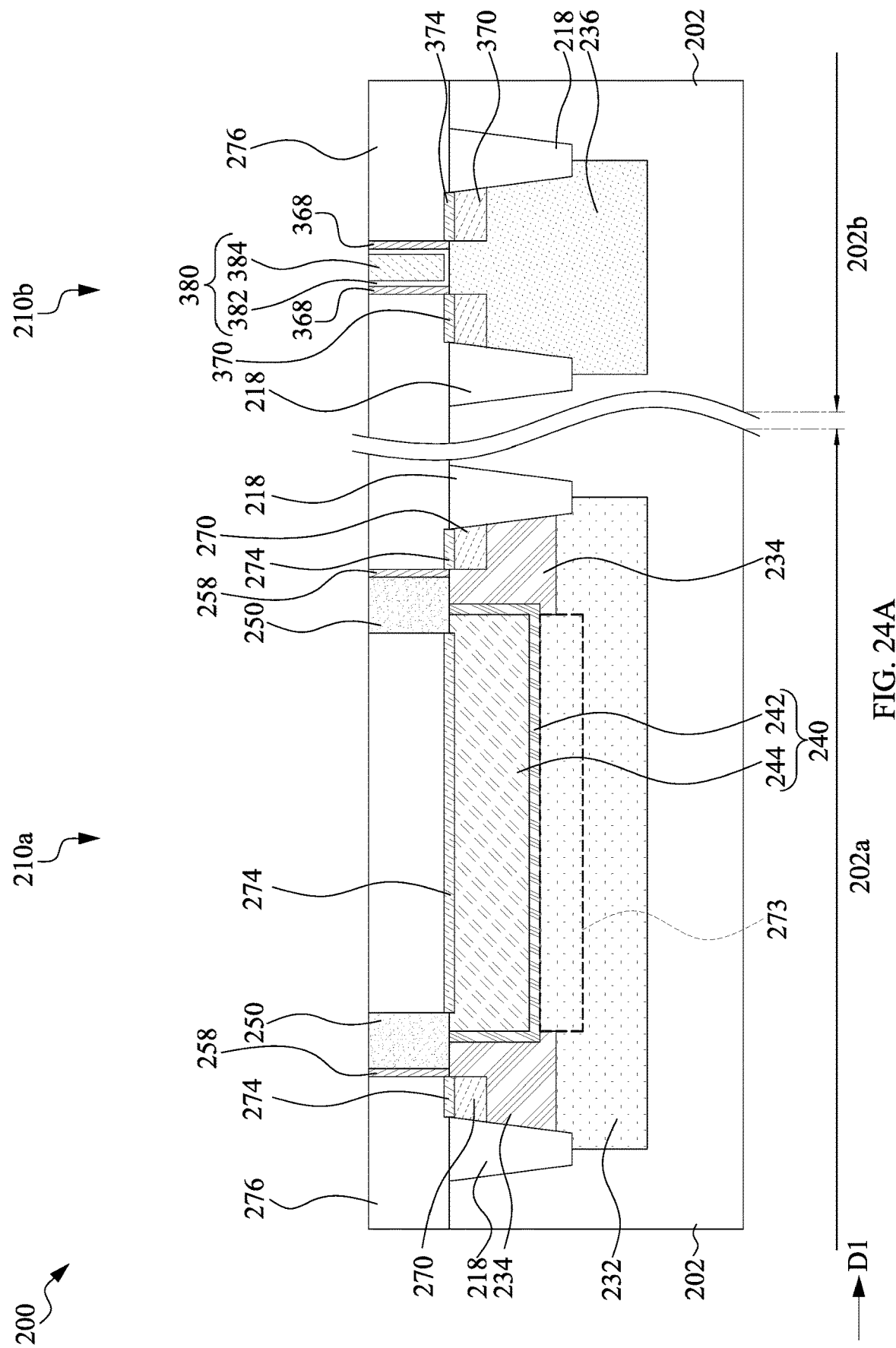
Figure 24B:
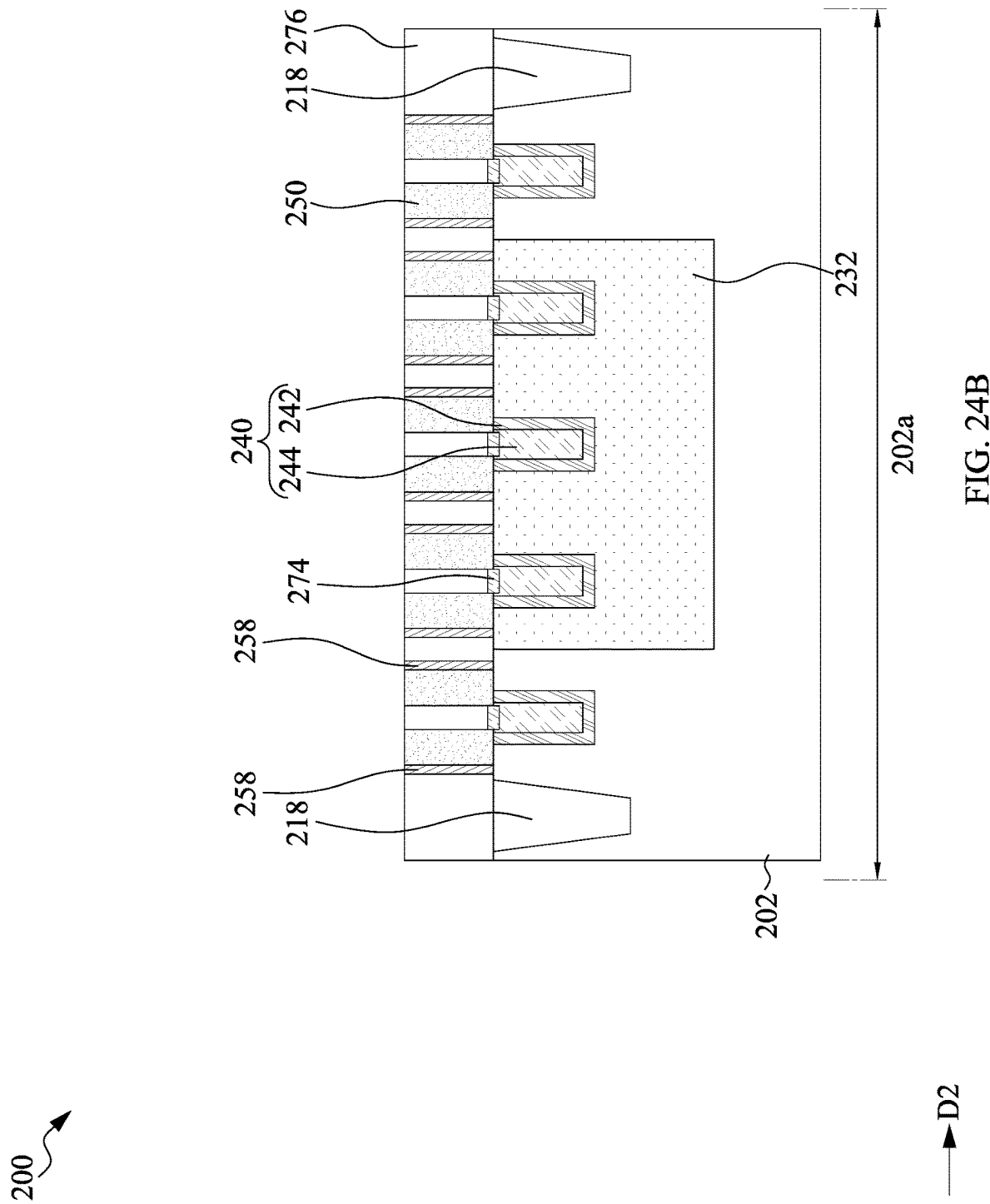

Referring to FIGS. 24A-24B, the gate stack 360 (FIG. 22A) are replaced by replacement gate stack 380. The gate stack 380 includes a gate dielectric 382 and a gate electrode 384. The gate dielectric 382 may include a high-k dielectric material such as hafnium oxide, lanthanum oxide, aluminum oxide, or the like. The gate electrode 384 may include conductive layers. In some embodiments, the gate electrode 384 may include at least a barrier metal layer, a work functional metal layer and a gap-filling metal layer. The barrier metal layer may include, for example but not limited to, TiN. The work function metal layer may include a single layer of TiN, TaN, TaAlC, TiC, TaC, Co, Al, TiAl, HfTi, TiSi, TaSi or TiAlC, or a multilayer of two or more of these materials, but is not limited to the above-mentioned materials. In some embodiments, the gap-filling metal layer includes a conductive material such as Al, Cu, AlCu, or W, but is not limited to the above-mentioned materials. The formation methods include PVD, CVD, or the like. In addition, the gate electrode 384 may be formed in a single formation process, and are formed of the same dielectric materials.

A planarization operation (for example, a CMP) is then performed to remove excess portions of the gate dielectric 382 and the gate electrode 384, leaving the structure shown in FIG. 24A. Referring to the first device region 202a, at least a portion of the protection structure 250 may be removed during the planarization operation. For example, the top portion of the protection structure 250 may be removed. The height of the protection structure 250 may be reduced. In some embodiments, the protection structure 250 has a reduced height less than the height H1 of the protection structure 253, after the planarization operation.

Based on the operations with reference to FIGS. 23A-23B and 24A-24B, an exemplary first-voltage device 210a and an exemplary second-voltage device 210b are thus formed. The first-voltage device 210a includes the gate electrode 244, the gate dielectric 242, and the source/drain regions 270. The second-voltage device 210b includes the gate electrode 384, the gate dielectric 382, and the source/drain regions 370. The protection structure 250 formed over the first-voltage device 210a may protect the underlying gate dielectric 242 and the underlying gate electrode 244 during the planarization of the ILD layer 276. The protection structure 250 may further serve as spacers for the gate structure 240.

In accordance with some embodiments, the first-voltage device 210a is a MV MOS device or a HV MOS device, while the second-voltage device 210b is a LV MOS device. In some embodiments, the gate dielectric 242 of the first-voltage device 210a is thick enough to sustain the medium voltages or high voltages. The thickness of the gate dielectric 382 is thinner than the thickness of the gate dielectric 242.

The proposed structures provide advantages. In cases where the protection structure 250 is otherwise absent, the gate dielectric 242 and the gate electrode 244 may directly contact the ILD layer 276. When a planarization process is performed on the ILD layer 276, the planarization process will remove portions of the ILD layer 276 to expose underlying features of the gate stack 360 for subsequent processing (e.g., etching for the formation of replacement gate stack 380). However, due to the various types of features formed in the level of the ILD layer 276 (e.g., dielectric, metal, polysilicon, etc.), the planarization process may cause dishing in the ILD layer 276 (as the various materials are removed at different rates during the planarization process). In some severe instances, the dishing may cause improperly removal of the underlying gate electrode 244 or the gate dielectric 242. Also, the dishing effects may affect the dimensions of the channel 273 of the first-voltage device 210a. For example, in cases where the protection structure 250 is otherwise absent, the channel dimension of the first-voltage device 210a may be reduced to about 20 μm times 20 μm, which may not meet the design requirements.

The presence of the protection structure 250 may provide structural support during the planarization process. The presence of the protection structure 250 may mitigate the dishing effect in the ILD layer 276. Moreover, due to the structural support of the protection structure 250, the dimensions of the channel 273 of the first-voltage device 210a may be increased. In some embodiments, the channel dimension of the first-voltage device 210a may be increased, e.g., to about 200 μm times 200 μm, but the present disclosure is not limited thereto. Further, the presence of the protection structure 250 may serve as an additional spacer, in addition to the gate spacer 258, between the gate dielectric 242 and the source/drain regions 270.

Figure 25A:
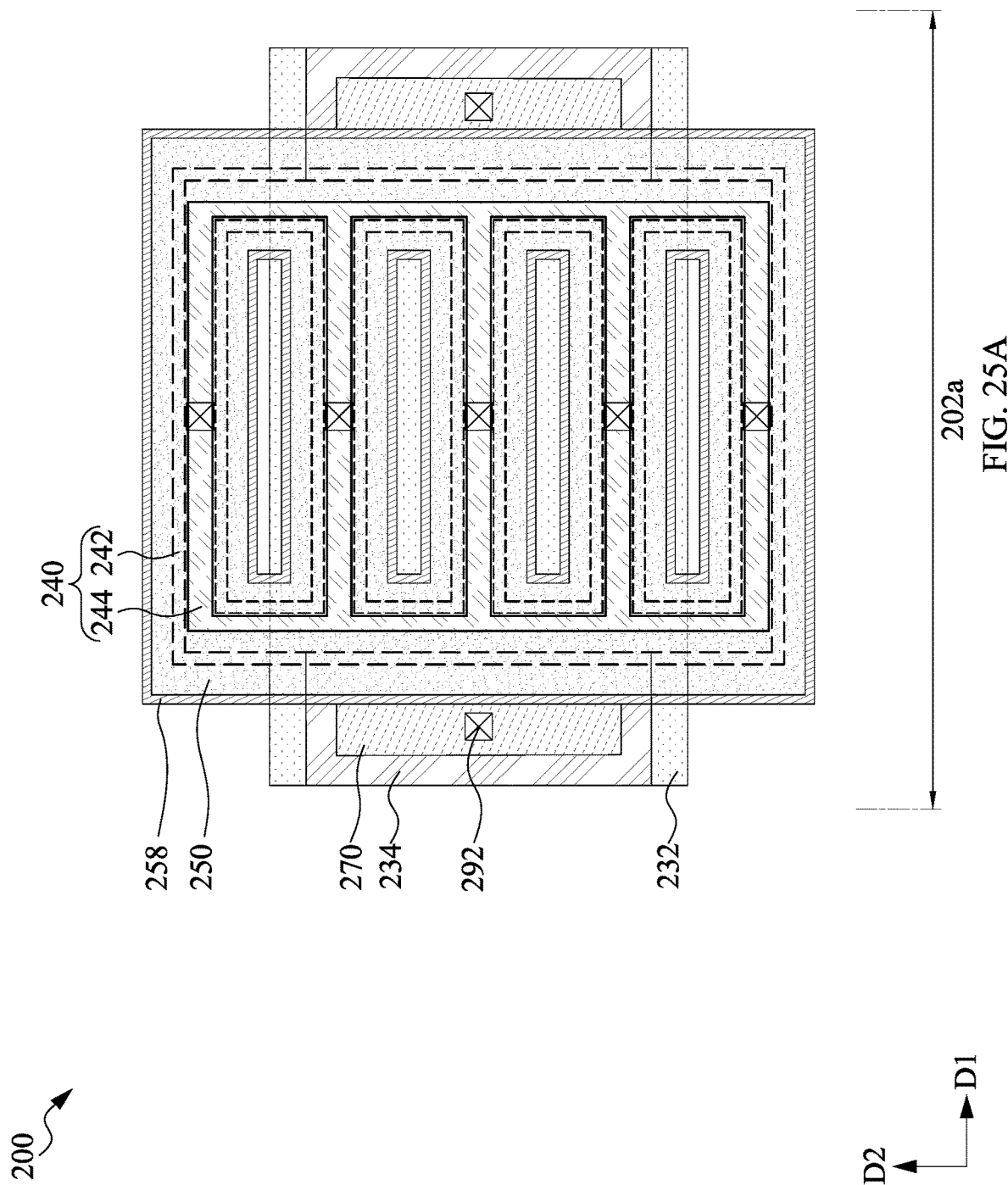
FIG. 25A illustrates a top view of a semiconductor structure at a fabrication stage according to aspects of one or more embodiments of the present disclosure.
Figure 25B:
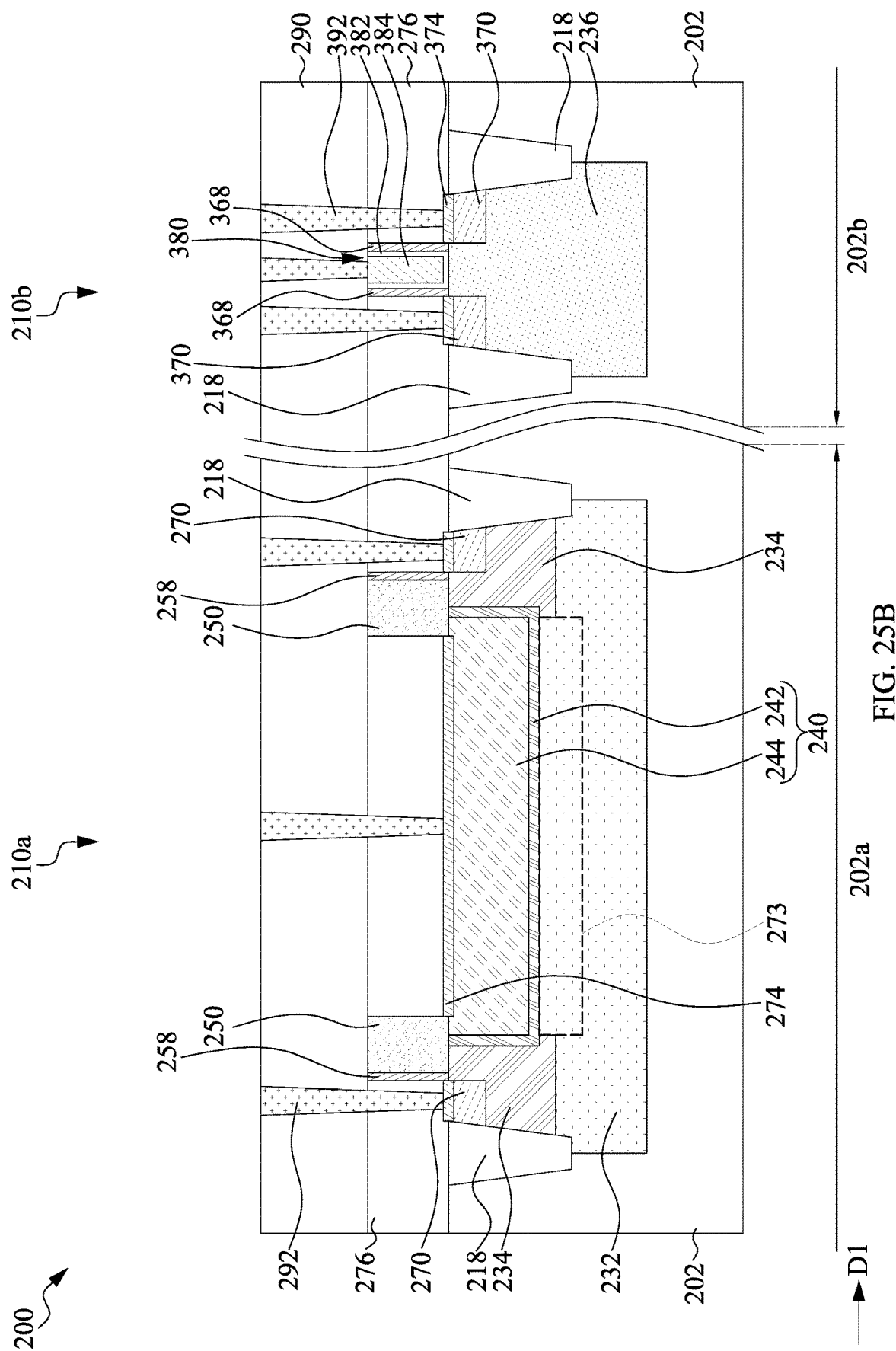
FIG. 25B is a cross-sectional view illustrated along a similar cross-section as reference cross-section A-A in FIG. 15A.
Figure 25C:
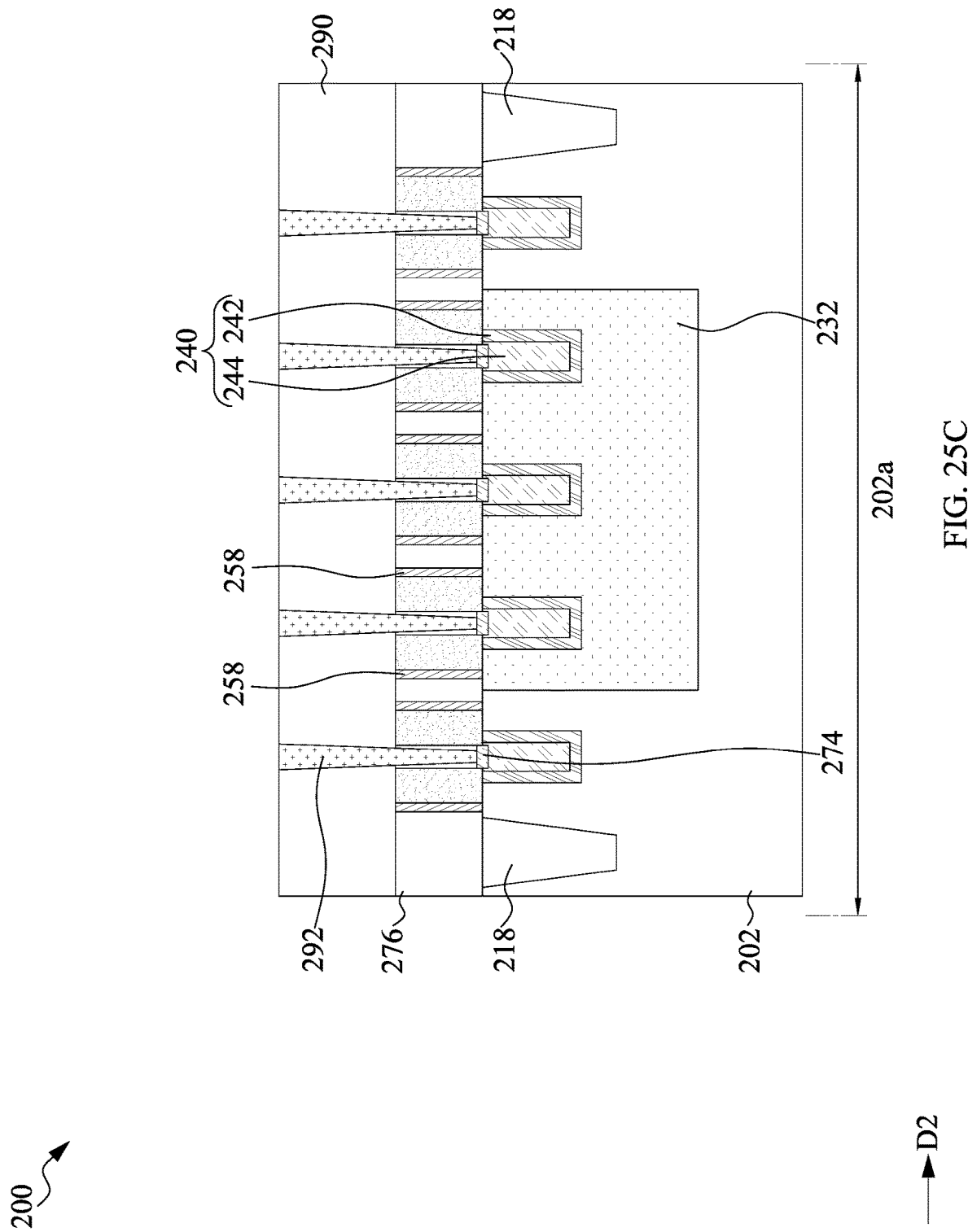
FIG. 25C is a cross-sectional view illustrated along a similar cross-section as reference cross-section B-B in FIG. 15A.

FIGS. 25A-25C illustrates the formation of a dielectric layer 290 and contact plugs 292 and 392. For the purpose of clarity, FIG. 25A only illustrates the gate structure 240, the protection structure 250, the gate spacers 258, the deep well region 232, the shallow doped regions 234, the source/drain regions 270, and the contact plugs 292. Initially, the dielectric layer 290 is formed over the protection structure 250 and the replacement gate stack 380. The dielectric layer 290 may be formed of a material selected from the same candidate materials for forming the ILD layer 276. The materials of the ILD layer 276 and the dielectric layer 290 may be the same or different from each other.

Referring to FIGS. 25A and 25B, contact plugs 292 and 392 are formed in the dielectric layer 290 and the ILD layer 276. The formation process may include forming contact plug openings in the ILD layer 276 and the dielectric layer 290 to expose the source/drain regions 270/370, the gate electrode 244 and the gate electrode 384, and filling the contact plug openings to form the contact plugs 292 and 392. In some embodiments, the contact plugs 292 on the gate electrode 244 may be referred to as gate vias of the first-voltage device 210a. In some embodiments, at least one of the contacts plugs 292 on the gate electrode 244 is between two first segments 250-1 of the protection structure 250. A bias voltage may thus be supplied through the contact plug 292 to the gate electrode 244.

Referring to FIG. 25A, the contact plugs 292 on the gate electrode 244 may be referred to as gate vias of the first-voltage device 210a. In some embodiments, the gate vias 292 are configured over the gate electrode 244 at a location where the gate electrode 244 does not overlap the deep well region 232. In alternative embodiments, at least a portion of the gate vias 292 lands on the gate electrode 244 at a location where the gate electrode 244 overlaps the deep well region 232.

Figure 26A:
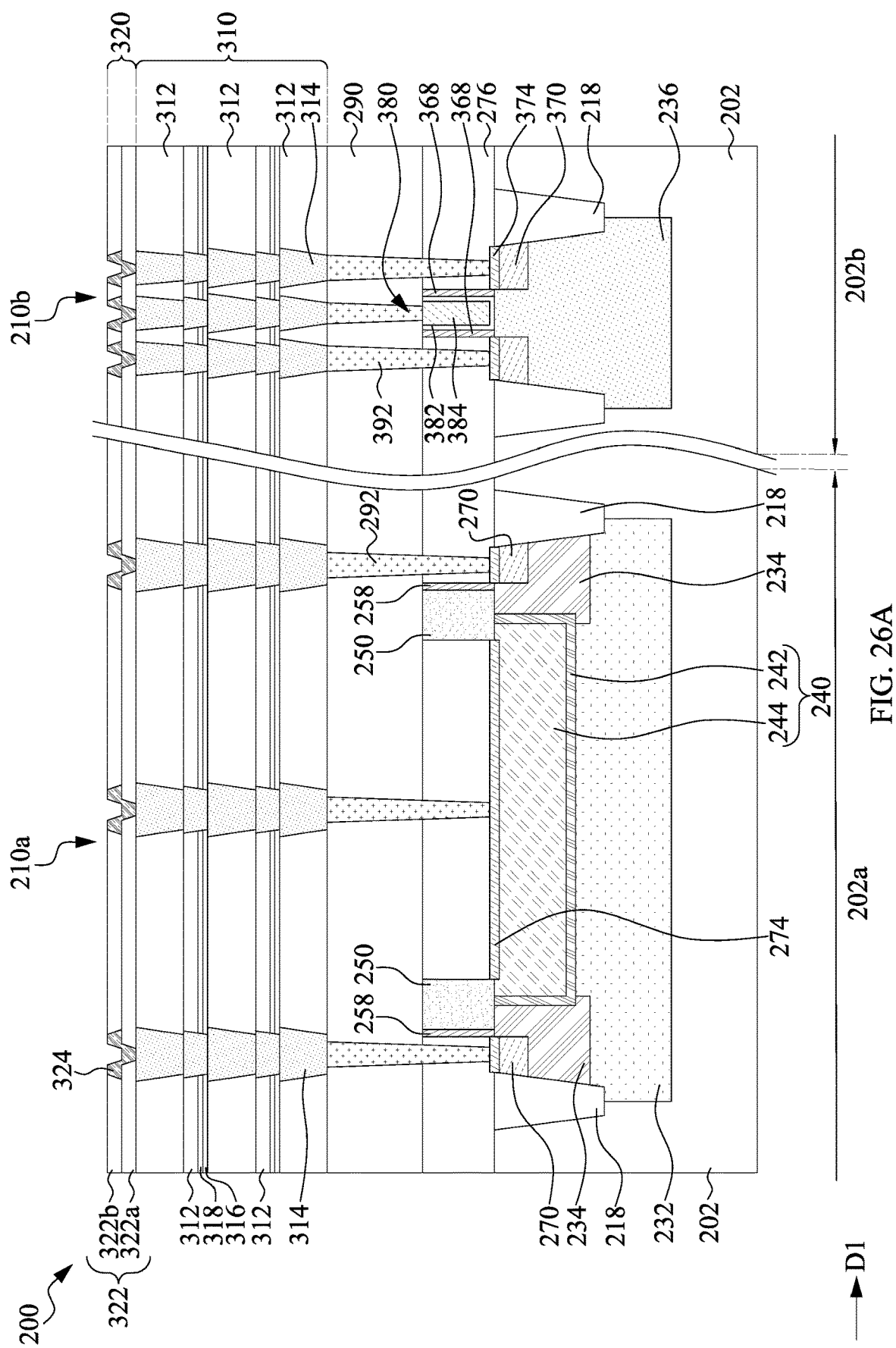
FIG. 26A is a cross-sectional view illustrated along a similar cross-section as reference cross-section A-A in FIG. 15A.
Figure 26B:
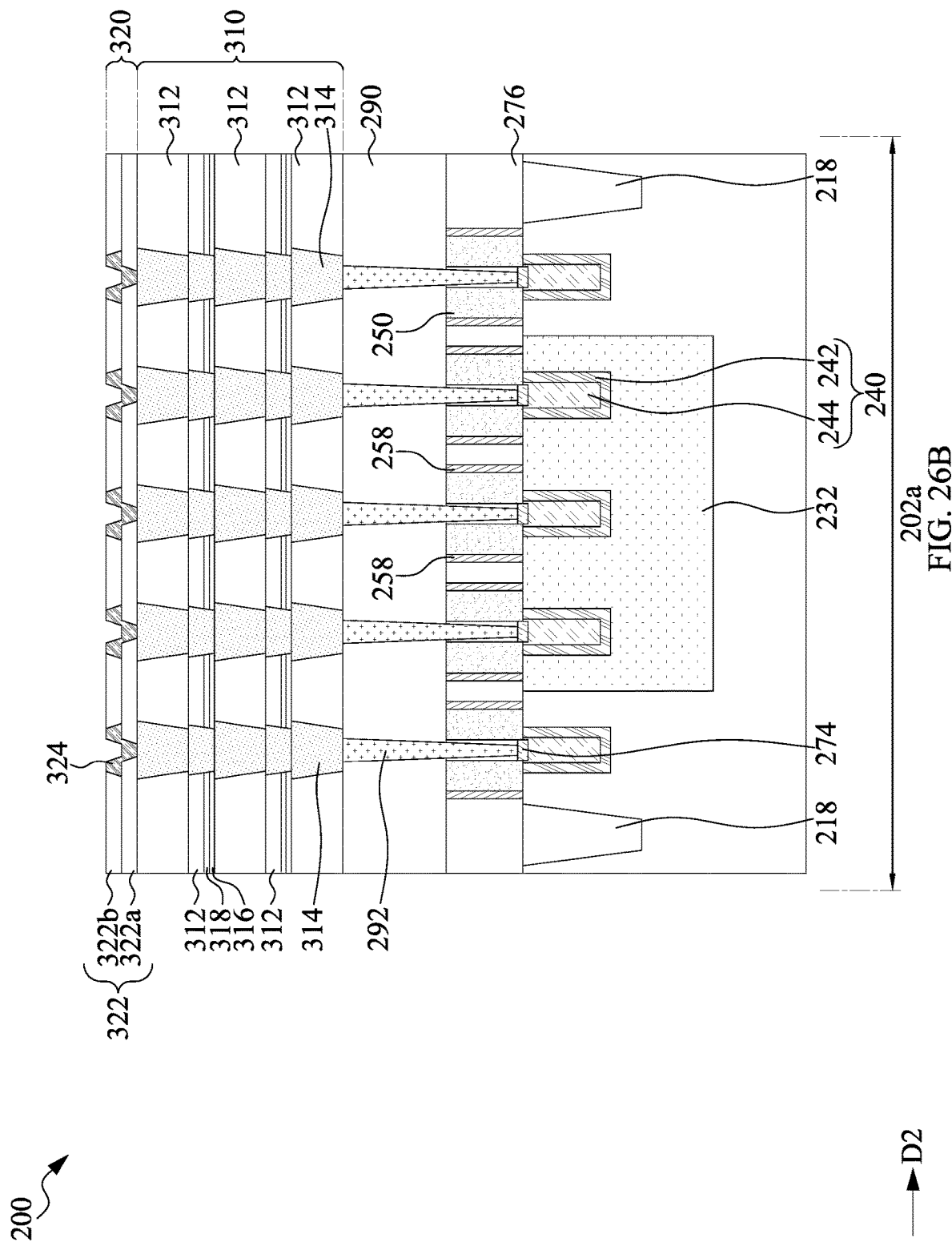
FIG. 26B is a cross-sectional view illustrated along a similar cross-section as reference cross-section B-B in FIG. 15A.

Referring to FIGS. 26A-26B, an interconnect structure 310 is arranged over the dielectric layer 290. The interconnect structure 310 may comprise one or more inter-metal dielectric (IMD) layers 312. The IMD layer 312 may comprise, for example, one or more layers of an oxide, a low-k dielectric, or an ultra-low-k dielectric. The IMD layer 312 may surround conductive patterns (including metal wires and metal vias) 314 that comprise, for example, copper, tungsten, and/or aluminum. In some embodiments, the contact plugs 292 are configured to electrically couple the source/drain regions 270 of the first-voltage device 210a to a first conductive pattern 314 of the interconnect structure 310. In some embodiments, the contact plugs 392 are configured to electrically couple the source/drain regions 370 of the second-voltage device 210b to the first conductive pattern 314 of the interconnect structure 310.

The interconnect structure 310 may comprise one or more dielectric layers 316 and 318 disposed between the IMD layers 312. The dielectric layers 316 and 318 may serve as etch stop layers. In some embodiments, the dielectric layers 316 include dielectric materials, such as SiN, SiCN, SiCO, combinations thereof, or the like. In some embodiments, the dielectric 316 includes a multilayer structure, e.g., formed of a nitride layer and an oxide layer. In some embodiments, the dielectric layers 318 include silicon nitride, silicon carbide, and the like. In some embodiments, the interconnection structure 310 further includes barrier layers, such as formed of Ta or TaN, between the IMD layers 312 and the conductive patterns 314.

An under-bump metallization (UBM) stack 320 is arranged over the interconnect structure 310. In some embodiments, the UBM stack 320 comprises a passivation layer 322 and a UBM layer 324. In some embodiments, the passivation layer 322 comprises one or more layers of $SiO_2$, silicon nitride ($Si_3N_4$), polyimide compounds, or other suitable materials. The passivation layer 322 may include a single-layered structure or a multiple layered structure. For example, the passivation layer 322 may be a bi-layered structure as shown in FIG. 31, but the disclosure is not limited thereto. In some embodiments, the bi-layered passivation layer 322 may include a first dielectric layer 322a and a second dielectric layer 322b. The UBM layer 324 contacts an upper conductive feature (e.g., a conductive pattern 314) of the interconnect structure 310. The UBM layer 324 may comprise, for example, aluminum, titanium, tungsten, or some other suitable material. The UBM layer 324 is configured to provide an interface between an overlying solder bump (not shown) and an underlying conductive feature (e.g., a conductive pattern 314) of the interconnect structure 310.

The structures of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be repeated.

Figure 27:
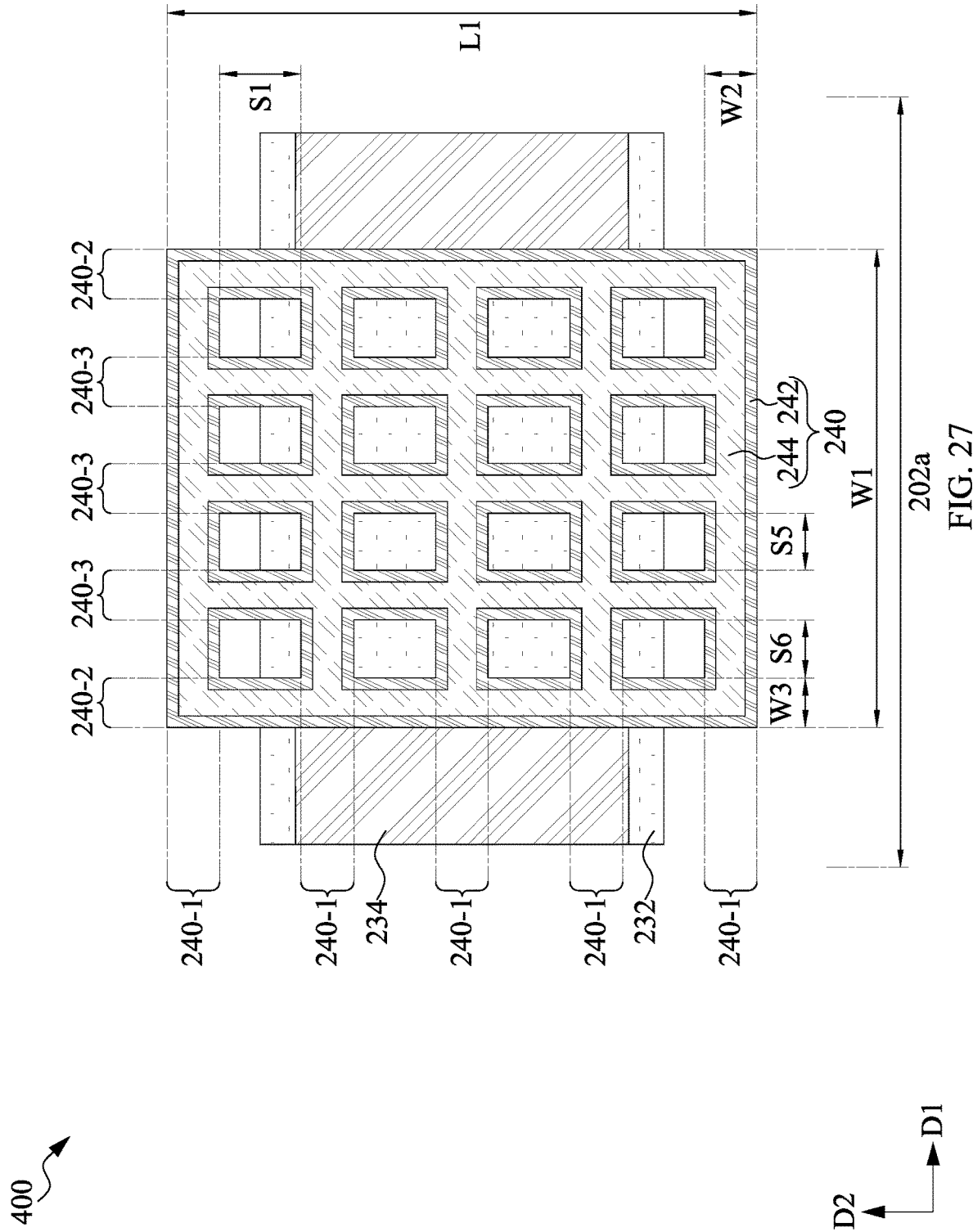
FIG. 27 illustrates a top view of a semiconductor structure at a fabrication stage according to aspects of one or more embodiments of the present disclosure.

FIG. 27 illustrates a top view of a semiconductor structure 400 at a fabrication stage according to aspects of one or more embodiments of the present disclosure. For the purpose of clarity, FIG. 27 is similar to FIG. 13A in many aspects, in which only illustrates the gate structure 240, the deep well region 232, the shallow doped regions 234, and the contact plugs 292 according to aspects of one or more embodiments of the present disclosure. Referring to FIG. 27, one or more third segments 240-3 are formed between the second segments 240-2 as discussed in previous paragraphs. The third segment 240-3 may include a width W3 substantially equal to that of the second segment 240-2 as discussed previously. A spacing S5 between two adjacent third segments 240-3 may be in the range between about 0.2 µm and about 200 µm in accordance with some embodiments. A spacing S6 between the second segment 240-2 and an adjacent third segments 240-3 may be in the range between about 0.2 µm and about 200 µm in accordance with some embodiments. The spacing S5 and the spacing S6 may be configured based on different requirements for different semiconductor devices.

FIG. 28 illustrates a top view of a semiconductor structure 500 at a fabrication stage according to aspects of one or more embodiments of the present disclosure. FIG. 28 is similar to FIG. 27 in many aspects, and FIG. 28 only illustrates the gate structure 240, the deep well region 232, the shallow doped regions 234, and the contact plugs 292 for the purpose of clarity. Referring to FIG. 28, only a second segment 540-2 is formed instead of the two second segments 240-2 mentioned previously. The second segment 540-2 may include a width W3 substantially equal to that of the second segment 240-2 as discussed previously.

FIG. 29 illustrates a top view of a semiconductor structure 600 at a fabrication stage according to aspects of one or more embodiments of the present disclosure. FIG. 29 is similar to FIG. 28 in many aspects, and FIG. 29 only illustrates the gate structure 240, the deep well region 232, the shallow doped regions 234, and the contact plugs 292 for the purpose of clarity. Referring to FIG. 29, at least one of the second segments 240-2 (FIG. 13A) mentioned previously is divided into two or more sub-segments 640-2. The sub-segments 640-2 may include a width W3 substantially equal to that of the second segment 240-2 as discussed previously. The sub-segments 640-2 may include a length L2. The length L2 may be greater than or substantially equal to a sum of the spacing S1 and the two times the width W2. In some embodiments, each of the sub-segments 640-2 includes a same length L2. In alternative embodiments, the sub-segments 640-2 include different lengths. The length L2 may be configured based on different requirements for different semiconductor devices.

The embodiments of the present disclosure have some advantageous features. It is desirable to incorporate the HV/MV MOS devices with the LV MOS devices in a single semiconductor substrate. However, the planarization for forming the recessed gate electrodes of the HV/MV MOS devices may result in loss of the recessed gate electrodes of the HV/MV MOS devices. Further, the planarization for exposing the dummy gate electrodes of the LV MOS devices may also result in loss of the recessed gate electrodes of the HV/MV MOS devices. By forming the recessed gate electrodes of the HV/MV MOS devices with segments, the planarization for the formation of the recessed gate electrodes may be performed without loss of the gate electrodes in HV/MV MOS devices. Further, by forming a protection structure to cover the HV/MV MOS devices, the planarization for exposing the dummy gate electrodes may be performed without causing the loss the gate electrodes of HV/MV MOS devices.

In accordance with some embodiments of the present disclosure, a semiconductor structure includes: a substrate; a doped region within the substrate; a pair of source/drain regions extending along a first direction on opposite sides of the doped region; a gate electrode disposed in the doped region, wherein the gate electrode has a plurality of first segments between the pair of source/drain regions; and a protection structure overlapping the gate electrode.

In accordance with some embodiments of the present disclosure, a semiconductor structure includes: a substrate comprising a first region and a second region, the substrate including a surface; a first gate structure arranged within the substrate in the first region; a protection structure arranged in the first region over the first gate structure and at least partially exposing the first gate structure; and a second gate structure arranged over the surface in the second region.

In accordance with some embodiments of the present disclosure, a method includes: receiving a substrate; etching a recess in the substrate, wherein the recess includes a plurality of first portions extending in parallel along a first direction; forming a doped region in the substrate covering a sidewall of the recess; forming two source/drain regions on opposite sides of the doped region in the substrate; and depositing a gate electrode layer in the recess to form a gate electrode, wherein the gate electrode includes a plurality of first segments extending in parallel between the two source/drain regions.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
 a substrate;
 a doped region within the substrate;
 a pair of source/drain regions extending along a first direction on opposite sides of the doped region;
 a gate electrode disposed in the doped region, wherein the gate electrode has a plurality of first segments between the pair of source/drain regions; and a protection structure overlapping the gate electrode and spaced apart from the pair of source/drain regions from a top-view perspective.

2. The semiconductor structure of claim 1, wherein the gate electrode further includes a plurality of second segments extending in parallel along a second direction different from the first direction.

3. The semiconductor structure of claim 2, wherein each of the plurality of second segments electrically connects two adjacent first segments of the plurality of first segments.

4. The semiconductor structure of claim 2, wherein the second direction is substantially perpendicular to the first direction.

5. The semiconductor structure of claim 2, wherein a width of each of the plurality of second segments is substantially equal to a width of each of the plurality of first segments.

6. The semiconductor structure of claim 1, wherein the protection structure is electrically isolated from the gate electrode.

7. The semiconductor structure of claim 1, further comprising a gate dielectric disposed in the doped region and laterally surrounded the gate electrode.

8. The semiconductor structure of claim 7, wherein a top surface of the gate dielectric is substantially level with a top surface of the substrate.

9. The semiconductor structure of claim 7, wherein the protection structure covers an entirety of the gate dielectric.

10. The semiconductor structure of claim 1, wherein a top surface of the gate electrode is substantially level with a top surface of the substrate.

11. A semiconductor structure, comprising:
a substrate comprising a first region and a second region, the substrate including a surface;
a first gate structure arranged within the substrate in the first region;
a protection structure arranged in the first region over the first gate structure, the protection structure comprising a spacer on a sidewall thereof; and
a second gate structure arranged over the surface in the second region.

12. The semiconductor structure of claim 11, wherein the first gate structure includes a plurality of first segments extending in parallel along a first direction.

13. The semiconductor structure of claim 11, wherein the first gate structure comprises a gate electrode and a first gate dielectric between the substrate and the gate electrode.

14. The semiconductor structure of claim 13, wherein the second gate structure further comprises a second gate dielectric, wherein the first gate dielectric has a thickness greater than that of the second gate dielectric.

15. The semiconductor structure of claim 11, further comprising a gate via electrically connected to the first gate structure, wherein the gate via extends through the protection structure.

16. The semiconductor structure of claim 11, wherein the protection structure and the spacer extend beyond a lateral side of the first gate structure from an elevation view.

17. A method of forming a semiconductor structure, comprising:
receiving a substrate;
etching a recess in the substrate, wherein the recess includes a plurality of first portions extending in parallel along a first direction;
forming a doped region in the substrate covering a sidewall of the recess;
forming two source/drain regions on opposite sides of the doped region in the substrate; and
depositing a gate electrode layer in the recess to form a gate electrode, wherein the gate electrode includes a plurality of first segments extending in parallel between the two source/drain regions and electrically connected to one another through a second segment arranged in the doped region.

18. The method of claim 17, further comprising performing a planarization operation to level a top surface of the gate electrode with a surface of the substrate.

19. The method of claim 17, further comprising forming a protection structure over the gate electrode.

20. The method of claim 17, further comprising forming a plurality of silicide regions over the plurality of first segments of the gate electrode.

* * * * *